(12) United States Patent
Yamazaki et al.

(10) Patent No.: US 8,900,916 B2
(45) Date of Patent: Dec. 2, 2014

(54) METHOD FOR MANUFACTURING SEMICONDUCTOR DEVICE INCLUDING OXIDE SEMICONDUCTOR FILM

(75) Inventors: Shunpei Yamazaki, Setagaya (JP); Miyuki Hosoba, Isehara (JP); Kosei Noda, Atsugi (JP); Hiroki Ohara, Sagamihara (JP); Toshinari Sasaki, Atsugi (JP); Junichiro Sakata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 628 days.

(21) Appl. No.: 12/832,329

(22) Filed: Jul. 8, 2010

(65) Prior Publication Data

US 2011/0008931 A1 Jan. 13, 2011

(30) Foreign Application Priority Data

Jul. 10, 2009 (JP) ................................. 2009-164134

(51) Int. Cl.
*H01L 21/00* (2006.01)

(52) U.S. Cl.
USPC ............. 438/104; 438/99; 438/142; 438/149; 257/43; 257/295; 257/310; 257/E21.32

(58) Field of Classification Search
USPC ........ 438/48, 99, 104, 142, 149, 151; 257/43, 257/72, 295, 310, E21.32
See application file for complete search history.

(56) References Cited

U.S. PATENT DOCUMENTS

| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |

(Continued)

FOREIGN PATENT DOCUMENTS

| CN | 101335304 | 12/2008 |
| EP | 1737044 A | 12/2006 |

(Continued)

OTHER PUBLICATIONS

International Search Report (Application No. PCT/JP2010/060938) dated Jul. 27, 2010.

(Continued)

*Primary Examiner* — Mark A Laurenzi
(74) *Attorney, Agent, or Firm* — Eric J. Robinson; Robinson Intellectual Property Law Office, P.C.

(57) ABSTRACT

A highly reliable semiconductor device which includes a thin film transistor having stable electric characteristics, and a manufacturing method thereof. In the manufacturing method of the semiconductor device which includes a thin film transistor where a semiconductor layer including a channel formation region is an oxide semiconductor layer, heat treatment which reduces impurities such as moisture to improve the purity of the oxide semiconductor layer and oxidize the oxide semiconductor layer (heat treatment for dehydration or dehydrogenation) is performed. Not only impurities such as moisture in the oxide semiconductor layer but also those existing in a gate insulating layer are reduced, and impurities such as moisture existing in interfaces between the oxide semiconductor layer and films provided over and under and in contact with the oxide semiconductor layer are reduced.

38 Claims, 33 Drawing Sheets

(56) References Cited

U.S. PATENT DOCUMENTS

| | | | |
|---|---|---|---|
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,382,421 B2 | 6/2008 | Hoffman et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,767,505 B2 | 8/2010 | Son et al. |
| 7,910,490 B2 | 3/2011 | Akimoto et al. |
| 7,932,521 B2 | 4/2011 | Akimoto et al. |
| 8,148,245 B2 | 4/2012 | Ikisawa et al. |
| 8,232,552 B2 | 7/2012 | Yano et al. |
| 8,274,077 B2 | 9/2012 | Akimoto et al. |
| 8,466,463 B2 | 6/2013 | Akimoto et al. |
| 8,629,069 B2 | 1/2014 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0160236 A1 | 8/2003 | Yamazaki et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0041166 A1* | 2/2005 | Yamazaki et al. ............... 349/42 |
| 2005/0199959 A1 | 9/2005 | Chiang et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197350 A1 | 8/2008 | Park et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2008/0315193 A1 | 12/2008 | Kim et al. |
| 2009/0001881 A1 | 1/2009 | Nakayama |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0142887 A1 | 6/2009 | Son et al. |
| 2009/0152506 A1 | 6/2009 | Umeda et al. |
| 2009/0152541 A1 | 6/2009 | Maekawa et al. |
| 2009/0159880 A1* | 6/2009 | Honda et al. ............... 257/43 |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2009/0325341 A1 | 12/2009 | Itagaki et al. |
| 2010/0012932 A1 | 1/2010 | Shieh et al. |
| 2010/0025678 A1 | 2/2010 | Yamazaki et al. |
| 2010/0032665 A1 | 2/2010 | Yamazaki et al. |
| 2010/0044701 A1 | 2/2010 | Sano et al. |
| 2010/0051938 A1 | 3/2010 | Hayashi et al. |
| 2010/0051940 A1 | 3/2010 | Yamazaki et al. |
| 2010/0051949 A1 | 3/2010 | Yamazaki et al. |
| 2010/0065844 A1 | 3/2010 | Tokunaga |
| 2010/0078633 A1 | 4/2010 | Watanabe |
| 2010/0084648 A1 | 4/2010 | Watanabe |
| 2010/0085081 A1 | 4/2010 | Ofuji et al. |
| 2010/0092800 A1 | 4/2010 | Itagaki et al. |
| 2010/0109002 A1 | 5/2010 | Itagaki et al. |
| 2010/0123130 A1 | 5/2010 | Akimoto et al. |
| 2010/0136743 A1 | 6/2010 | Akimoto et al. |
| 2010/0155717 A1 | 6/2010 | Yano et al. |
| 2011/0003429 A1 | 1/2011 | Oikawa et al. |
| 2011/0003430 A1 | 1/2011 | Yamazaki et al. |
| 2011/0006301 A1 | 1/2011 | Yamazaki et al. |
| 2011/0053322 A1 | 3/2011 | Sasaki et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |

FOREIGN PATENT DOCUMENTS

| | | | |
|---|---|---|---|
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |

(56) References Cited

FOREIGN PATENT DOCUMENTS

| | | |
|---|---|---|
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-357586 A | 12/2000 |
| JP | 2001-332734 A | 11/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165527 | 6/2006 |
| JP | 2007-096055 A | 4/2007 |
| JP | 2007-123861 A | 5/2007 |
| JP | 2007-188953 A | 7/2007 |
| JP | 2008-042088 A | 2/2008 |
| JP | 2008-205469 A | 9/2008 |
| JP | 2008-235871 A | 10/2008 |
| JP | 2008-243928 | 10/2008 |
| JP | 2008-281988 A | 11/2008 |
| JP | 2009-004733 A | 1/2009 |
| JP | 2009-004787 A | 1/2009 |
| JP | 2009-099847 | 5/2009 |
| JP | 2009-260002 A | 11/2009 |
| JP | 2010-016163 A | 1/2010 |
| JP | 2010-062229 A | 3/2010 |
| JP | 2011-003775 A | 1/2011 |
| WO | WO-2004/114391 | 12/2004 |
| WO | WO-2008/023553 | 2/2008 |
| WO | WO-2008/105347 | 9/2008 |
| WO | WO-2008/117810 | 10/2008 |
| WO | WO-2008/126879 | 10/2008 |
| WO | WO-2008/143304 | 11/2008 |
| WO | WO-2009/084537 | 7/2009 |

OTHER PUBLICATIONS

Written Opinion (Application No. PCT/JP2010/060938) dated Jul. 27, 2010.

Masaki Nakamura et al., "Syntheses and crystal structures of new homologous compounds, indium iron zinc oxides (InFeO$_3$ (ZnO)m) (m: natural number) and related compounds,", Kotai Butsuri (Solid State Physics), 1993, vol. 28, No. 5, pp. 317-327.

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors By Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In$_2$O$_3$Ga$_2$ZnO$_4$—ZnO system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, In$_2$O$_3$(ZnO)m (m=3, 4, and 5), InGaO$_3$ (ZnO)$_3$, and Ga$_2$O$_3$(ZnO)m (m=7, 8, 9, and 16) in the In$_2$O$_3$—ZnGa$_2$O$_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO$_3$(ZnO)$_5$ films,", Appl. Phys. Lett.(Applied Physics Letters), Sep. 13, 2004, vol. 85, No. 11, pp. 1993-1995.

Li.C et al., "Modulated Structures of Homologous Compounds InMO$_3$(ZnO)m (M=In,Ga; m=Integer Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga$_2$O$_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem Oleds,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3. pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

(56) References Cited

OTHER PUBLICATIONS

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display with Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS with a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges To, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,$YbFe_2O_4$, and $Yb_2Fe_3O_7$ Types of Structures for Compounds in the $In_2O_3$ and $Sc_2O_3$—$A_2O_3$—BO Systems [A; Fe, Ga, or Al; B: Mg, Mn, Fe, Ni, Cu,or Zn] at Temperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AMOLED Display,", SID Digest '08 : SID International Symposium Digest of Technical Papers, May 20, 2008, vol. 39, pp. 629-632.

Orita.M et al., "Mechanism of Electrical Conductivity of Transparent $InGaZnO_4$,", Phys. Rev. B (Physical Review. B), Jan. 15, 2000, vol. 61, No. 3, pp. 1811-1818.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technial Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide $InGaO_3(ZnO)m$ (m<4):a Zn 4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors with Aluminum Oxide Dielectric Layers,", J. Electrochem. Soc. (Journal of the Electrochemical Society), 2008, vol. 155, No. 12, pp. H1009-H1014.

(56) References Cited

OTHER PUBLICATIONS

Ueno.K et al., "Field-Effect Transistor on $SrTiO_3$ with Sputtered $Al_2O_3$ Gate Insulator,", Appl. Phys. Lett.(Applied Physics Letters), Sep. 1, 2003, vol. 83, No. 9, pp. 1755-1757.

Lin.M et al., "The Latest Research Progress on Zinc Oxide Based Thin Film Transistors", OPTO Electronic Technology, Dec. 1, 2008, vol. 28, No. 4, pp. 217-226.

Kumomi.H et al., "Amorphous oxide channel TFTs", Thin Solid Films, 2008, vol. 516, No. 7, pp. 1516-1522, Elsevier.

Gao Xiping et al, "Analysis of glass for plasma display panel", China Building Materials Science & Technology, Apr. 30, 2006, pp. 46-51.

Chinese Office Action (Application No. 201080032159.1) Dated Feb. 8, 2014.

Chinese Office Action (Application No. 201080032159.1) Dated Aug. 19, 2014.

\* cited by examiner

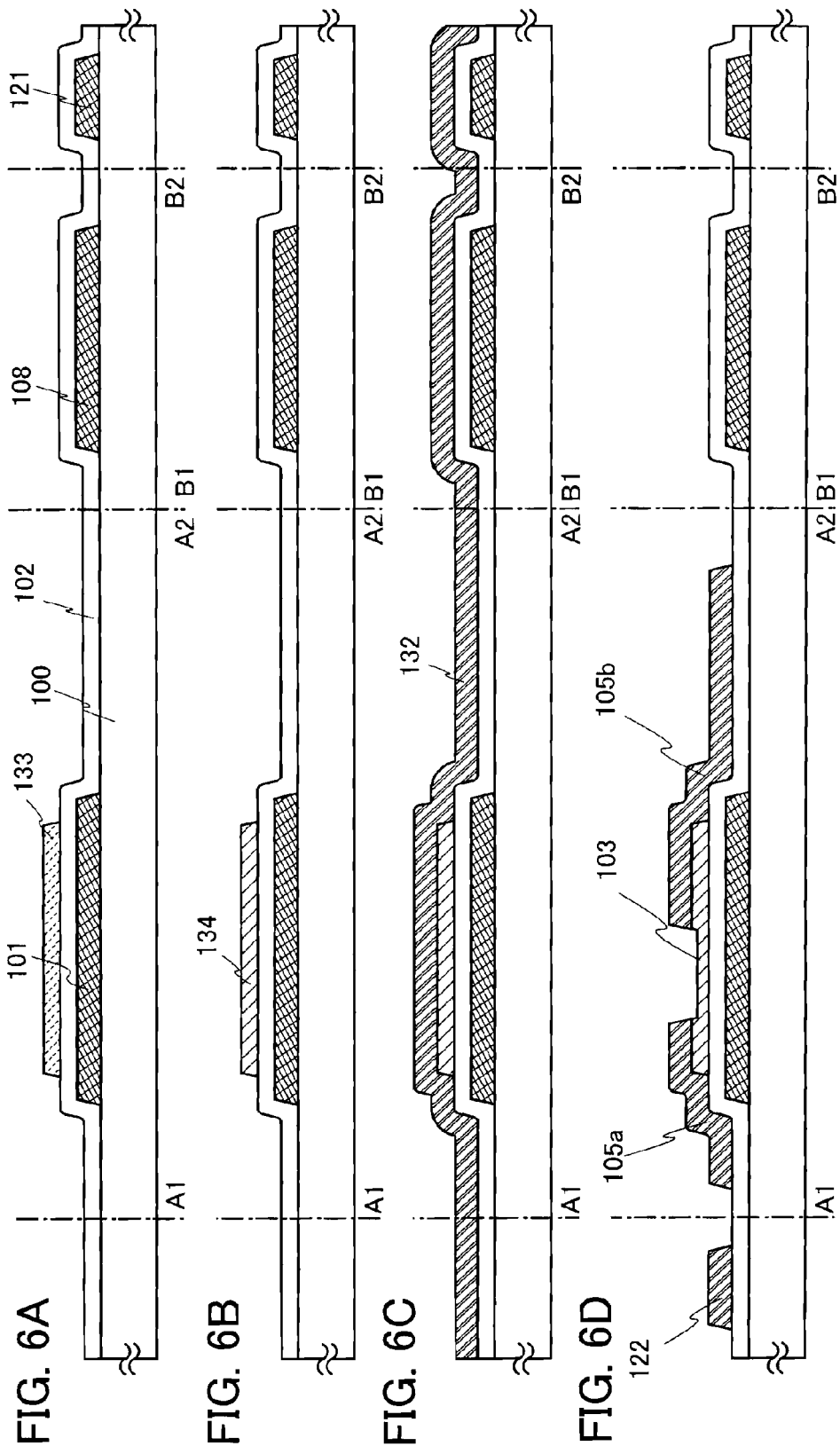

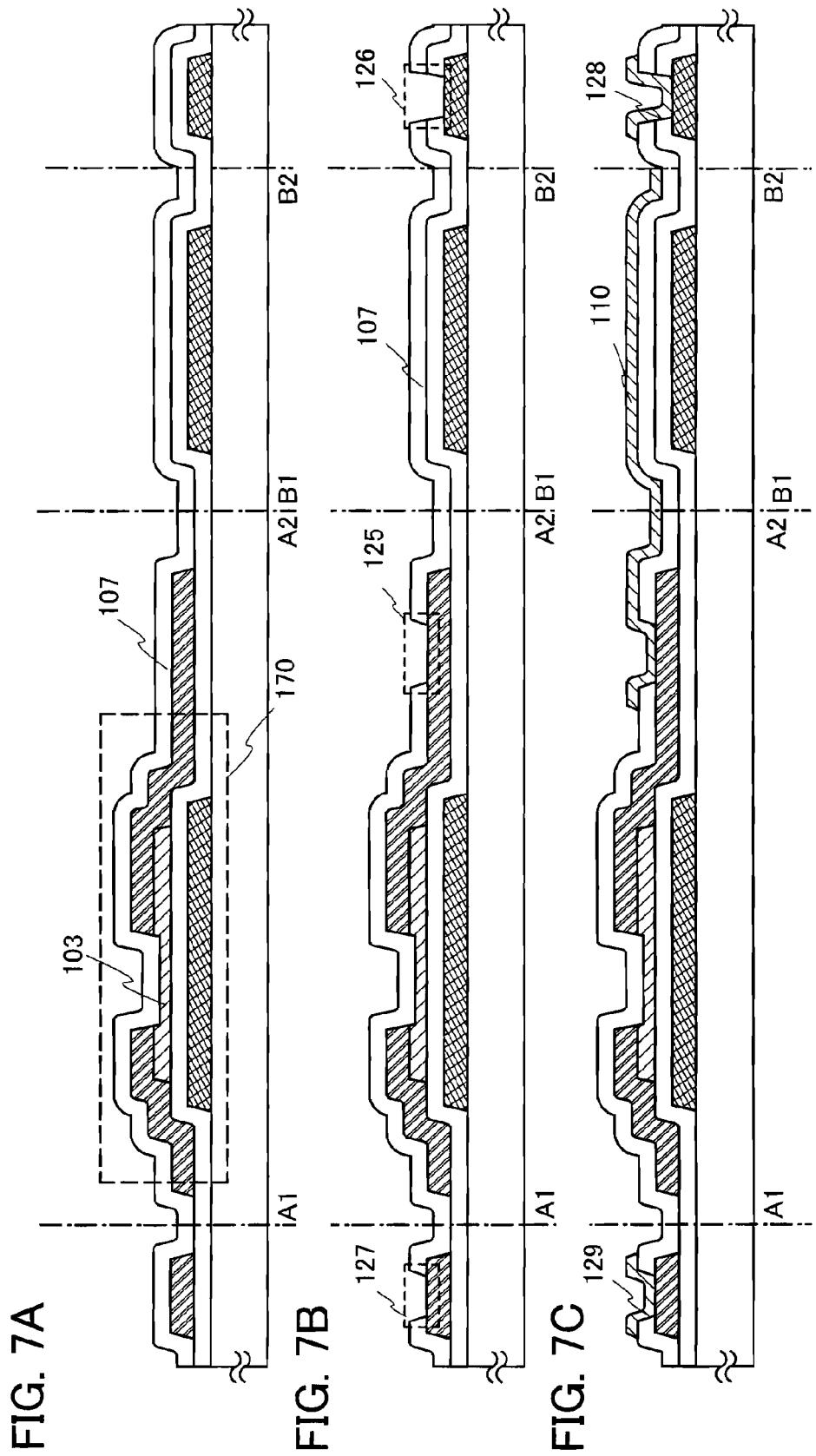

FIG. 9A1
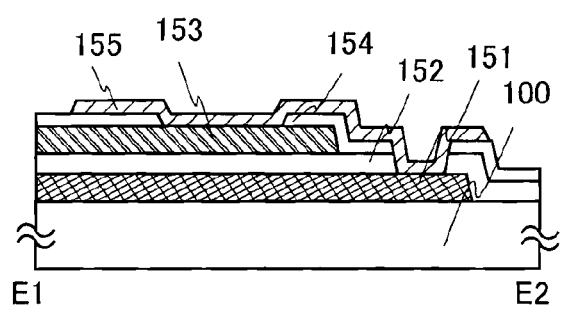
FIG. 9A2
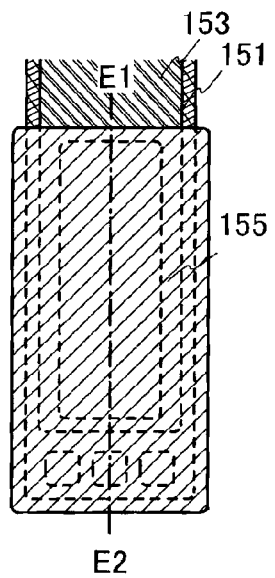
FIG. 9B1
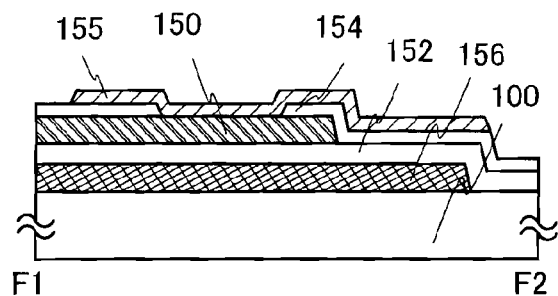
FIG. 9B2
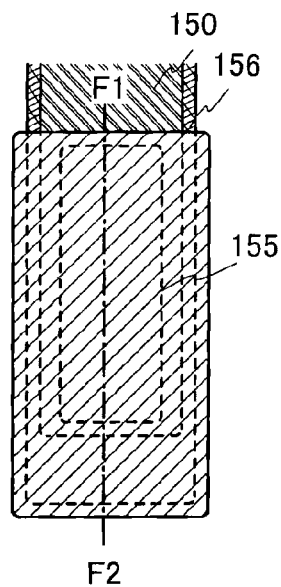

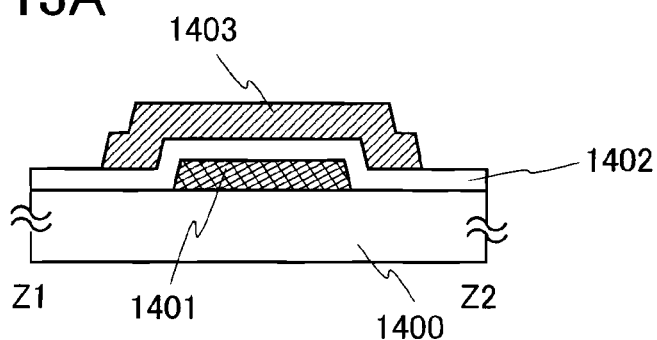
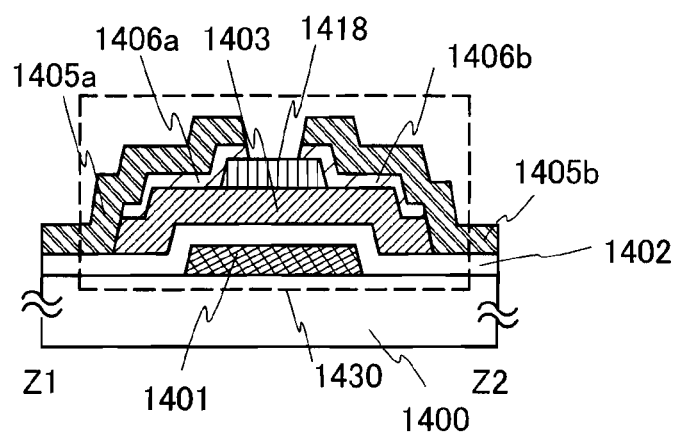
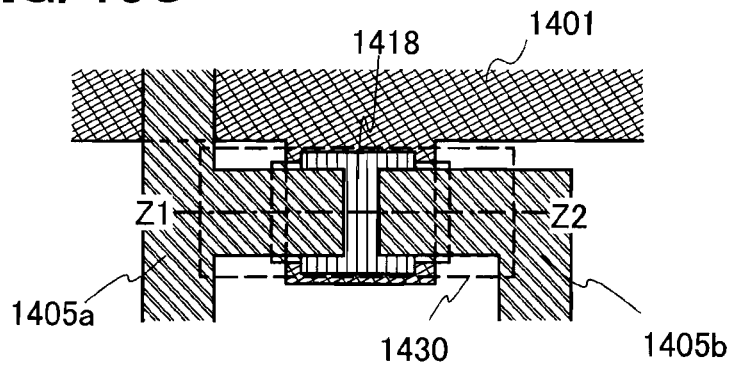

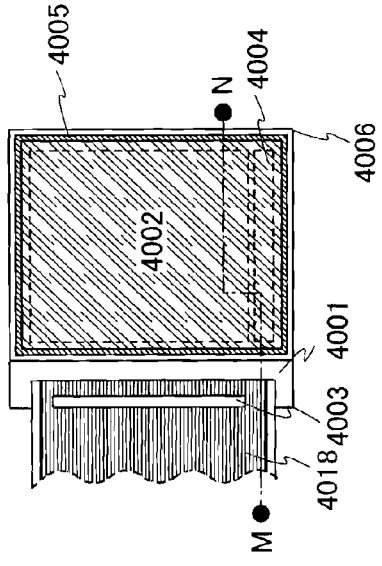
FIG. 20A1
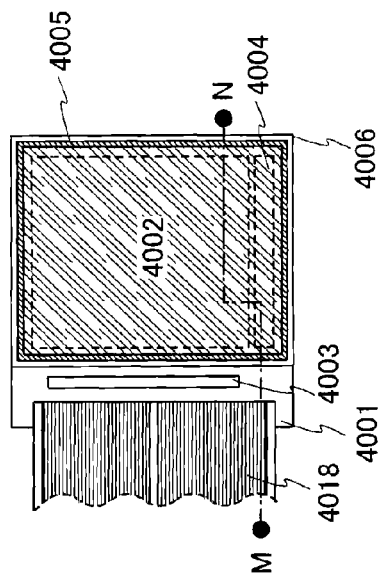
FIG. 20A2
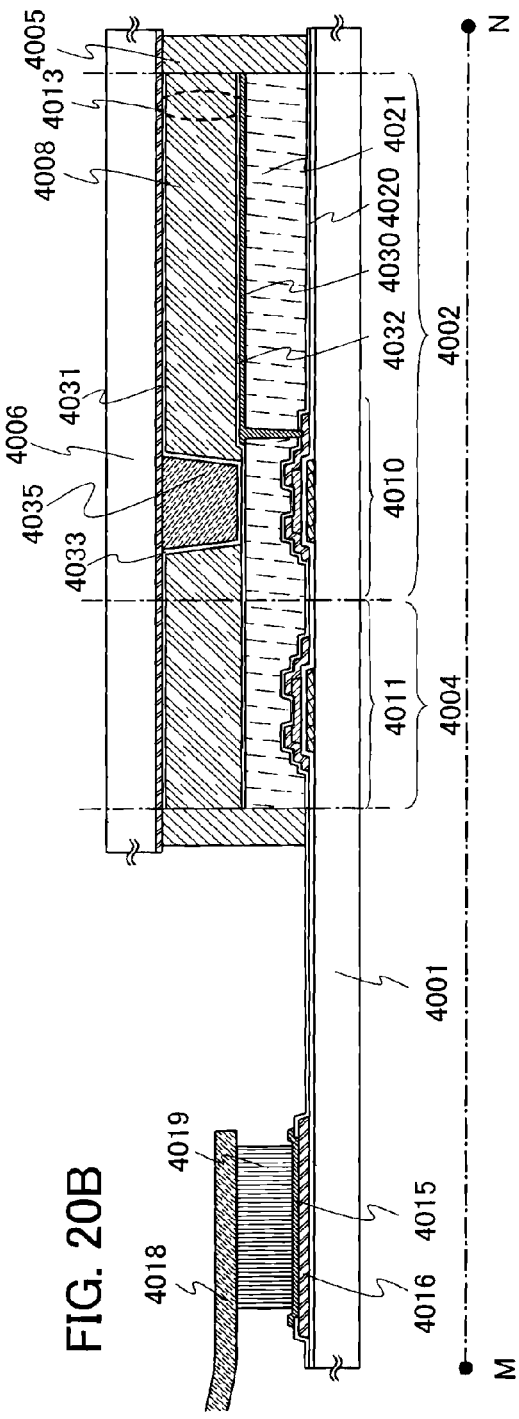
FIG. 20B

METHOD FOR MANUFACTURING SEMICONDUCTOR DEVICE INCLUDING OXIDE SEMICONDUCTOR FILM

TECHNICAL FIELD

The present invention relates to a semiconductor device including an oxide semiconductor and a manufacturing method thereof.

In this specification, a semiconductor device generally refers to any device which can function by utilizing semiconductor characteristics: an electro-optic device, a semiconductor circuit, and an electronic device are all included in the category of the semiconductor device.

BACKGROUND ART

In recent years, a technique by which a thin film transistor (TFT) is manufactured using a semiconductor thin layer (having a thickness of about several nanometers to several hundred nanometers) formed over a substrate having an insulating surface has attracted attention. Thin film transistors have been applied to a wide range of electronic devices such as ICs or electro-optic devices and urgently developed particularly as switching elements in image display devices. Various metal oxides are used for a variety of applications. Indium oxide is a well-known material and has been used as a transparent electrode material which is necessary for liquid crystal displays and the like.

Some metal oxides exhibit semiconductor characteristics. As examples of metal oxides exhibiting semiconductor characteristics, tungsten oxide, tin oxide, indium oxide, zinc oxide, and the like can be given, and thin film transistors in each of which a channel formation region is formed using such a metal oxide exhibiting semiconductor characteristics are already known (see Patent Documents 1 to 5 and Non-Patent Document 1).

Further, not only single-component oxides but also multi-component oxides are known as metal oxides. For example, $InGaO_3(ZnO)_m$ (m: natural number) having a homologous series is known as a multi-component oxide semiconductor including In, Ga, and Zn (see Non-Patent Documents 2 to 4).

Further, it has been confirmed that an oxide semiconductor including such an In—Ga—Zn—O-based oxide is applicable to a channel layer of a thin film transistor (see Patent Document 6 and Non-Patent Documents 5 and 6).

REFERENCE

Patent Document

Patent Document 1: Japanese Published Patent Application No. S60-198861
Patent Document 2: Japanese Published Patent Application No. H08-264794
Patent Document 3: Japanese Translation of PCT International Application No. H11-505377
Patent Document 4: Japanese Published Patent Application No. 2000-150900
Patent Document 5: Japanese Published Patent Application No. 2007-123861
Patent Document 6: Japanese Published Patent Application No. 2004-103957

Non-Patent Document

Non-Patent Document 1: M. W. Prins, K. O. Grosse-Holz, G. Muller, J. F. M. Cillessen, J. B. Giesbers, R. P. Weening, and R. M. Wolf, "A ferroelectric transparent thin-film transistor," *Appl. Phys. Lett.*, 17 Jun. 1996, Vol. 68, pp. 3650-3652
Non-Patent Document 2: M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
Non-Patent Document 3: N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
Non-Patent Document 4: M. Nakamura, N. Kimizuka, T. Mohri, and M. Isobe, "Syntheses and crystal structures of new homologous compounds, indium iron zinc oxides ($InFeO_3(ZnO)_m$) (m: natural number) and related compounds", *KOTAI BUTSURI (SOLID STATE PHYSICS)*, 1993, Vol. 28, No. 5, pp. 317-327
Non-Patent Document 5: K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
Non-Patent Document 6: K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, pp. 488-492

DISCLOSURE OF INVENTION

It is an object of the present invention to manufacture and provide a highly reliable semiconductor device which includes a thin film transistor having stable electric characteristics.

In a method for manufacturing a semiconductor device which includes a thin film transistor where a semiconductor layer including a channel formation region is an oxide semiconductor layer, heat treatment which reduces impurities such as moisture to improve the purity of the oxide semiconductor layer (heat treatment for dehydration or dehydrogenation) is performed in an oxygen atmosphere. In addition, not only impurities such as moisture in the oxide semiconductor layer but also those existing in a gate insulating layer are reduced, and impurities such as moisture existing in interfaces between the oxide semiconductor layer and films provided over and under and in contact with the oxide semiconductor layer are reduced. Further, the heat treatment can oxidize the oxide semiconductor layer.

In order to reduce impurities such as moisture, the oxide semiconductor layer is subjected to heat treatment in an oxygen atmosphere after formed, so that moisture existing in the oxide semiconductor layer is reduced and the oxide semiconductor layer is oxidized. The heat treatment is performed at a temperature higher than or equal to 200° C. and lower than the strain point, preferably higher than or equal to 400° C. and lower than or equal to 700° C. After the heat treatment, it is preferable that the oxide semiconductor layer be slowly cooled in the/an oxygen atmosphere or an inert gas atmosphere of nitrogen or a rare gas (such as helium or argon).

In this specification, the oxygen atmosphere refers to an atmosphere of a gas containing an oxygen atom, typically refers to an atmosphere of oxygen, ozone, or a nitrogen oxide (such as nitrogen monoxide, nitrogen dioxide, dinitrogen monoxide, dinitrogen trioxide, dinitrogen tetraoxide, or dinitrogen pentoxide). The oxygen atmosphere may contain an inert gas of nitrogen or a rare gas (such as helium or argon); in that case, the amount of the inert gas is less than that of the gas containing an oxygen atom.

In this specification, heat treatment in an oxygen atmosphere, by which an oxide semiconductor layer is oxidized while performing dehydration or dehydrogenation thereon is referred to as heat treatment for dehydration or dehydrogenation. In this specification, dehydrogenation does not refer to only elimination in the form of $H_2$ by the heat treatment, and dehydration or dehydrogenation also refer to elimination of a molecule including H, OH, and the like for convenience.

Impurities such as moisture existing in the oxide semiconductor layer are reduced and the oxide semiconductor layer is oxidized by the heat treatment in the oxygen atmosphere, which leads to improvement of the reliability of a thin film transistor. Further, the reliability of the thin film transistor can be improved by forming an oxide insulating layer so as to be in contact with the oxide semiconductor layer.

The oxide insulating layer, which is formed in contact with the oxide semiconductor layer to which the heat treatment is performed in the oxygen atmosphere, is formed using an inorganic insulating layer, which blocks entry of impurities such as moisture, a hydrogen ion, and $OH^-$. As typical examples of the oxide insulating layer, there are a silicon oxide layer, a silicon nitride oxide layer, and a stacked layer thereof.

After the oxide insulating layer serving as a protection layer is formed on and in contact with the oxide semiconductor layer to which the heat treatment is performed in the oxygen atmosphere, further heat treatment may be performed. The heat treatment after the oxide insulating layer serving as a protection layer is formed on and in contact with the oxide semiconductor layer can reduce variation in electric characteristics of a thin film transistor.

With the above structure, at least one of the above problems can be resolved.

One embodiment of the present invention is a method for manufacturing a semiconductor device as follows: a gate electrode layer is formed over a substrate having an insulating surface; a gate insulating layer is formed over the gate electrode layer; an oxide semiconductor layer is formed over the gate insulating layer; the oxide semiconductor layer is dehydrated or dehydrogenated in an oxygen atmosphere; a source and drain electrode layers are formed over the dehydrated or dehydrogenated oxide semiconductor layer; and an oxide insulating layer which is in contact with part of the oxide semiconductor layer is formed over the gate insulating layer, the oxide semiconductor layer, and the source and drain electrode layers.

Another embodiment of the present invention is a method for manufacturing a semiconductor device as follows: a gate electrode layer is formed over a substrate having an insulating surface; a gate insulating layer is formed over the gate electrode layer; an oxide semiconductor layer is formed over the gate insulating layer; the oxide semiconductor layer is heated in an oxygen atmosphere; a source and drain electrode layers are formed over the dehydrated or dehydrogenated oxide semiconductor layer; and an oxide insulating layer which is in contact with part of the oxide semiconductor layer is formed over the gate insulating layer, the oxide semiconductor layer, and the source and drain electrode layers. It is preferable that the oxide semiconductor layer be heated in an oxygen atmosphere at a temperature higher than or equal to 200° C., and then slowly cooled to a range of higher than or equal to room temperature and lower than 100° C.

The oxide semiconductor used in this specification forms a thin film expressed by $InMO_3(ZnO)_m$ (m>0), and a thin film transistor using the thin film as a semiconductor layer is manufactured. Note that M denotes one metal element or a plurality of metal elements selected from Ga, Fe, Ni, Mn, and Co. For example, M may denote Ga; or M may denote the above another metal element in addition to Ga, for example Ga and Ni or Ga and Fe. Further, the above oxide semiconductor may contain Fe or Ni, another transitional metal element, or an oxide of the transitional metal as an impurity element in addition to the metal element contained as M. In this specification, among the oxide semiconductor layers whose composition formulae are represented by $InMO_3(ZnO)_m$ (m>0), an oxide semiconductor whose composition formula includes at least Ga as M is referred to as an In—Ga—Zn—O-based oxide semiconductor, and a thin film of the In—Ga—Zn—O-based oxide semiconductor is referred to as an In—Ga—Zn—O-based non-single-crystal layer.

As the oxide semiconductor applied to the oxide semiconductor layer, any of the following oxide semiconductors can be applied besides the above: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor. Silicon oxide may be included in the oxide semiconductor layer. The oxide semiconductor layer includes silicon oxide ($SiO_X$ (X>0)) which suppresses crystallization of the oxide semiconductor layer, whereby crystallization of the oxide semiconductor layer due to heat treatment can be suppressed. It is preferable that the oxide semiconductor layer be in an amorphous state; however, the oxide semiconductor layer may be partly crystallized.

It is preferable that the oxide semiconductor be an oxide semiconductor containing In, more preferably an oxide semiconductor containing In and Ga. In order to obtain an I-type (intrinsic) oxide semiconductor layer, dehydration or dehydrogenation is effective.

Since a thin film transistor is easily broken by static electricity or the like, it is preferable to provide a protective circuit for protecting a driver circuit over the same substrate as that for a gate line or a source line. It is preferable that the protective circuit be formed with a non-linear element including an oxide semiconductor.

The gate insulating layer and the oxide semiconductor layer may be successively processed (the process also called successive treatment, an insitu process, or successive film formation) without exposure to the air. Successive treatment without exposure to the air makes it possible to obtain each an interface between the gate insulating layer and the oxide semiconductor layer, which is not contaminated by atmospheric components or impurity elements floating in the air, such as moisture or hydrocarbon; accordingly, variation in characteristics of the thin film transistor can be reduced.

Note that the term "successive treatment" in this specification means that during a series of steps from a first treatment step by a plasma CVD method or a sputtering method to a second treatment step by the plasma CVD method or the sputtering method, an atmosphere in which a substrate to be processed is disposed is not contaminated by a contaminant atmosphere such as the air, and is kept controlled to be vacuum or an inert gas atmosphere (a nitrogen atmosphere or a rare gas atmosphere). The successive treatment enables film formation while preventing moisture or the like from being attached to the substrate after cleaned.

Performing the series of steps from the first treatment step to the second treatment step in the same chamber is within the scope of the definition of the successive treatment in this specification.

In addition, the following case is also within the scope of the definition of the successive treatment in this specification: in the case of performing the series of steps from the first treatment step to the second treatment step in different chambers, the substrate is transferred after the first treatment step to another chamber without being exposed to the air and is then subjected to the second treatment.

The case where there is a substrate transfer step, an alignment step, a slow cooling step, a step of heating or cooling a substrate so that the temperature of the substrate is suitable for the second treatment step, or the like between the first treatment step and the second treatment step is also in the scope of the definition of the successive treatment in this specification.

However, the case where there is a step using liquid, such as a cleaning step, wet etching, or resist formation may be provided between the first treatment step and the second treatment step is not within the scope of the definition of the successive treatment in this specification.

In accordance with the present invention, a thin film transistor having stable electric characteristics can be manufactured. In accordance with the present invention, a semiconductor device including a highly reliable thin film transistor having better electric characteristics can be manufactured.

BRIEF DESCRIPTION OF DRAWINGS

In the accompanying drawings:

FIGS. 6A to 6D are cross-sectional diagrams of a manufacturing process of a semiconductor device according to one embodiment of the present invention;

FIGS. 7A to 7C are cross-sectional diagrams of a manufacturing process of a semiconductor device according to one embodiment of the present invention;

FIGS. 9A1 and 9A2 illustrate a semiconductor device according to one embodiment of the present invention and FIGS. 9B1 and 9B2 illustrate a semiconductor device according to one embodiment of the present invention;

FIGS. 13A to 13C illustrate a semiconductor device according to one embodiment of the present invention;

FIGS. 20A1, 20A2, and 20B each illustrate a semiconductor device according to one embodiment of the present invention;

BEST MODE FOR CARRYING OUT THE INVENTION

Hereinafter, embodiments and an example of the present invention will be described in detail with reference to the accompanying drawings. It is to be noted that the present invention is not limited to the description below, and it is easily understood by those skilled in the art that modes and details disclosed herein can be modified in various ways without departing from the spirit and scope of the present invention. Therefore, the present invention is not construed as being limited to the description of the embodiments and example.

Embodiment 1

A semiconductor device and a method for manufacturing the semiconductor device will be described with reference to FIGS. 1A to 1D and FIGS. 2A and 2B.

Figure 2A:
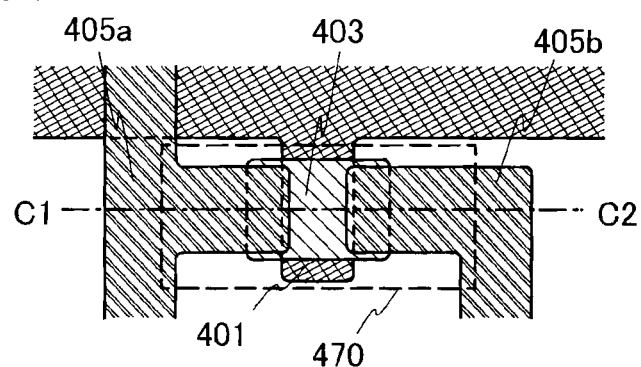
FIGS. 2A and 2B illustrate a semiconductor device according to one embodiment of the present invention.
Figure 2B:
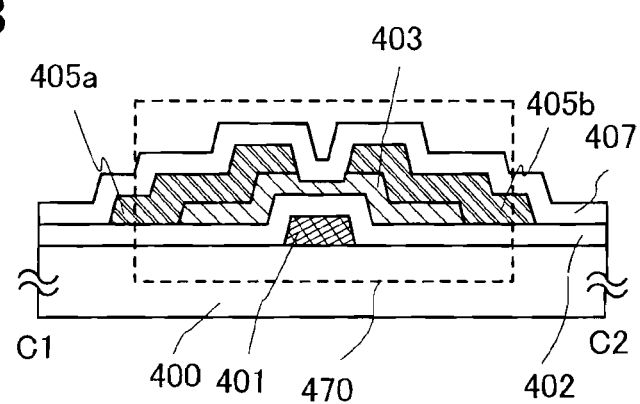

FIG. 2A is a plan view of a thin film transistor 470 included in a semiconductor device, and FIG. 2B is a cross-sectional diagram along line $C_1$-$C_2$ of FIG. 2A. The thin film transistor 470 is a bottom-gate thin film transistor and includes, over a substrate 400 which is a substrate having an insulating surface, a gate electrode layer 401, a gate insulating layer 402, an oxide semiconductor layer 403, and a source and drain electrode layers 405a and 405b. In addition, an oxide insulating layer 407 is provided to cover the thin film transistor 470 and be in contact with the oxide semiconductor layer 403.

As for the oxide semiconductor layer 403, heat treatment which reduces impurities such as moisture (heat treatment for dehydration or dehydrogenation) is performed in an oxygen atmosphere at least after the formation of the oxide semiconductor layer. The oxide semiconductor layer 403 after being subjected to the heat treatment is used as a channel formation region of a thin film transistor, so that the reliability of the thin film transistor can be improved.

Further, after the impurities such as moisture ($H_2O$) are eliminated and the oxide semiconductor layer 403 is oxidized by the heat treatment (heat treatment for dehydration or dehydrogenation) in the oxygen atmosphere, it is preferable to perform slow cooling in the/an oxygen atmosphere or in an inert gas atmosphere. Furthermore, it is preferable to perform the formation of the oxide insulating layer to be in contact with the oxide semiconductor layer, and the like after the heat treatment for dehydration or dehydrogenation and the slow cooling. In this manner, the reliability of the thin film transistor 470 can be improved.

It is preferable that impurities such as moisture be reduced not only in the oxide semiconductor layer 403 but also in the gate insulating layer 402 and in an interface between the oxide semiconductor layer and a layer that is provided over/under and in contact with the oxide semiconductor layer 403, that is, an interface between the gate insulating layer 402 and the oxide semiconductor layer 403 and an interface between the oxide insulating layer 407 and the oxide semiconductor layer 403.

Note that the source and drain electrode layers 405a and 405b that are in contact with the oxide semiconductor layer 403 are formed using one or more materials selected from titanium, aluminum, manganese, magnesium, zirconium, beryllium, and thorium. An alloy film or alloy films including any combination of the above elements may be stacked.

The oxide semiconductor layer 403 including a channel formation region is formed using an oxide material having semiconductor characteristics; typically, an In—Ga—Zn—O-based non-single-crystal layer is used.

FIGS. 1A to 1D are cross-sectional diagrams illustrating a manufacturing process of the thin film transistor 470 show in FIGS. 2A and 2B.

Figure 1A:
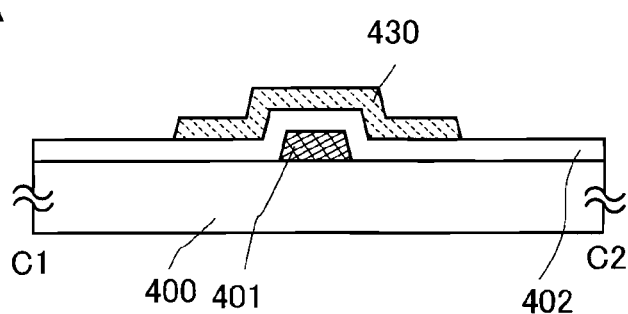
FIGS. 1A to 1D are cross-sectional diagrams of a manufacturing process of a semiconductor device according to one embodiment of the present invention.
Figure 1B:
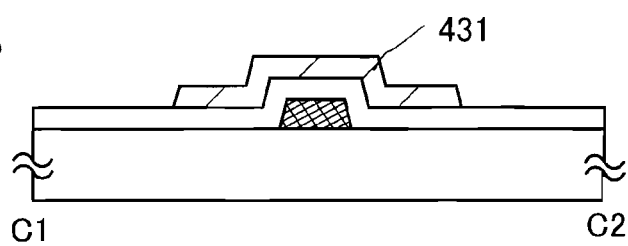

In FIG. 1A, the gate electrode layer 401 is provided over the substrate 400 which is a substrate having an insulating surface.

Although there is no particular limitation on the substrate 400, it is necessary that the substrate have heat resistance high enough to resist heat treatment to be performed later. As the substrate 400, a glass substrate of barium borosilicate glass, aluminoborosilicate glass, or the like can be used.

Further, in the case where a substrate having a light-transmitting property is used as the substrate 400, it is preferable to use one having a strain point higher than or equal to 730° C. in the case where the temperature of the heat treatment performed later is high. Further, as a material of the substrate 100, for example, a glass material such as aluminosilicate glass, aluminoborosilicate glass, or barium borosilicate glass is used. By containing a larger amount of barium oxide (BaO) than boric acid, a glass becomes heat-resistant and of more practical use. Therefore, it is preferable to use a glass substrate containing BaO and $B_2O_3$ so that the amount of BaO is larger than that of $B_2O_3$.

A substrate formed of an insulator, such as a ceramic substrate, a quartz substrate, or a sapphire substrate may be used as the substrate 400. Alternatively, crystallized glass or the like may be used.

An insulating layer serving as a base layer may be provided between the substrate 400 and the gate electrode layer 401. The base film has a function of preventing diffusion of an impurity element from the substrate 400, and can be formed to have a single-layer or stacked-layer structure using one or more of a silicon nitride layer, a silicon oxide layer, a silicon nitride oxide layer, and a silicon oxynitride layer.

The gate electrode layer 401 can be formed using a single layer or a stacked layer using a metal material such as molybdenum, titanium, chromium, tantalum, tungsten, aluminum, copper, neodymium, or scandium, or an alloy material which includes any of these materials as a main component.

For example, as a stacked structure of two layers of the gate electrode layer 401, any of the following structures is preferable: a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, and a two-layer structure in which a titanium nitride layer and a molybdenum layer are stacked. As a stacked structure of three layers, it is referable to use a stacked layer of a tungsten layer or a tungsten nitride layer, an alloy layer of aluminum and silicon or an alloy layer of aluminum and titanium, and a titanium nitride layer or a titanium layer.

Next, the gate insulating layer 402 is formed over the gate electrode layer 401.

The gate insulating layer 402 can be formed using a single layer or a stacked layer of a silicon oxide layer, a silicon nitride layer, a silicon oxynitride layer, a silicon nitride oxide layer, an aluminum oxide layer, and/or a tantalum oxide layer by a plasma CVD method, a sputtering method, or the like. For example, a silicon oxynitride layer may be formed by a plasma CVD method using a deposition gas containing silane ($SiH_4$), oxygen, and nitrogen.

Next, the oxide semiconductor layer is formed over the gate insulating layer 402.

Note that before the oxide semiconductor film is formed by a sputtering method, it is preferable to perform reverse sputtering in which an argon gas is introduced and plasma is generated so that dust on a surface of the gate insulating layer 402 is removed. The reverse sputtering is a method in which voltage is applied to a substrate, not to a target side, in an argon atmosphere by using an RF power supply and plasma is generated in the vicinity of the substrate to modify a surface of the substrate. Note that as well as argon, helium, or the like may be used.

The oxide semiconductor film is formed by a sputtering method with use of an In—Ga—Zn—O based oxide semiconductor target. The oxide semiconductor layer is formed by a sputtering method using an In—Ga—Zn—O-based oxide semiconductor target. The sputtering method is carried out in a rare gas (typically argon) atmosphere, an oxygen atmosphere, or an atmosphere including a rare gas (typically argon) and oxygen.

The gate insulating layer 402 and the oxide semiconductor layer may be formed successively without exposure to the air. Successive film formation without exposure to the air makes it possible to obtain each interface between stacked layers, which is not contaminated by atmospheric components or impurity elements floating in the air, such as moisture or hydrocarbon; accordingly, variation in characteristics of the thin film transistor can be reduced.

The oxide semiconductor layer is processed into an island shape through a photolithography process, thereby forming an oxide semiconductor layer 430 (see FIG. 1A).

Next, it is preferable that heat treatment be performed on the oxide semiconductor layer in an oxygen atmosphere and then slow cooling be performed in an oxygen atmosphere or an inert gas atmosphere. The heat treatment performed on the oxide semiconductor layer 430 in the above atmosphere can eliminate impurities such as hydrogen and moisture existing in the oxide semiconductor layer 430 and oxidize the oxide semiconductor layer 430, so that an oxide semiconductor layer 431 is obtained (see FIG. 1B). The oxide semiconductor layer 430 may be crystallized to be a microcrystalline layer or a polycrystalline layer, which depends on the condition of the heat treatment or a material of the oxide semiconductor layer.

The oxygen atmosphere refers to an atmosphere of a gas containing an oxygen atom, typically refers to an atmosphere of oxygen, ozone, or a nitrogen oxide (such as nitrogen monoxide, nitrogen dioxide, dinitrogen monoxide, dinitrogen trioxide, dinitrogen tetraoxide, or dinitrogen pentoxide). The oxygen atmosphere may contain an inert gas of nitrogen or a rare gas (such as helium or argon); in that case, the amount of the inert gas is less than that of the gas containing an oxygen atom.

It is preferable that moisture, hydrogen, and the like be not included in the oxygen atmosphere in the heat treatment. Alternatively, it is preferable that the purity of oxygen introduced into a heat treatment apparatus be 6N (99.9999%) or higher, more preferably 7N (99.99999%) or higher (that is, the concentration of impurities be 1 ppm or lower, more preferably 0.1 ppm or lower).

The heat treatment can be performed by a heating method using an electric furnace or an instantaneous heating method such as a gas rapid thermal anneal (GRTA) method using a heated gas or a lamp rapid thermal anneal (LRTA) method using a lamp light.

Here, as one mode of the heat treatment on the oxide semiconductor layer 430, a heating method using an electric furnace 601 is described with reference to FIG. 3.

Figure 3:
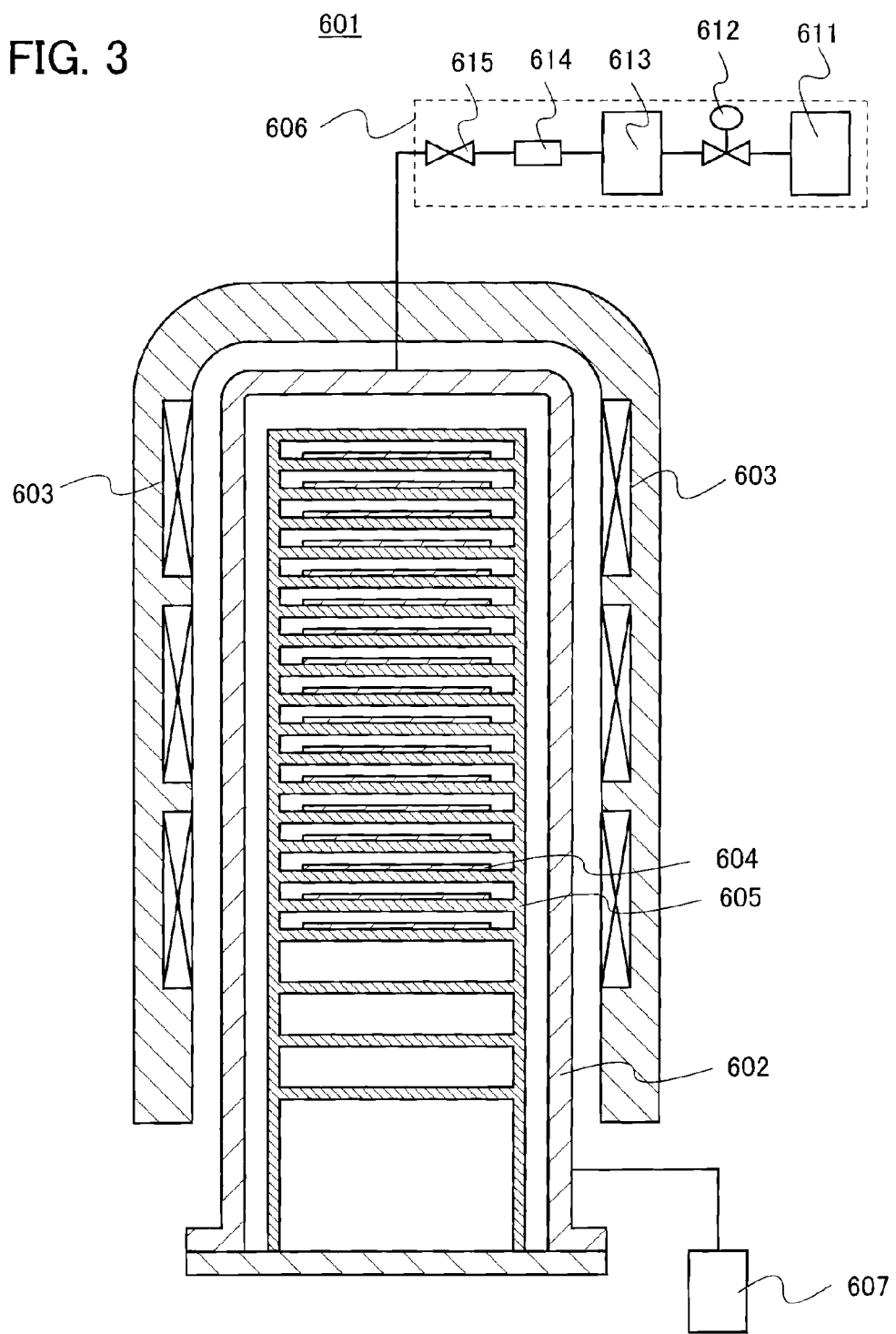
FIG. 3 is a cross-sectional diagram of an electric furnace.

FIG. 3 is a schematic view of the electric furnace 601. A heater 603 is provided outside a chamber 602 and used for heating the chamber 602. A susceptor 605 on which a substrate 604 is mounted is provided in the chamber 602, and the substrate 604 is carried into or out of the chamber 602. Further, the chamber 602 is provided with a gas supply means 606 and an evacuation means 607. A gas is introduced into the chamber 602 by the gas supply means 606. The evacuation means 607 evacuates the chamber 602. Note that the temperature-rise characteristics of the electric furnace 601 are preferably set at higher than or equal to 0.1° C./min and lower than or equal to 20° C./min. In addition, the temperature-drop characteristics of the electric furnace 601 are preferably set at higher than or equal to 0.1° C./min and lower than or equal to 15° C./min.

The gas supply means 606 includes a gas supply source 611, a pressure adjusting valve 612, a refiner 613, a mass flow controller 614, and a stop valve 615. In this embodiment, the refiner 613 is provided between the gas supply source 611 and the chamber 602. With the refiner 613, impurities such as moisture or hydrogen in a gas which is introduced into the chamber 602 from the gas supply source 611 can be removed, so that entry of impurities such as moisture and hydrogen into the chamber 602 can be suppressed.

In this embodiment, a gas including an oxygen atom is introduced into the chamber 602 from the gas supply source 611 so that the atmosphere in the chamber becomes an oxygen atmosphere, and the oxide semiconductor layer 430 which is formed over the substrate 604 is heated in the chamber 602 heated to a temperature higher than or equal to 200° C. and lower than the strain point, preferably higher than or equal to 400° C. and lower than or equal to 700° C. In this manner, dehydration or dehydrogenation of the oxide semiconductor layer 430 can be performed.

According to this embodiment, the oxide semiconductor layer 430 is made to be less-defective i-type by the heat treatment for dehydration or dehydrogenation in the oxygen atmosphere since the surface of the oxide semiconductor layer 430 can be oxidized and oxygen is bounded to a defect or a part from which the impurities such as moisture and hydrogen are detached. Accordingly, by using the dehydrated or dehydrogenated oxide semiconductor layer 430 as a channel formation region, the reliability of a thin film transistor to be formed can be improved.

The heat treatment condition is set such that at least one of two peaks of water, which appears at around 300° C. is not detected even when TDS (Thermal Desorption Spectroscopy) measurement is performed on the oxide semiconductor layer after being dehydrated or dehydrogenated, to 450° C. Therefore, even when TDS measurement is performed on a thin film transistor including the dehydrated or dehydrogenated oxide semiconductor layer to, 450° C., the peak of water which appears at around 300° C. is not detected.

Next, it is preferable that the heater be turned off, the chamber 602 of the heat apparatus be held in the/an oxygen atmosphere or an inert gas atmosphere, and slow cooling be performed. For example, slow cooling may be performed from the temperature of the heat treatment to a temperature higher than or equal to room temperature and lower than 100° C. after the heat treatment. Consequently, the reliability of a thin film transistor to be formed can be improved.

In the cooling step, the temperature may be decreased from the heat temperature T, for the dehydration or dehydrogenation of the oxide semiconductor layer 430 to a temperature which is low enough to prevent entry of water, specifically a temperature that is lower than the heat temperature T by 100° C. or higher.

The substrate 604 in the chamber 602 of the heat apparatus may be cooled to a temperature lower than 300° C., and then, the substrate 604 may be transferred into an oxygen atmosphere or an inert gas atmosphere at a temperature higher than or equal to room temperature and lower than 100° C.; accordingly, the cooling time of period of the substrate 604 can be reduced.

When the heat apparatus has a plurality of chambers, the heat treatment and the cooling treatment can be performed in different chambers. Typically, in a first chamber which is heated to a temperature higher than or equal to 200° C. and lower than the strain point of the substrate, preferably higher than or equal to 400° C. and lower than or equal to 700° C., the oxide semiconductor layer 430 formed over the substrate is heated in an oxygen atmosphere. Next, the substrate on which the above heat treatment is performed is transferred, through a transfer chamber in an oxygen atmosphere or an inert gas atmosphere, to a second chamber whose temperature is higher than or equal to room temperature and lower than 100° C. and is subjected to cooling treatment in an oxygen atmosphere or an inert gas atmosphere. Through the above process, throughput can be improved.

The oxide semiconductor layer may be subjected to the heat treatment in the oxygen atmosphere before processed into the island-shaped oxide semiconductor layer. In that case, after the heat treatment of the oxide semiconductor layer in the oxygen atmosphere or in an inert gas atmosphere, slow cooling to a temperature higher than or equal to room temperature and lower than 100° C. is performed, the substrate is taken out of the heat apparatus, and a photolithography process is performed on the substrate.

The oxide semiconductor layer 431 after the heat treatment in the oxygen atmosphere is preferably in an amorphous state, but may be partly crystallized.

Next, a conductive layer is formed over the gate insulating layer 402 and the oxide semiconductor layer 431.

As examples of a material of the conductive layer, there are the following: an element selected from Al, Cr, Ta, Ti, Mo, and W; an alloy containing any of the above elements as its component; an alloy layer containing a combination of any of the above elements; and the like.

In the case where heat treatment is performed after the formation of the conductive layer, it is preferable that the conductive layer have heat resistance enough to withstand this heat treatment. Since aluminum (Al) has disadvantages such as low heat resistance and a tendency of easy-to-corrode, Al is used in combination with a heat-resistant conductive material. As the heat-resistant conductive material which is used in combination with Al, any of the following materials may be used: an element selected from titanium (Ti), tantalum (Ta), tungsten (W), molybdenum (Mo), chromium (Cr), neodymium (Nd), and scandium (Sc); an alloy containing any of the above elements as its component; an alloy layer containing a combination of any of the above elements; and a nitride containing any of the above elements as its component.

Figure 1C:
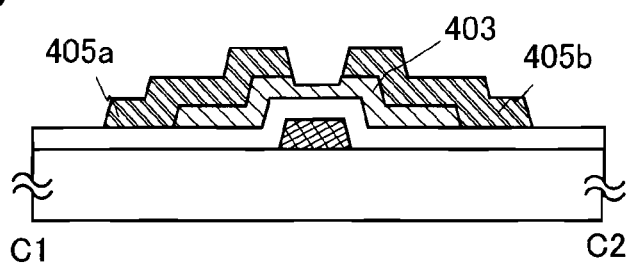

The oxide semiconductor layer 431 and the conductive layer are etched in an etching step to form the oxide semiconductor layer 403 and the source and drain electrode layers 405a and 405b (see FIG. 1C). Note that only part of the oxide semiconductor layer 431 is etched, so that the oxide semiconductor layer 403 has a groove (a depressed portion).

The oxide insulating layer 407 is formed so as to be in contact with the oxide semiconductor layer 403. The oxide insulating layer 407 can have a thickness greater than or equal to 1 nm and can be formed by a method by which impurities such as moisture or hydrogen do not enter the oxide insulating layer 407 as much as possible, such as a CVD method or a sputtering method. In this embodiment, a sputtering method is used to form the oxide insulating layer 407. It is preferable that the oxide insulating layer 407, which is formed to be in contact with the dehydrated or dehydrogenated oxide semiconductor layer, be formed using an inorganic insulating layer which includes moisture, a hydrogen ion, OH−, and the like as less as possible and blocks entry of them from the outside; specifically, a single layer of a silicon oxide layer or a silicon oxynitride layer, or a stacked layer thereof may be used.

A silicon oxide layer with a thickness of 300 nm is formed as the oxide insulating layer 407 in this embodiment. The substrate temperature at the time of film formation may be set to higher than or equal to room temperature and lower than or equal to 300° C., and is 100° C. in this embodiment. The formation of the oxide insulating layer 407 by the sputtering method can be performed in an atmosphere of the following: a rare gas (typically argon), oxygen, or a mixture of a rare gas (typically argon) and oxygen. A silicon oxide target or a silicon target may be used as a target thereof. For example, a silicon oxide film can be formed by a sputtering method using a silicon target in an atmosphere of oxygen and nitrogen.

Figure 1D:
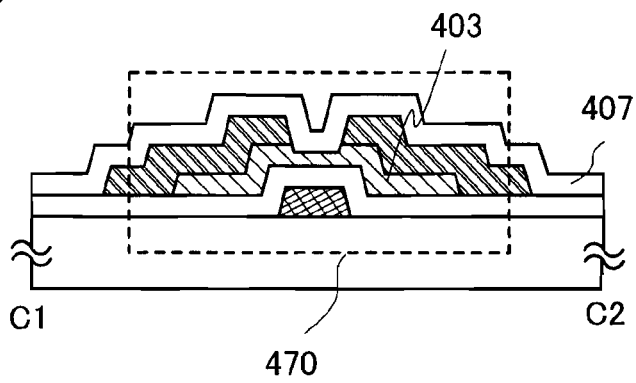

The oxide insulating layer 407 is formed by a sputtering method, a PCVD method, or the like so as to be in contact with the dehydrated or dehydrogenated oxide semiconductor layer 430; in this manner, the highly reliable thin film transistor 470 can be manufactured (see FIG. 1D).

It is preferable that after impurities such as $H_2O$, H, or OH included in the oxide semiconductor layer are reduced by the above heat treatment for dehydration or dehydrogenation in the oxygen atmosphere, slow cooling be performed. Further, the formation of the oxide insulating layer so as be in contact with the oxide semiconductor layer, and the like may be performed after the slow cooling; accordingly, the reliability of the thin film transistor 470 can be improved.

Further, after the oxide insulating layer 407 is formed, the thin film transistor 470 may be subjected to heat treatment (preferably at a temperature higher than or equal to 150° C. and lower than 350° C.) in an oxygen atmosphere or an inert atmosphere. For example, heat treatment is performed at 250° C. for 1 hour in a nitrogen atmosphere. By the heat treatment, the oxide semiconductor layer 403 is heated while being in contact with the oxide insulating layer 407; accordingly, variation in electric characteristics of the thin film transistor 470 can be reduced. There is no particular limitation on this heat treatment (preferably at the temperature higher than or equal to 150° C. and lower than 350° C.) as long as it is performed after the formation of the oxide insulating layer 407. The heat treatment can be performed without increase in the number of steps by serving also heat treatment in another step such as heat treatment in formation of a resin layer or heat treatment for reducing the resistance of a transparent conductive layer.

Embodiment 2

A semiconductor device and a method for manufacturing the semiconductor device will be described with reference to FIGS. 4A to 4D and FIGS. 5A and 5B. Embodiment 1 can be applied to the same portion(s), or a portion(s) or a step(s) having the similar function(s) as/to Embodiment 1, and the description thereof is not repeated.

Figure 5A:
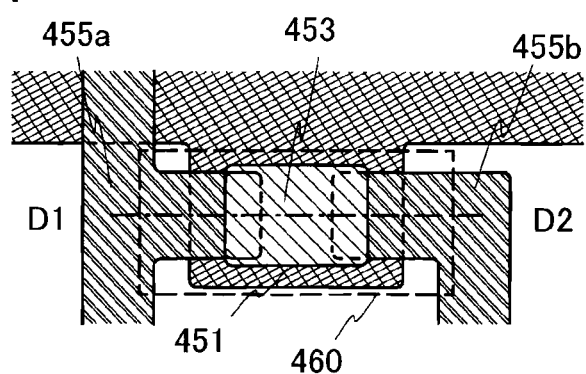
FIGS. 5A and 5B illustrate a semiconductor device according to one embodiment of the present invention.
Figure 5B:
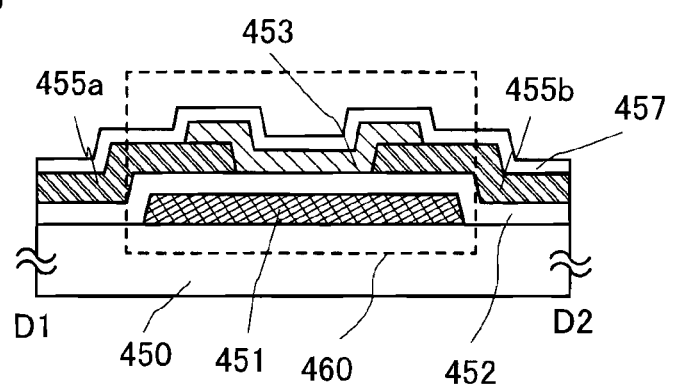
Figure 8:
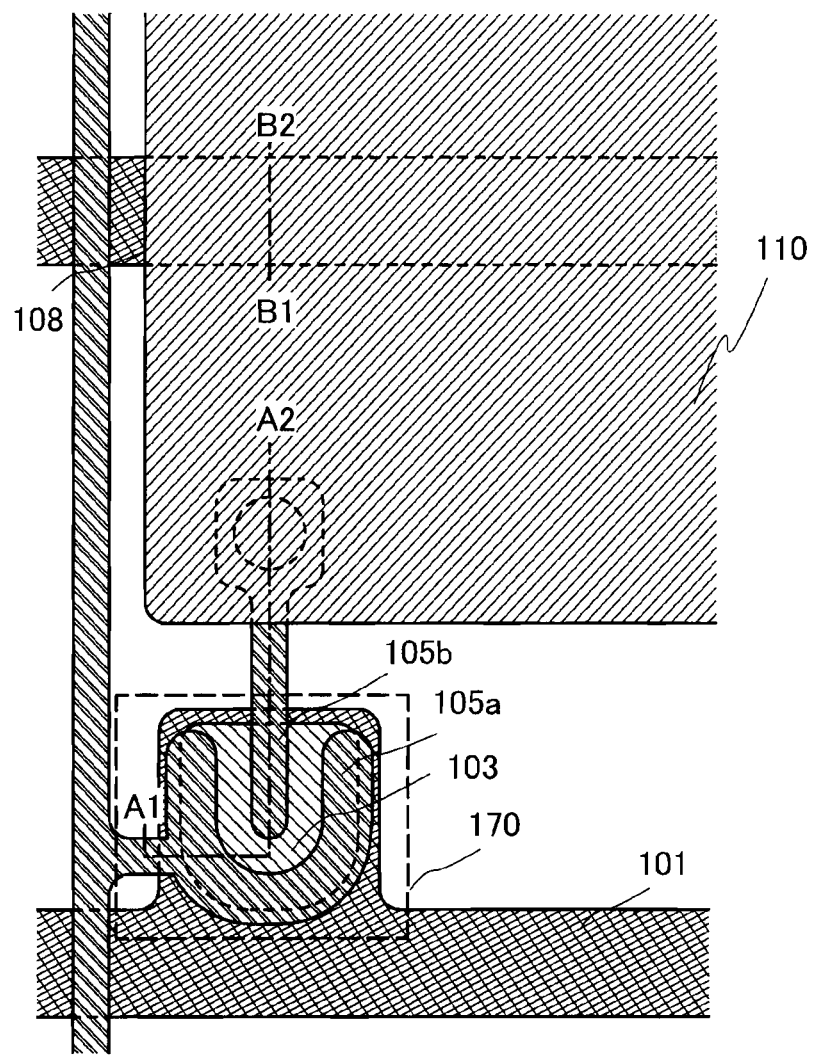
FIG. 8 illustrates a semiconductor device according to one embodiment of the present invention.

FIG. 5A is a plan view of a thin film transistor 460 included in a semiconductor device, and FIG. 5B is a cross-sectional diagram along line D1-D2 of FIG. 5A. The thin film transistor 460 is a bottom-gate thin film transistor and includes, over a substrate 450 which is a substrate having an insulating surface, a gate electrode layer 451, a gate insulating layer 452, a source and drain electrode layers 455a and 455b, and an oxide semiconductor layer 453. In addition, an oxide insulating layer 457 is provided to cover the thin film transistor 460 and be in contact with the oxide semiconductor layer 453.

In the thin film transistor 460, the gate insulating layer 452 exists throughout the region including the thin film transistor 460, and the gate electrode layer 451 is provided between the gate insulating layer 452 and the substrate 450 which is a substrate having an insulating surface. The source and drain electrode layers 455a and 455b are provided over the gate insulating layer 452. Further, the oxide semiconductor layer 453 is provided over the gate insulating layer 452 and the source and drain electrode layers 455a and 455b. Although not shown, a wiring layer is provided over the gate insulating layer 452 in addition to the source and drain electrode layers 455a and 455b, and the wiring layer extends beyond the peripheral portion of the oxide semiconductor layer 453.

The oxide semiconductor layer 453 is subjected to heat treatment which reduces impurities such as moisture or hydrogen (heat treatment for dehydration or dehydrogenation) in an oxygen atmosphere at least after the formation of the oxide semiconductor layer. Accordingly, the reliability of the thin film transistor can be improved.

After impurities such as moisture ($H_2O$) are eliminated by the heat treatment for dehydration or dehydrogenation, it is preferable that the oxide semiconductor layer be slowly cooled in the/an oxygen atmosphere or an inert gas atmosphere. It is preferable to perform the formation of the oxide insulating layer to be in contact with the oxide semiconductor layer, and the like after the heat treatment for dehydration or dehydrogenation and the slow cooling; accordingly, the reliability of the thin film transistor 460 can be improved.

Then, the source and drain electrode layers 455a and 455b which are in contact with the oxide semiconductor layer 453 can be formed in a similar manner to that of the source and drain electrode layers 405a and 405b described in Embodiment 1.

FIGS. 4A to 4D are cross-sectional diagrams illustrating a process for manufacturing the thin film transistor 460.

The gate electrode layer 451 is provided over the substrate 450 which is a substrate having an insulating surface. An insulating layer serving as a base layer may be provided between the substrate 450 and the gate electrode layer 451. The base layer has a function of preventing diffusion of an impurity element from the substrate 450, and can be formed to have a single-layer or stacked-layer structure using one or more of a silicon nitride layer, a silicon oxide layer, a silicon nitride oxide layer, and a silicon oxynitride layer. The gate electrode layer 451 can be formed in a similar manner to that of the gate electrode layer 401 described in Embodiment 1.

The gate insulating layer 452 is formed over the gate electrode layer 451.

The gate insulating layer 452 can be formed in a similar manner to that of the gate insulating layer 402 described in Embodiment 1.

Figure 4A:
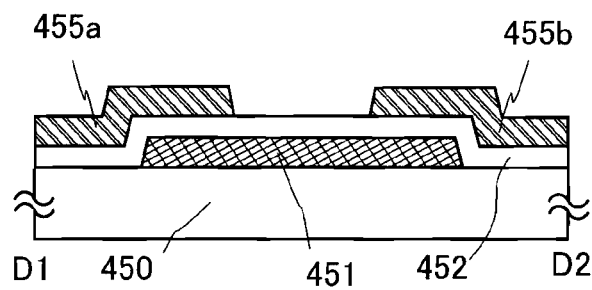
FIGS. 4A to 4D are cross-sectional diagrams of a manufacturing process of a semiconductor device according to one embodiment of the present invention.

A conductive layer is formed over the gate insulating layer 452 and processed into the island-shaped source and drain electrode layers 455a and 455b by a photolithography process (see FIG. 4A).

The source and drain electrode layers 455a and 455b can be formed in a similar manner to that of the source and drain electrode layers 405a and 405b described in Embodiment 1.

Figure 4B:
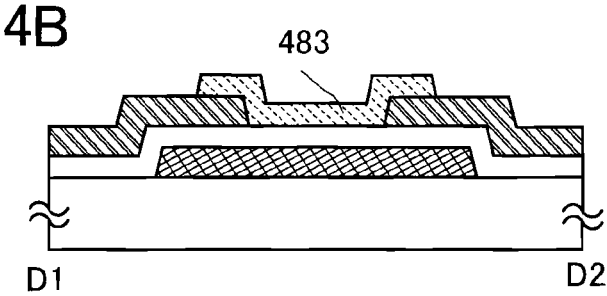
Figure 4C:
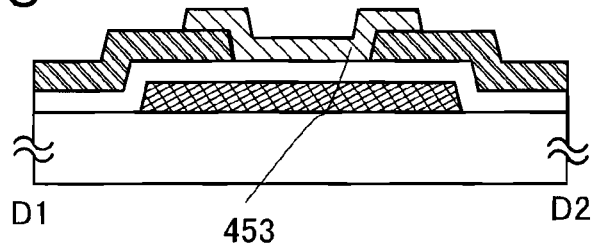
Figure 4D:
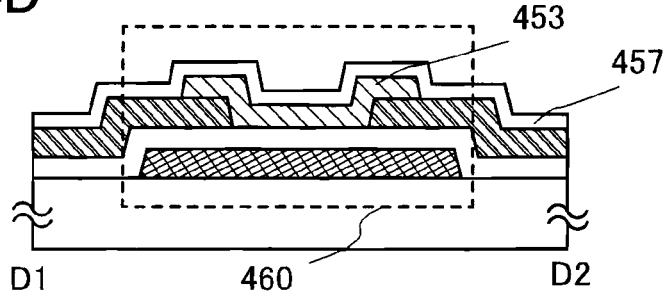

Next, an oxide semiconductor layer is formed over the gate insulating layer 452 and the source and drain electrode layers 455a and 455b, and processed into an island-shaped oxide semiconductor layer 483 (first oxide semiconductor layer) by a photolithography process (see FIG. 4B).

The oxide semiconductor layer 483 serves as a channel formation region and is thus formed in a manner similar to the oxide semiconductor layer described in Embodiment 1.

Before the oxide semiconductor layer 483 is formed by a sputtering method, it is preferable to perform reverse sputtering in which an argon gas is introduced and plasma is generated so that dust on a surface of the gate insulating layer 452 is removed.

After the heat treatment for dehydration or dehydrogenation is performed on the oxide semiconductor layer 483, it is preferable that the oxide semiconductor layer be slowly cooled in the/an oxygen atmosphere or an inert gas atmosphere. As the heat treatment for dehydration or dehydrogenation, heat treatment at a temperature higher than or equal to 200° C. and lower than the strain point of the substrate, preferably higher than or equal to 400° C. and lower than or equal to 700° C. is performed in an oxygen atmosphere. Through the above process, the dehydrated or dehydrogenated oxide semiconductor layer 483 (a second oxide semiconductor layer) can be formed (see FIG. 4C).

It is preferable that moisture, hydrogen, and the like be not included in the oxygen atmosphere in the heat treatment for dehydration or dehydrogenation. Alternatively, it is preferable that the purity of a gas containing an oxygen atom, nitrogen, or a rare gas such as helium, neon, or argon introduced into a heat treatment apparatus be 6N (99.9999%) or higher, more preferably 7N (99.99999%) or higher (that is, the concentration of impurities be 1 ppm or lower, more preferably 0.1 ppm or lower).

The oxide semiconductor layer may be subjected to the heat treatment in the oxygen atmosphere before processed into the island-shaped oxide semiconductor layer. In that case, after the heat treatment of the oxide semiconductor layer in the oxygen atmosphere, it is preferable to perform slow cooling to a temperature higher than or equal to room temperature and lower than 100° C. Then, the substrate is taken out of the heat apparatus, and a photolithography process is performed on the substrate.

The oxide semiconductor layer 453 after the heat treatment in the oxygen atmosphere is preferably in an amorphous state, but may be partly crystallized.

Next, an oxide insulating layer 457 is formed so as to be in contact with the oxide semiconductor layer 403 by a sputtering method or a PCVD method. In this embodiment, a silicon oxide layer with a thickness of 300 nm formed as the oxide insulating layer 457. The substrate temperature at the time of film formation may be set to higher than or equal to room temperature and lower than or equal to 300° C., and is 100° C. in this embodiment. The oxide insulating layer 457 which is the silicon oxide layer is formed so as to be in contact with the dehydrated or dehydrogenated oxide semiconductor layer 453. In the process for manufacturing a semiconductor device, heat treatment for dehydration or dehydrogenation in an oxygen atmosphere, slow cooling in the/an oxygen atmosphere or an inert gas atmosphere, the formation of the oxide insulating layer, and the like are performed; in this manner, the thin film transistor 460 can be manufactured (see FIG. 4D).

Further, after the oxide insulating layer 457 which is a silicon oxide layer is formed, the thin film transistor 460 may be subjected to heat treatment (preferably at a temperature higher than or equal to 150° C. and lower than 350° C.) in an oxygen atmosphere or an inert atmosphere. For example, heat treatment is performed at 250° C. for 1 hour in a nitrogen atmosphere. By the heat treatment, the oxide semiconductor layer 453 is heated while being in contact with the oxide insulating layer 457; accordingly, variation in electric characteristics of the thin film transistor 460 can be reduced. There is no particular limitation on this heat treatment (preferably at the temperature higher than or equal to 150° C. and lower than 350° C.) as long as it is performed after the formation of the oxide insulating layer 457. The heat treatment can be performed without increase in the number of steps by serving also heat treatment in another step such as heat treatment in formation of a resin layer or heat treatment for reducing the resistance of a transparent conductive layer.

Embodiment 2 can be combined with Embodiment 1 as appropriate.

Embodiment 3

A process for manufacturing a semiconductor device including a thin film transistor will be described with reference to FIGS. 6A to 6D, FIGS. 7A to 7C, 8, and 9A1, 9A2, 9B1, and 9B2.

In FIG. 6A, as a substrate 100 having light-transmitting property, the substrate 100 described in Embodiment 1 can be used as appropriate.

Next, a conductive layer is formed entirely over a surface of the substrate 100, and then a first photolithography process is performed to form a resist mask. Then, an unnecessary portion is removed by etching, so that wirings and electrodes (a gate wiring including a gate electrode layer 101, a capacitor wiring 108, and a first terminal 121) are formed. At this time, the etching is performed so that at least end portions of the gate electrode layer 101 are tapered.

The gate wiring including the gate electrode layer 101, the capacitor wiring 108, and the first terminal 121 in a terminal portion each can be formed using a material of the gate electrode layer 401 described in Embodiment 1. As a conductive material having heat resistance is used to form the gate electrode layer 101, any of the following is used: an element selected from titanium (Ti), tantalum (Ta), tungsten (W), molybdenum (Mo), chromium (Cr), neodymium (Nd), and scandium (Sc); an alloy layer containing any of these elements as its component; an alloy containing a combination of any of these elements; or nitride containing any of these elements as its component.

Next, a gate insulating layer 102 is formed over an entire surface of the gate electrode layer 101. The gate insulating layer 102 can be formed in a similar manner to that of the gate insulating layer 402 described in Embodiment 1. The thickness of the gate insulating layer 102 is 50 nm to 250 nm.

For example, as the gate insulating layer 402, a silicon oxide layer is formed to a thickness of 100 nm by a sputtering method.

Next, an oxide semiconductor layer (an In—Ga—Zn—O-based non-single-crystal layer) is formed over the gate insulating layer 102. It is effective to deposit the In—Ga—Zn—O based non-single-crystal layer without exposure to the air after the formation of the gate insulating layer 102 because dust and moisture are not attached to the interface between the gate insulating layer and the semiconductor layer. In this embodiment, the oxide semiconductor layer is formed in an atmosphere containing oxygen, argon, or a combination of oxygen and argon under the condition where a target is an oxide semiconductor target containing In, Ga, and Zn (In—Ga—Zn—O-based oxide semiconductor target ($In_2O_3$:$Ga_2O_3$:ZnO=1:1:1)) with a diameter of 8 inches, the distance between the substrate and the target is 170 mm, the pressure is 0.4 Pa, and the direct current (DC) power supply is 0.5 kW. It is preferable to use a pulsed direct-current (DC) power source with which dust can be reduced and thickness distribution can be evened. The In—Ga—Zn—O-based non-single-crystal layer is formed to have a thickness of 5 nm to 200 nm. As the oxide semiconductor layer, an In—Ga—Zn—O-based non-single-crystal film with the thickness of 50 nm is formed using the In—Ga—Zn—O-based oxide semiconductor target by a sputtering method.

Examples of the sputtering method include an RF sputtering method in which a high-frequency power source is used for a sputtering power source, a DC sputtering method using a DC power source, and a pulsed DC sputtering method in which a bias is applied in a pulsed manner using a DC power source. An RF sputtering method is mainly used in the case where an insulating layer is formed, and a DC sputtering method is mainly used in the case where a metal layer is formed.

A multi-source sputtering apparatus in which a plurality of targets of different materials can be set can be used. With the multi-source sputtering apparatus, layers of different materials can be deposited to be stacked in the same chamber, or a plurality of kinds of materials can be deposited by electric discharge at the same time in the same chamber.

A sputtering apparatus provided with a magnet system inside the chamber and used for a magnetron sputtering method, or a sputtering apparatus used for an ECR sputtering method in which plasma generated with the use of microwaves is used without using glow discharge can be used.

Further, as the deposition method using the sputtering method, there are also a reactive sputtering method in which a target substance and a sputtering gas component are chemically reacted with each other during deposition to form a thin compound layer thereof, and a bias sputtering method in which voltage is also applied to a substrate during deposition.

Next, a second photolithography process is performed to form a resist mask, and the oxide semiconductor layer is etched. For example, unnecessary portions thereof are removed by wet etching using a mixed solution of phosphoric acid, acetic acid, and nitric acid, so that an oxide semiconductor layer 133 is formed (see FIG. 6A). The etching here is not limited to wet etching; dry etching may be performed as well.

As an etching gas for the dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, any of the following can be used: a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; and the like.

As the dry etching method, a parallel plate RIE (reactive ion etching) method or an ICP (inductively coupled plasma) etching method can be used. In order to etch the layer into a desired shape, the etching condition (the amount of electric power applied to a coil-shaped electrode, the amount of electric power applied to an electrode on a substrate side, the temperature of the electrode on the substrate side, or the like) is adjusted as appropriate.

As an etchant used for the wet etching, a solution obtained by mixing phosphoric acid, acetic acid, and nitric acid or the like can be used. ITO07N (produced by KANTO CHEMICAL CO., INC.) may be used.

Furthermore, the etchant after the wet etching is removed together with the etched material by cleaning. The waste liquid including the etchant and the material etched off may be purified and the material may be reused. Collecting and reusing of a material such as indium included in the oxide semiconductor layer from the waste liquid after the etching enable efficient use of the resources and cost reduction.

The etching conditions (such as an etchant, etching period of time, and temperature) are adjusted as appropriate depending on the material so that the material can be etched into an appropriate shape.

Next, heat treatment for dehydration or dehydrogenation is performed on the oxide semiconductor layer 133. It is preferable that the oxide semiconductor layer 133 be slowly cooled in an oxygen atmosphere or an inert gas atmosphere after the heat treatment in the/an oxygen atmosphere.

The heat treatment is performed at a temperature higher than or equal to 200° C. and lower than the strain point of the substrate, preferably higher than or equal to 400° C. and lower than or equal to 700° C. For example, heat treatment at 450° C. for one hour in an oxygen atmosphere, so that an oxide semiconductor layer 134 is obtained (see FIG. 6B).

Next, a conductive layer 132 is formed using a metal material over the oxide semiconductor layer 134 by a sputtering method or a vacuum evaporation method (see FIG. 6C).

As a material of the conductive layer 132, the same material as the material of the source and drain electrode layers 405a and 405b described in Embodiment 1 can be used as appropriate.

In the case where heat treatment is performed after the formation of the conductive layer 132, it is preferable that the conductive layer have heat resistance high enough to resist this heat treatment.

Next, a third photolithography process is performed to form a resist mask and then an unnecessary portion thereof is removed by etching, so that a source and drain electrode layers 105a and 105b and a second terminal 122 are formed (see FIG. 6D). Wet etching or dry etching is employed as an etching method at this time. For example, when an aluminum layer or an aluminum-alloy layer is used as the conductive layer 132, wet etching using a mixed solution of phosphoric acid, acetic acid, and nitric acid can be performed. Alternatively, the conductive layer 132 may be wet-etched using an ammonia peroxide mixture (hydrogen peroxide:ammonia:water=5:2:2) to form the source and drain electrode layers 105a and 105b. In this etching step, an exposed region of the oxide semiconductor layer 134 is partly etched; consequently, an oxide semiconductor layer 103 is obtained. Therefore, a region of the oxide semiconductor layer 103 between the source and drain electrode layers 105a and 105b has a small thickness. In FIG. 6D, the etching for forming the source and drain electrode layers 105a and 105b and the oxide semiconductor layer 103 is performed at a time by dry etching; accordingly, an end portion of the source or drain electrode layer 105a and an end portion of the source or drain electrode layer 105b are aligned with end portions of the oxide semiconductor layer 103 to be continuous.

In this third photolithography step, the second terminal 122 which is formed of the same material as the source and drain electrode layers 105a and 105b is left in a terminal portion. The second terminal 122 is electrically connected to a source wiring (including the source and drain electrode layers 105a and 105b).

By use of a resist mask having regions with plural thicknesses (typically, two levels of thickness) which is formed using a multi-tone mask, the number of resist masks can be reduced, resulting in simplified process simplification and cost reduction.

Next, the resist mask is removed to form an oxide insulating layer 107 so as to cover the gate insulating layer 102, the oxide semiconductor layer 103, and the source and drain electrode layers 105a and 105b. A silicon oxynitride layer formed by a PCVD method is used as the oxide insulating layer 407. The substrate temperature at the time of the film formation of the oxide insulating layer 107 may be set to higher than or equal to room temperature and lower than or equal to 300° C., and is 100° C. in this embodiment. The silicon oxynitride layer which is the oxide insulating layer 107 is provided so as to be in contact with the exposed region of the oxide semiconductor layer 103 between the source and drain electrode layers 105a and 105b; accordingly, a highly reliable thin film transistor can be manufactured (see FIG. 7A).

Next, heat treatment may be performed after the oxide insulating layer 107 is formed. The heat treatment may be performed at a temperature higher than or equal to 150° C. and lower than 350° C. in an oxygen atmosphere or a nitrogen atmosphere. By the heat treatment, the oxide semiconductor layer 103 is heated while being in contact with the oxide insulating layer 107; accordingly, the electric characteristics of a thin film transistor can be improved and variation in the electric characteristics of the same can be reduced. There is no particular limitation on this heat treatment (preferably at the temperature higher than or equal to 150° C. and lower than 350° C.) as long as it is performed after the formation of the oxide insulating layer 407. The heat treatment can be performed without increase in the number of steps by serving also heat treatment in another step such as heat treatment in formation of a resin layer or heat treatment for reducing the resistance of a transparent conductive layer.

Through the above process, a thin film transistor 170 can be manufactured.

Next, a fourth photolithography step is performed to form a resist mask. The oxide insulating layer 107 and the gate insulating layer 102 are etched to form a contact hole 125 that reaches the source or drain electrode layer 105b. In addition, a contact hole 127 that reaches the second terminal 122 and a contact hole 126 that reaches the first terminal 121 are also formed in the same etching step. FIG. 7B is a cross-sectional diagram at this stage.

Next, the resist mask is removed, and a transparent conductive layer is formed. The transparent conductive layer is formed using indium oxide ($In_2O_3$), indium oxide-tin oxide alloy ($In_2O_3$—$SnO_2$, abbreviated as ITO), or the like by a sputtering method, a vacuum evaporation method, or the like. Such a material is etched with a hydrochloric acid-based solution. However, since a residue is easily generated particularly in etching ITO, indium oxide-zinc oxide alloy ($In_2O_3$—ZnO) may be used to improve etching processability. In the case where heat treatment for reducing resistance is performed on the transparent conductive layer, the heat treatment can also serve as thermal treatment for improving the electric characteristics of a thin film transistor and the variation in the electric characteristics of the same.

Next, a fifth photolithography step is performed to form a resist mask. Then, an unnecessary portion is removed by etching, so that a pixel electrode layer 110 is formed.

In this fifth photolithography process, a storage capacitor is formed with the capacitor wiring 108 and the pixel electrode layer 110, in which the gate insulating layer 102 and the oxide insulating layer 107 in the capacitor portion are used as a dielectric.

In addition, in this fifth photolithography step, the first terminal 121 and the second terminal 122 are covered with the resist mask, whereby transparent conductive layers 128 and 129 are left in the terminal portions. The transparent conductive layers 128 and 129 each serve as an electrode or a wiring that is used for connection with an FPC. The transparent conductive layer 128 formed over the first terminal 121 is a connection terminal electrode which functions as an input terminal of a gate wiring. The transparent conductive layer 129 formed over the second terminal 122 is a connection terminal electrode which functions as an input terminal of a source wiring.

Next, the resist mask is removed, and a cross-sectional diagram at this stage is FIG. 7C. A plane view at this stage corresponds to FIG. 8.

FIGS. 9A1 and 9A2 are respectively a cross-sectional diagram and a plan diagram of a gate wiring terminal portion at this stage. FIG. 9A1 is a cross-sectional diagram along line E1-E2 of FIG. 9A2. In FIG. 9A1, a transparent conductive layer 155 formed over an oxide insulating layer 154 is a connection terminal electrode which functions as an input terminal. Furthermore, in a terminal portion of FIG. 9A1, a first terminal 151 formed using the same material as the material of a gate wiring and a connection electrode layer 153 formed using the same material as the material of a source wiring overlap each other with a gate insulating layer 152 interposed therebetween, and are electrically connected to each other through the transparent conductive layer 155. Note that a portion where the transparent conductive layer 128 and the first terminal 121 are in contact with each other, illustrated in FIG. 7C corresponds to a portion where the transparent conductive layer 155 and the first terminal 151 are in contact with each other in FIG. 9A1.

FIGS. 9B1 and 9B2 are a cross-sectional diagram and a plan view of a source wiring terminal portion which is different from those of the gate wiring terminal portion illustrated in FIG. 7C, respectively. The cross-sectional diagram of FIG. 9B1 is taken along line F1-F2 of FIG. 9B2. In FIG. 9B1, a transparent conductive layer 155 formed over an oxide insulating layer 154 is a connection terminal electrode which functions as an input terminal. Further, in FIG. 9B1, in the terminal portion, an electrode layer 156 formed using the same material as the material of the gate wiring is located below and overlapped with a second terminal 150 which is electrically connected to a source wiring, with a gate insulating layer 102 interposed therebetween. The electrode layer 156 is not electrically connected to the second terminal 150, and a capacitor for preventing noise or static electricity can be formed if the potential of the electrode layer 156 is set to a potential different from that of the second terminal 150, such as floating, GND, or 0 V. The second terminal 150 is electrically connected to the transparent conductive layer 155 with the oxide insulating layer 154 therebetween.

A plurality of gate wirings, source wirings, and capacitor wirings are provided depending on the pixel density. Further, in the terminal portion, the first terminal at the same potential as the gate wiring, the second terminal at the same potential as the source wiring, the third terminal at the same potential as the capacitor wiring, and the like are arranged. The number of each of the terminals to be provided may be any number; the number of each terminal may be determined as appropriate.

Through these five photolithography steps, the storage capacitor and a pixel thin film transistor portion including the thin film transistor 170 of a bottom-gate staggered thin film transistor can be completed using the five photomasks. By disposing the thin film transistor and the storage capacitor in each pixel of a pixel portion in which pixels are arranged in matrix, one of substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. The fourth terminal is provided so that the common electrode is set to a fixed potential such as GND or 0 V.

Alternatively, a pixel electrode may be overlapped with a gate wiring of a pixel adjacent to the pixel with an oxide insulating layer and a gate insulating layer interposed therebetween, so that a storage capacitor without a capacitor wiring can be formed.

In an active matrix liquid crystal display device, pixel electrodes arranged in matrix are driven to display a display pattern on a screen. Specifically, voltage is applied between a selected pixel electrode and a counter electrode corresponding to the pixel electrode to perform optical modulation of a liquid crystal layer provided between the pixel electrode and the counter electrode, so that this optical modulation is recognized as a display pattern.

In displaying moving images, a liquid crystal display device has a problem in that a long response time of liquid crystal molecules causes afterimages or blurring of moving images. In order to improve the moving-image characteristics of a liquid crystal display device, there is a driving method called black insertion in which black is displayed on the whole screen every other frame period.

In addition, there is a driving method called double-frame rate driving in which the vertical synchronizing frequency is increased to 1.5 times or more, preferably twice or more to improve the moving-image characteristics.

Further, in order to improve the moving-image characteristics of a liquid crystal display device, there is a driving method in which a plurality of LEDs (light-emitting diodes) or a plurality of EL light sources are used to form a surface light source as a backlight, and each light source of the surface light source is independently driven to perform intermittent lighting in one frame period. As the surface light source, three or more kinds of LEDs may be used and/or an LED emitting white light may be used. Since a plurality of LEDs can be controlled independently, the light emission timing of LEDs can be synchronized with the timing of optical modulation of a liquid crystal layer. According to this driving method, LEDs can be partly turned off; therefore, an effect of reducing power consumption can be obtained particularly in the case of displaying an image having a large part on which black is displayed.

By using any of these driving methods, the display characteristics of a liquid crystal display device, such as moving-image characteristics, can be improved as compared to those of conventional liquid crystal display devices.

The n-channel transistor disclosed in this specification includes an oxide semiconductor layer which is used as a channel formation region and has excellent dynamic characteristics; thus, it can be combined with any of these driving methods.

In manufacturing a light-emitting display device, one electrode (also referred to as a cathode) of an organic light-emitting element is set to a low power supply potential such as GND or 0 V; thus, a terminal portion is provided with a fourth terminal for setting the cathode to a low power supply potential such as GND or 0 V. Also in manufacturing a light-emitting display device, a power supply line is provided in addition to a source wiring and a gate wiring. Accordingly, the terminal portion is provided with a fifth terminal electrically connected to the power supply line.

Further, in manufacturing a light-emitting display device, a partition may be provided using an organic resin layer between organic light-emitting elements. In that case, the organic resin layer is subjected to heat treatment; therefore, the heat treatment can also serves as heat treatment for improving electric characteristics of a thin film transistor and reducing variation in the electric characteristics of the same.

The use of an oxide semiconductor for a thin film transistor leads to reduction in manufacturing cost. In particular, the heat treatment for dehydration or dehydrogenation reduces impurities such as moisture and improve the purity of the oxide semiconductor layer. Therefore, a semiconductor device which includes highly reliable thin film transistors having better electric characteristics can be provided without using a special sputtering apparatus in which the dew point in the formation chamber is decreased or a high-purity oxide semiconductor target.

By the heat treatment of the oxide semiconductor layer in the oxygen atmosphere, electric characteristics of the thin film transistor can be stabilized and increase in off current thereof can be prevented. Accordingly, a semiconductor device including a highly reliable thin film transistor having better electric characteristics can be provided.

Embodiment 3 can be implemented in appropriate combination with any other embodiment described herein.

Embodiment 4

Described in Embodiment 4 is an example in which the manufacturing process is partly different from that in Embodiment 1. In Embodiment 4, an embodiment in which heat treatment for dehydration or dehydrogenation is performed after the formation of a source and drain electrode layers 405a and 405b is illustrated in FIGS. 10A to 10D. In FIGS. 10A to 10D, the same reference numerals as the reference numerals in FIGS. 1A to 1D denote the same portions as the portions in FIGS. 1A to 1D.

Figure 10A:
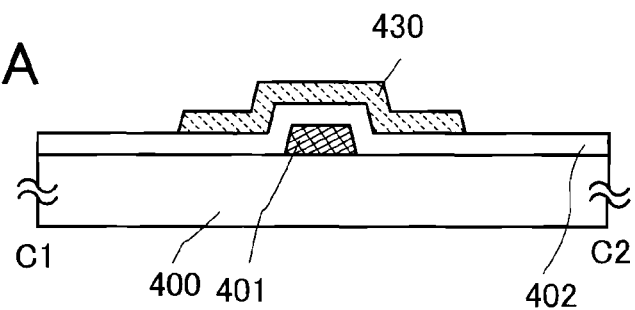
FIGS. 10A to 10D illustrate a manufacturing method of a semiconductor device according to one embodiment of the present invention.

Similarly to Embodiment 1, a gate electrode layer 401, a gate insulating layer 402, and an oxide semiconductor layer 430 are formed over a substrate 400 having an insulating surface (see FIG. 10A).

Figure 10B:
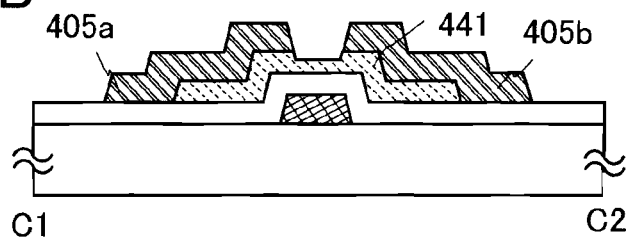
Figure 10C:
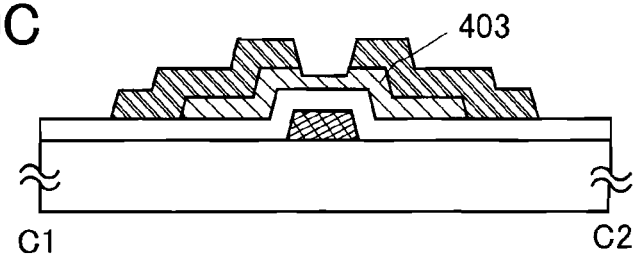
Figure 10D:
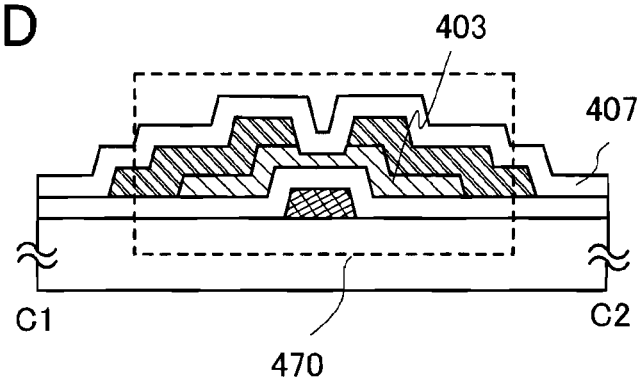

A source and drain electrode layers 405a and 405b are formed over the oxide semiconductor layer 430, and part of the oxide semiconductor layer 430 is etched, so that an oxide semiconductor layer 441 is formed (see FIG. 10B).

Next, it is preferable that heat treatment and slowly cooling be performed on the oxide semiconductor layer 441 and the source and drain electrode layers 405a and 405b in an oxygen atmosphere. This heat treatment performs dehydration or dehydrogenation treatment on the oxide semiconductor layer 441, so that an oxide semiconductor layer 403 is formed (see FIG. 10C). As a material of the source and drain electrode layers 405a and 405b, it is preferable to use a material which has heat resistance to this heat treatment, such as tungsten or molybdenum.

Next, an oxide insulating layer 407 is formed so as to be in contact with the oxide semiconductor layer 403 by a sputtering method or a PCVD method without exposure to the air after the heat treatment. The oxide insulating layer 407 is formed so as to be in contact with the dehydrated or dehydrogenated oxide semiconductor layer 403 by a sputtering method or a PCVD method. In this manner, a thin film transistor 470 can be manufactured (see FIG. 10D).

It is preferable that after impurities such as $H_2O$, H, or OH included in the oxide semiconductor layer are reduced by the above heat treatment for dehydration or dehydrogenation, slow cooling be performed. After that, the formation of the oxide insulating layer so as be in contact with the oxide semiconductor layer, and the like may be performed; accordingly, the reliability of the thin film transistor 470 can be improved.

Further, after the oxide insulating layer 407 is formed, the thin film transistor 470 may be subjected to heat treatment (preferably at a temperature higher than or equal to 150° C. and lower than 350° C.) in an oxygen atmosphere or a nitrogen atmosphere. For example, heat treatment is performed at 250° C. for 1 hour in a nitrogen atmosphere. By the heat treatment, the oxide semiconductor layer 403 is heated while being in contact with the oxide insulating layer 407; accordingly, variation in electric characteristics of the thin film transistor 470 can be reduced.

Embodiment 4 can be combined with Embodiment 1 as appropriate.

Embodiment 5

A semiconductor device and a method for manufacturing the semiconductor device will be described with reference to FIG. 11. Embodiment 1 can be applied to the same portion(s), or a portion(s) or a step(s) having the similar function(s) as/to Embodiment 1, and the description thereof is not repeated.

Figure 11:
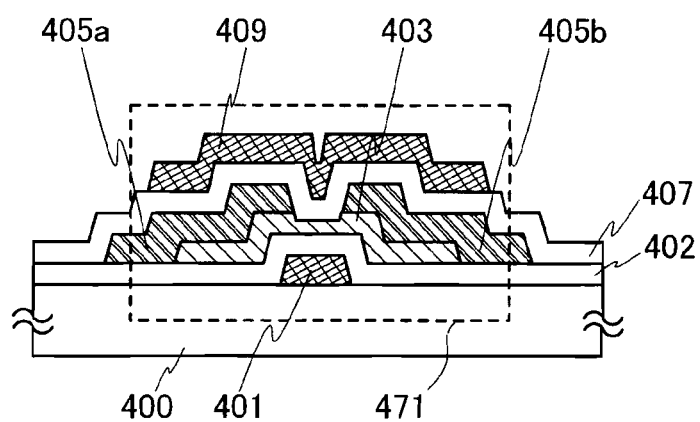
FIG. 11 illustrates a semiconductor device according to one embodiment of the present invention.

A thin film transistor 471 shown in FIG. 11 is an example in which a conductive layer 409 is provided so as to overlap a gate electrode layer 401 and a channel region of an oxide semiconductor layer 403 with an oxide insulating layer 407 interposed therebetween.

FIG. 11 is a cross-sectional diagram of the thin film transistor 471 included in a semiconductor device. The thin film transistor 471 is a bottom-gate thin film transistor and includes, over a substrate 400 which is a substrate having an insulating surface, the gate electrode layer 401, a gate insulating layer 402, the oxide semiconductor layer 403, a source and drain electrode layers 405a and 405b, the oxide insulating layer 407, and the conductive layer 409. The conductive layer 409 is provided over the oxide insulating layer 407 so as to overlap the gate electrode layer 401.

The conductive layer 409 can be formed using the same material and/or method as that/those of the gate electrode layer 401 or the source and drain electrode layers 405a and 405b. In the case where a pixel electrode layer is provided, the conductive layer 409 may be formed using the same material and/or method as that/those of the pixel electrode layer. In this embodiment, a stacked layer of a titanium layer, an aluminum layer, and a titanium layer is used as the conductive layer 409.

The potential of the conductive layer 409 may be the same as or different from that of the gate electrode layer 401, and the conductive layer 409 can be serves as a gate electrode layer. The conductive layer 409 may be in the floating state.

In addition, by providing the conductive layer 409 so as to overlap the oxide semiconductor layer 403, in a bias-temperature stress test (hereinafter, referred to as a BT test) for examining the reliability of a thin film transistor, the threshold voltage of the thin film transistor 471 before and after the BT test can be controlled. In particular, the amount of change of the threshold voltage can be reduced in a −BT test under the following condition: the substrate temperature is set to 150° C. and the voltage to be applied to the gate is set to −20 V.

Embodiment 5 can be combined with Embodiment 1 as appropriate.

Embodiment 6

A semiconductor device and a method for manufacturing the semiconductor device will be described with reference to FIG. 12. Embodiment 1 can be applied to the same portion(s), or a portion(s) or a step(s) having the similar function(s) as/to Embodiment 1, and the description thereof is not repeated.

Figure 12:
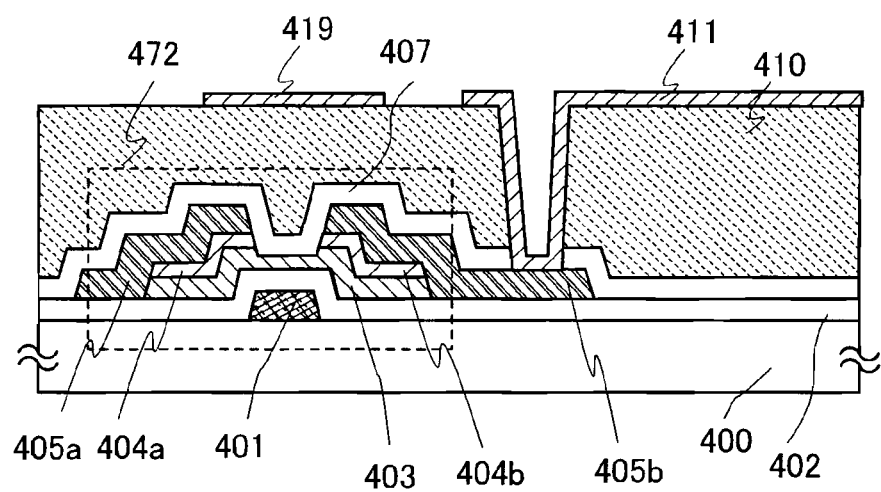
FIG. 12 illustrates a semiconductor device according to one embodiment of the present invention.

A thin film transistor 472 shown in FIG. 12 is an example in which a conductive layer 419 is provided so as to overlap a gate electrode layer 401 and a channel region of an oxide semiconductor layer 403 with an oxide insulating layer 407 and an insulating layer 410 interposed therebetween.

FIG. 12 is a cross-sectional diagram of the thin film transistor 472 included in a semiconductor device. The thin film transistor 472 is a bottom-gate thin film transistor and includes, over a substrate 400 which is a substrate having an insulating surface, the gate electrode layer 401, a gate insulating layer 402, the oxide semiconductor layer 403, source and drain regions 404a and 404b, a source and drain electrode layers 405a and 405b, the oxide insulating layer 407, the insulating layer 410, and the conductive layer 419. The conductive layer 409 is provided over the oxide insulating layer 407 and the insulating layer 410 so as to overlap the gate electrode layer 401.

In this embodiment, similarly to Embodiment 1, the oxide semiconductor layer is formed over the gate insulating layer 402. The source and drain regions 404a and 404b are formed over the oxide semiconductor layer. It is preferable that before or after the formation of the source and drain regions 404a and 404b, heat treatment is performed in an oxygen atmosphere and then slow cooling be performed in the/an oxygen atmosphere or an inert gas atmosphere.

In this embodiment, the source and drain regions 404a and 404b are each formed using a Zn—O-based polycrystalline layer or a Zn-based microcrystalline layer and are formed under a film formation condition which is different from that of the oxide semiconductor layer 403 and each have lower resistance. Further, in this embodiment, the source and the drain regions 404a and 404b are in a polycrystalline state or a microcrystalline state, and the oxide semiconductor layer 403 is also in a polycrystalline state or a microcrystalline state. The oxide semiconductor layer 403 may be crystallized with heat treatment to be in a polycrystalline state or a microcrystalline state.

In this embodiment, the insulating layer 410 which serves as a planarization layer is stacked over the oxide insulating layer 407, and an opening which reaches the source or drain electrode layer 405b is formed in the oxide insulating layer 407 and the insulating layer 410. A conductive layer is formed so as to cover the opening formed in the oxide insulating layer 407 and the insulating layer 410 and is etched into a predetermined shape, so that a conductive layer 419 and a pixel electrode layer 411 are formed. In this manner, in the step for forming the pixel electrode layer 411, the conductive layer 419 can be formed using the same material and method as respective those of the pixel electrode layer 411. In this embodiment, indium oxide-tin oxide alloy containing silicon oxide (In—Sn—O-based oxide containing silicon oxide) is used to form the pixel electrode layer 411 and the conductive layer 419.

The conductive layer 419 can be formed using the same material and/or method as that/those of the gate electrode layer 401 or the source and drain electrode layers 405a and 405b.

The potential of the conductive layer 419 may be the same as or different from that of the gate electrode layer 401. The conductive layer 419 can be serves as a second gate electrode layer. The conductive layer 419 may be in the floating state.

In addition, by providing the conductive layer 419 so as to overlap the oxide semiconductor layer 403, the threshold voltage of the thin film transistor can be controlled.

Embodiment 6 can be combined with Embodiment 1 as appropriate.

Embodiment 7

In Embodiment 7, an example of a channel-stop thin film transistor 1430 will be described using FIGS. 13A to 13C. FIG. 13C is an example of a top view of a thin film transistor, cross-sectional view along dotted line Z1-Z2 of which corresponds to FIG. 13B. Described in Embodiment 7 is an example in which gallium is not contained in an oxide semiconductor layer of the thin film transistor 1430.

In FIG. 13A, a gate electrode layer 1401 is provided over a substrate 1400. Next, a gate insulating layer 1402 is formed over the gate electrode layer 1401, and an oxide semiconductor layer is formed over the gate insulating layer 1402.

In this embodiment, the oxide semiconductor layer is formed using a Sn—Zn—O-based oxide semiconductor by a sputtering method. Gallium is not used for the oxide semiconductor layer, so that an expensive target is not used, which leads to cost reduction.

After the film deposition of the oxide semiconductor layer or after the patterning of the oxide semiconductor layer, it is preferable that heat treatment be performed for dehydration or dehydrogenation in an oxygen atmosphere and then slow cooling be performed in the/an oxygen atmosphere or an inert gas atmosphere. As the heat treatment for dehydration or dehydrogenation, heat treatment at a temperature higher than or equal to 200° C. and lower than the strain point of the substrate, preferably higher than or equal to 400° C. and lower than or equal to 700° C. is performed. The heat treatment in an oxygen atmosphere is performed on the oxide semiconductor layer, thereby forming an oxide semiconductor layer 1403 (see FIG. 13A). In this embodiment, the oxide semiconductor layer 1403 is in a microcrystalline state or in a polycrystalline state.

Next, a channel protection layer 1418 is provided on and in contact with the oxide semiconductor layer 1403. The channel protection layer 1418 can prevent damage (such as reduction in film thickness due to plasma or an etchant in etching) in a step of forming a source and drain regions 1406a and 1406b performed later. Therefore, the reliability of the thin film transistor 1430 can be improved.

The channel protection layer 1418 may be formed successively after the dehydration or dehydrogenation without exposure to the air; in that case, each interface between stacked layers, which is not contaminated by atmospheric components or impurity elements floating in the air, such as moisture, hydrocarbon, or the like, can be obtained, so that variation in characteristics of the thin film transistor can be reduced.

The channel protection layer 1418 which is an oxide insulating layer is formed by a sputtering method, a PCVD method, or the like so as to be in contact with the dehydrated or dehydrogenated oxide semiconductor layer 1403, so that the thin film transistor including the dehydrated or dehydrogenated oxide semiconductor layer 1403 as a channel formation region can be manufactured.

The channel protection layer 1418 can be formed using an inorganic material containing oxygen (e.g., silicon oxide, silicon oxynitride, or silicon nitride oxide). As a manufacturing method thereof, a vapor phase growth method such as a plasma CVD method or a thermal CVD method, or sputtering can be used. The channel protection layer 1418 is subjected to etching to be processed into a predetermined shape. In this embodiment, the channel protection layer 1418 is formed in such a manner that a silicon oxide layer is formed by a sputtering method and processed by etching using a mask formed by photolithography.

Next, a source and drain regions 1406a and 1406b are formed over the channel protection layer 1418 and the oxide semiconductor layer 1403. In this embodiment, the source and drain regions 1406a and 1406b are formed using a Zn—O-based microcrystalline layer or a Zn—O-based polycrystalline layer, which is formed under deposition conditions different from the deposition conditions of the oxide semiconductor layer 1403, and are oxide semiconductor layers having lower resistance. Alternatively, the source and drain regions 1406a and 1406b may be formed using an Al—Zn—O-based non-single-crystal layer containing nitrogen, that is, an Al—Zn—O—N-based non-single-crystal layer (also called an AZON layer).

Next, a source electrode layer 1405a and a drain electrode layer 1405b are formed over the source region 1406a and the drain region 1406b, respectively. In this manner, the thin film transistor 1430 is manufactured (see FIG. 13B). The source electrode layer 1405a and the drain electrode layer 1405b can be formed in a similar manner to the manner of the source region 1406a and the drain region 1406b.

By providing the source and drain regions 1406a and 1406b between the oxide semiconductor layer 1403 and the source and drain electrode layers 1405a and 1405b, a good contact can be made between the oxide semiconductor layer 1403 and the source and drain electrode layers 1405a and 1405b, resulting in higher thermal stability than in Schottky junction. Moreover, the resistance of the source and drain regions 1406a and 1406b is reduced, so that high mobility can be maintained even with a high drain voltage.

The source and drain regions 1406a and 1406b are not necessarily provided.

Further, after the channel protection layer 1418 is formed, the thin film transistor 1430 is subjected to heat treatment (preferably at a temperature higher than or equal to 150° C. and lower than 350° C.) in an oxygen atmosphere or an inert atmosphere. For example, heat treatment is performed at 250° C. for 1 hour in a nitrogen atmosphere. By the heat treatment, the oxide semiconductor layer 1403 is heated while being in contact with the channel protection layer 1418; accordingly, variation in electric characteristics of the thin film transistor 1470 can be reduced. There is no particular limitation on this heat treatment (preferably at the temperature higher than or equal to 150° C. and lower than 350° C.) as long as it is performed after the formation of the channel protection layer 1418. The heat treatment can be performed without increase in the number of steps by serving also heat treatment in another step such as heat treatment in formation of a resin layer or heat treatment for reducing the resistance of a transparent conductive layer.

Embodiment 7 can be implemented in appropriate combination with any other embodiment described herein.

Embodiment 8

A semiconductor device and a method for manufacturing the semiconductor device will be described with reference to FIGS. 14A and 14B. Embodiment 7 can be applied to the same portion(s), or a portion(s) or a step(s) having the similar function(s) as/to Embodiment 7, and the description thereof is not repeated.

Figure 14A:
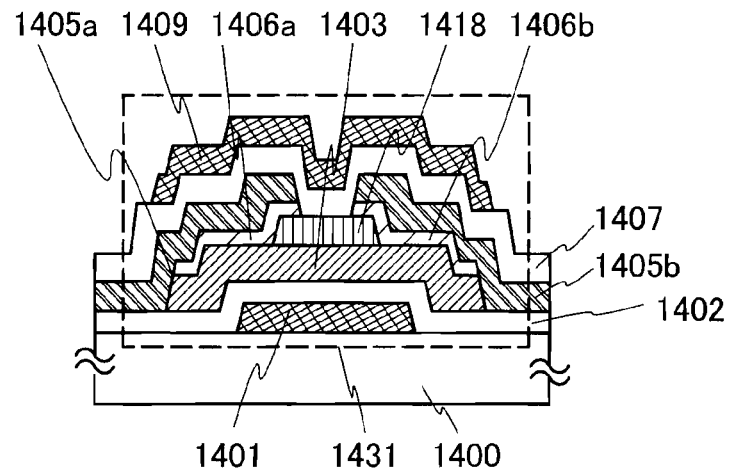
FIGS. 14A and 14B each illustrate a semiconductor device according to one embodiment of the present invention.

A thin film transistor 1431 shown in FIG. 14A is an example in which a conductive layer 1419 is provided so as to overlap a gate electrode layer 1401 and a channel region of an oxide semiconductor layer 1403 with a channel protection layer 1418 and an insulating layer 1407 interposed therebetween.

FIG. 14A is a cross-sectional diagram of the thin film transistor 1431 included in a semiconductor device. The thin film transistor 1431 is a bottom-gate thin film transistor and includes, over a substrate 1400 which is a substrate having an insulating surface, the gate electrode layer 1401, a gate insulating layer 1402, the oxide semiconductor layer 1403, a source and drain regions 1406a and 1406b, a source and drain electrode layers 1405a and 1405b, the insulating layer 1407, and the conductive layer 1419. The conductive layer 1409 is provided over the insulating layer 1407 so as to overlap the gate electrode layer 401.

In this embodiment, similarly to Embodiment 1, the oxide semiconductor layer is formed over the gate insulating layer 1402. The source and drain regions 1406a and 1406b are formed over the oxide semiconductor layer. It is preferable that before or after the formation of the source and drain regions 1406a and 1406b, heat treatment is performed in an oxygen atmosphere and then slow cooling be performed in the/an oxygen atmosphere or an inert gas atmosphere.

In this embodiment, the source and drain regions 1406a and 1406b formed over the oxide semiconductor layer 1403 are each formed using a Zn—O-based microcrystalline layer or a Zn—O-based polycrystalline layer and are formed under a film formation condition which is different from that of the oxide semiconductor layer 1403 and each have lower resistance. The oxide semiconductor layer 1403 is in an amorphous state.

The conductive layer 1409 can be formed using the same material and/or method as that/those of the gate electrode layer 1401 or the source and drain electrode layers 1405a and 1405b. In the case where a pixel electrode layer is provided, the conductive layer 1409 may be formed using the same material and/or method as that/those of the pixel electrode layer. In this embodiment, a stacked layer of a titanium layer, an aluminum layer, and a titanium layer is used as the conductive layer 1409.

The potential of the conductive layer 1409 may be the same as or different from that of the gate electrode layer 1401, and the conductive layer 1409 can be serves as a gate electrode layer. The conductive layer 1409 may be in the floating state.

In addition, by providing the conductive layer 1409 so as to overlap the oxide semiconductor layer 1403, in a bias-temperature stress test (hereinafter, referred to as a BT test) for examining the reliability of a thin film transistor, the threshold voltage of the thin film transistor 1431 before and after the BT test can be controlled.

Figure 14B:
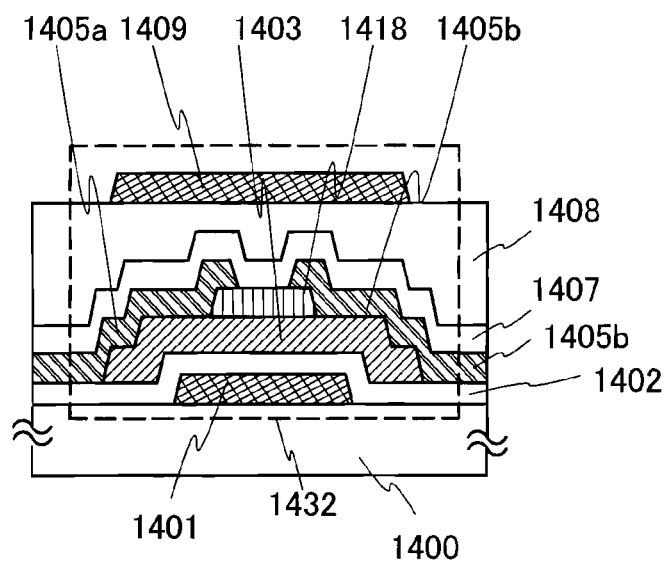

FIG. 14B illustrates an example which is partly different from FIG. 14A. The description of FIG. 14A can be applied to the same portion(s), or a portion(s) or a step(s) having the similar function(s) as/to FIG. 14A, and the description thereof is not repeated.

A thin film transistor 1432 shown in FIG. 14B is an example in which a conductive layer 1409 is provided so as to overlap a gate electrode layer 1401 and a channel region of an oxide semiconductor layer 1403 with a channel protection layer 1418 and an insulating layer 1408 interposed therebetween.

In this embodiment, similarly to Embodiment 1, the oxide semiconductor layer is formed over the gate insulating layer 1402. It is preferable that before or after the formation of the oxide semiconductor layer, heat treatment for dehydration or dehydrogenation is performed in an oxygen atmosphere and then slow cooling be performed in the/an oxygen atmosphere or an inert gas atmosphere.

In FIG. 14B, the insulating layer 1408 is stacked over the insulating layer 1407 which serves as a planarization layer.

In FIG. 14B, a source and drain regions are not provided, and the oxide semiconductor layer 1403 is directly in contact with the source and drain electrode layers 1405a and 1405b.

Also in FIG. 14B, by providing the conductive layer 1409 so as to overlap the oxide semiconductor layer 1403, in a BT test for examining the reliability of a thin film transistor, the threshold voltage of the thin film transistor 1431 before and after the BT test can be controlled.

Embodiment 8 can be implemented in appropriate combination with any other embodiment described herein.

Embodiment 9

In Embodiment 9, an example in which the structure is partly different from that described in Embodiment 1 will be described with reference to FIG. 15. Embodiment 1 can be applied to the same portion(s), or a portion(s) or a step(s) having the similar function(s) as/to Embodiment 1, and the description thereof is not repeated.

In this embodiment, it is preferable that heat treatment for dehydration or dehydrogenation be performed in an oxygen atmosphere after a first oxide semiconductor layer is patterned and then slow cooling be performed in the/an oxygen atmosphere or an inert gas atmosphere. The heat treatment performed on the first oxide semiconductor layer in the above atmosphere can eliminate impurities such as hydrogen and moisture existing in an oxide semiconductor layer 430.

Next, a second oxide semiconductor layer which serves as a source and drain regions of a thin film transistor is formed over the first oxide semiconductor layer, and then a conducive layer is formed.

Next, the first oxide semiconductor layer, the second oxide semiconductor layer, and the conductive layer are etched in an etching step to form the oxide semiconductor layer 403, a source and drain regions 404a and 404b, and a source and drain electrode layers 405a and 405b. Note that only part of the oxide semiconductor layer 403 is etched, so that the oxide semiconductor layer 403 has a groove (a depressed portion).

Next, a silicon oxide layer is formed as an oxide insulating layer 407 so as to be in contact with the oxide semiconductor layer 403 by a sputtering method or a PCVD method. As the oxide insulating layer 407, which is formed to be in contact with the dehydrated or dehydrogenated oxide semiconductor layer, is formed using an inorganic insulating layer which includes moisture, a hydrogen ion, OH−, and the like as less as possible and blocks entry of them from the outside; specifically, a silicon oxide layer or a silicon nitride oxide layer is used. A silicon nitride layer maybe stacked on the oxide insulating layer.

Figure 15:
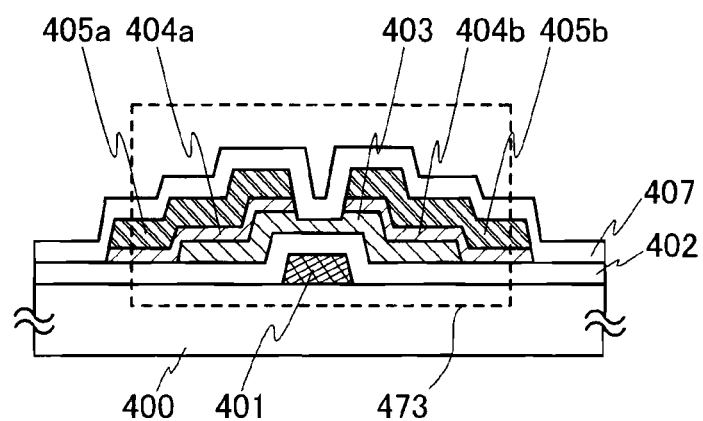
FIG. 15 illustrates a semiconductor device according to one embodiment of the present invention.

The oxide insulating layer 407 is formed by a sputtering method, a PCVD method, or the like so as to be in contact with the dehydrated or dehydrogenated oxide semiconductor layer 1403, so that a thin film transistor 473 including the dehydrated or dehydrogenated oxide semiconductor layer 403 as a channel formation region can be manufactured (see FIG. 15).

In this structure shown in FIG. 15, the source and drain regions 404a and 404b are formed using any of the following; an In—Ga—Zn—O-based non-single-crystal layer; an Al—Zn—O-based non-single-crystal layer; or an Al—Zn—O-based non-single-crystal layer containing nitrogen, that is, an Al—Zn—O—N-based non-single-crystal layer.

The source region is provided between the oxide semiconductor layer 403 and the source electrode layer and the drain region is provided between the oxide semiconductor layer 403 and the drain electrode layer.

It is preferable that the second oxide semiconductor layer used as the source and drain regions 404 and 404b of the thin film transistor 473 be preferably thinner than the first oxide semiconductor layer used as the first oxide semiconductor layer used as a channel formation region and have higher conductivity (electrical conductivity) than the first oxide semiconductor layer.

Further, the first oxide semiconductor layer used as the channel formation region may have an amorphous structure and the second oxide semiconductor layer used as the source and drain regions may include a crystal grain (nanocrystal) in an amorphous structure. The crystal grain (nanocrystal) in the second oxide semiconductor layer used as the source and drain regions has a diameter of 1 nm to 10 nm, typically about 2 nm to 4 nm.

Further, after the oxide insulating layer 407 is formed, the thin film transistor 473 may be subjected to heat treatment (preferably at a temperature higher than or equal to 150° C. and lower than 350° C.) in an oxygen atmosphere or a nitrogen atmosphere. For example, heat treatment is performed at 250° C. for 1 hour in a nitrogen atmosphere. By the heat treatment, the oxide semiconductor layer 403 is heated while being in contact with the oxide insulating layer 407; accordingly, variation in electric characteristics of the thin film transistor 473 can be reduced.

Embodiment 9 can be implemented in appropriate combination with any other embodiment described herein.

Embodiment 10

In Embodiment 10, an example will be described in which at least a part of a driver circuit and a thin film transistor disposed in a pixel portion are formed over one substrate.

The thin film transistor disposed in the pixel portion is formed in accordance with any of Embodiments 1 to 9. Further, the thin film transistor described in any of Embodiments 1 to 9 is an n-channel TFT, and thus part of a driver circuit that can include an n-channel TFT among driver circuits is formed over the same substrate as that of the thin film transistor in the pixel portion.

Figure 16A:
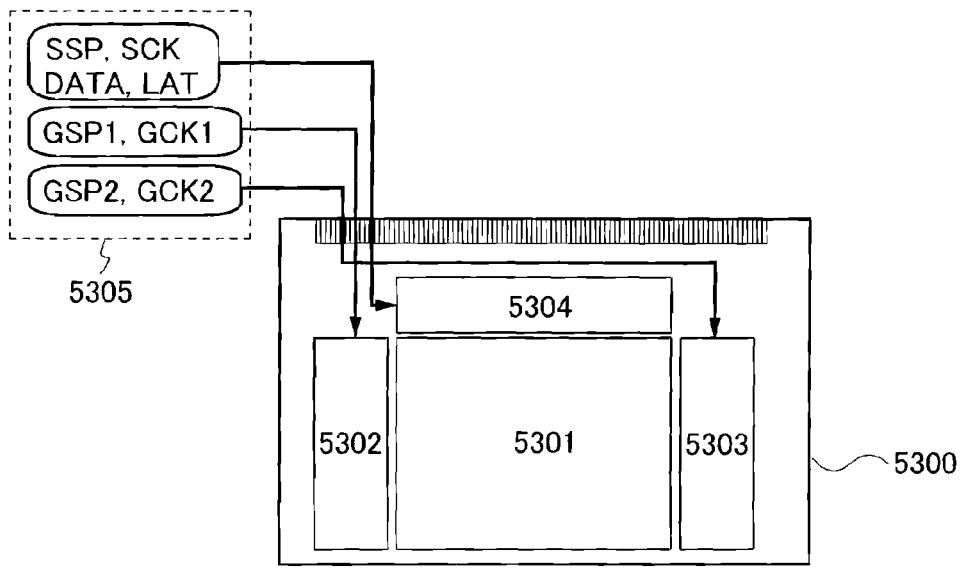
FIGS. 16A and 16B each illustrate a block diagram of a display device.

FIG. 16A illustrates an example of a block diagram of an active matrix display device. Over a substrate 5300 of the display device, a pixel portion 5301, a first scan line driver circuit 5302, a second scan line driver circuit 5303, and a signal line driver circuit 5304 are provided. In the pixel portion 5301, a plurality of signal lines are provided by being extended from the signal line driver circuit 5304, and a plurality of scan lines are provided by being extended from the first scan line driver circuit 5302 and the second scan line driver circuit 5303. Pixels each including a display element are arranged in matrix at intersections of the scan lines and the signal lines. The substrate 5300 of the display device is connected to a timing control circuit 5305 (also called a controller or a control IC) with a connection portion such as a flexible printed circuit (FPC).

In FIG. 16A, the first scan line driver circuit 5302, the second scan line driver circuit 5303, and the signal line driver circuit 5304 are formed over the same substrate 5300 as the pixel portion 5301. Therefore, the number of components of a driver circuit and the like which are provided externally is decreased, which leads to cost reduction. Further, the number of wirings in the connection portion due to extension of wirings is decreased as compared to the case where a driver circuit is provided for the outside of the substrate 5300, which leads to improvement of the reliability or improvement of the yield.

As an example, the timing control circuit 5305 supplies a first scan line driver circuit start signal (GSP1) and a first scan line driver circuit clock signal (GCLK1) to the first scan line driver circuit 5302. Further, as an example, the timing control circuit 5305 supplies a second scan line driver circuit start signal (GSP2) (also called a start pulse) and a second scan line driver circuit clock signal (GCLK2) to the second scan line driver circuit 5303. Further, as an example, the timing control circuit 5305 supplies a signal line driver circuit start signal (SSP), a signal line driver circuit clock signal (SCLK), video signal data (DATA) (also simply called a video signal) and a latch signal (LAT) to the signal line driver circuit 5304. The clock signals may be a plurality of clock signals whose periods are deviated from each other or may be supplied together with an inverted clock signal (CKB). One of the first scan line driver circuit 5302 and the second scan line driver circuit 5303 can be omitted.

Figure 16B:
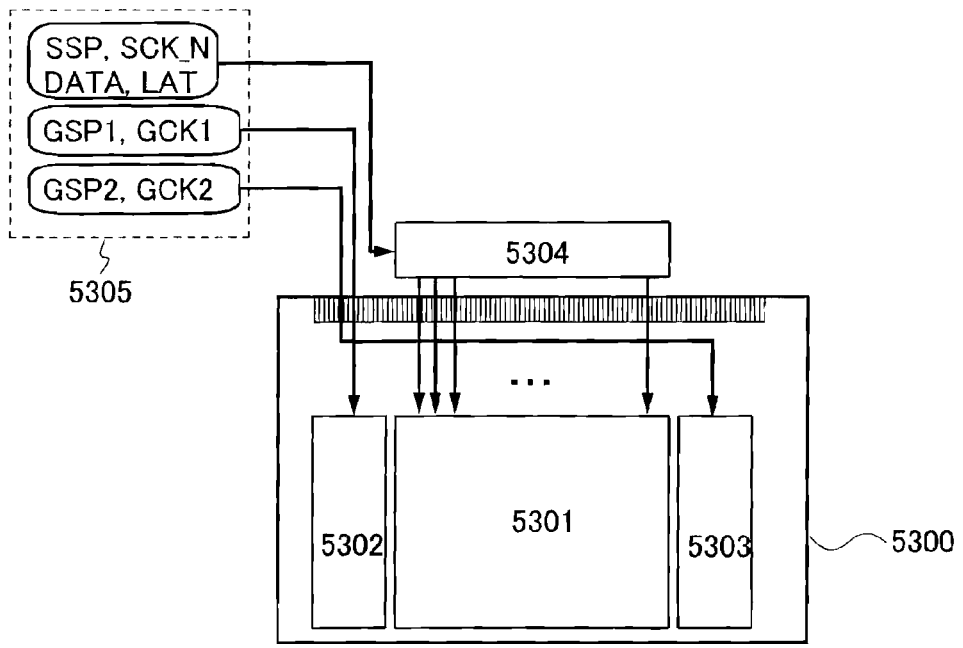

FIG. 16B shows a structure in which circuits with low driving frequency (e.g., the first scan line driver circuit 5302 and the second scan line driver circuit 5303) are formed over the same substrate 5300 as the pixel portion 5301 and the signal line driver circuit 5304 is formed over a substrate which is different from that of the pixel portion 5301. With this structure, a driver circuit formed over the substrate 5300 can be formed using a thin film transistor with lower field-effect mobility as compared to that of a transistor formed using a single crystal semiconductor. Accordingly, increase in the size of the display device, reduction in the number of steps, reduction in cost, improvement in yield, or the like can be achieved.

Figure 17A:
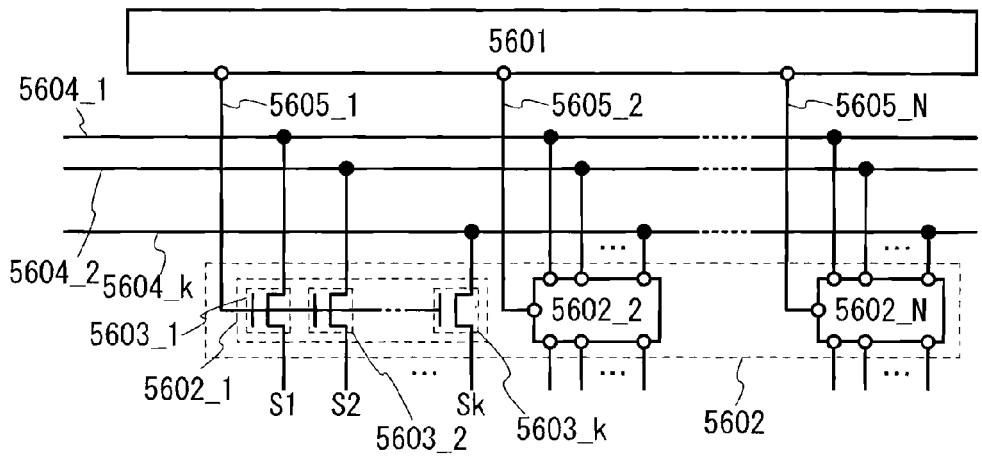
FIGS. 17A and 17B illustrate a structure of a signal line driver circuit.
Figure 17B:
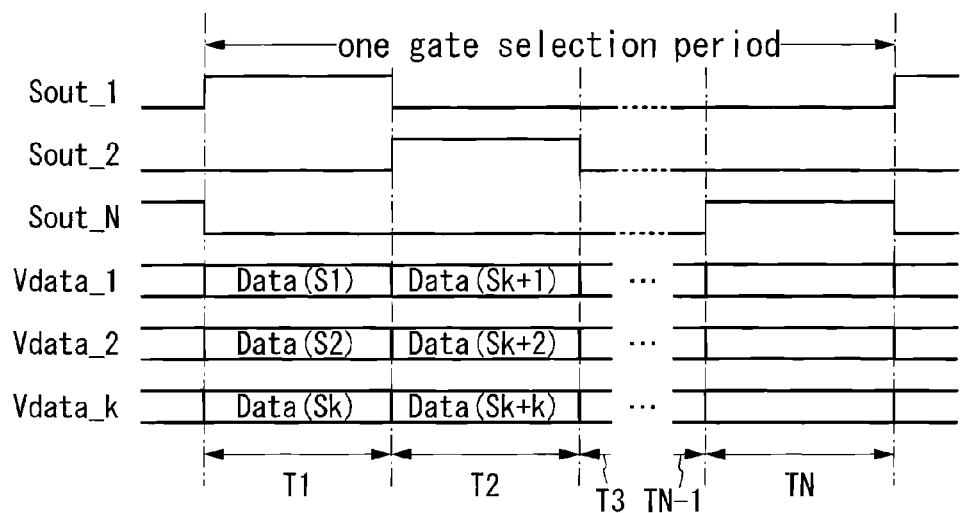

The thin film transistor described in any of Embodiments 1 to 9 is an n-channel TFT. In FIGS. 17A and 17B, an example of a structure and operation of a signal line driver circuit which is formed using an n-channel TFT is described.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_k (k is a natural number). An example in which the thin film transistors 5603_1 to 5603_k are n-channel TFTs will be described.

A connection relation of the signal line driver circuit will be described by using the switching circuit 5602_1 as an example. First terminals of the thin film transistors 5603_1 to 5603_k are connected to respective wirings 5604_1 to 5604_k. Second terminals of the thin film transistors 5603_1 to 5603_k are connected to respective signal lines S1 to Sk. Gates of the thin film transistors 5603_1 to 5603_k are connected to a wiring 5605_1.

The shift register 5601 has a function of outputting an H level signal (also called an H signal or a high power supply potential level) to the wirings 5605_1 to 5605_N in order so as to select the switching circuits 5602_1 to 5602_N in order.

The switching circuit 5602_1 has a function of controlling electrical continuity between the wirings 5604_1 to 5604_k and the signal lines S1 to Sk (electrical continuity between the first terminal and the second terminal), namely a function of controlling whether or not to supply potentials of the wirings 5604_1 to 5604_k to the signal lines S1 to Sk. In this manner, the switching circuit 5602_1 functions as a selector. Further, the thin film transistors 5603_1 to 5603_k each have a function of controlling electrical continuity between their respective wirings 5604_1 to 5604_k and their respective signal lines S1 to Sk, namely a function of controlling whether or not to supply their respective potentials of the wirings 5604_1 to 5604_k to their respective signal lines S1 to Sk. In this manner, each of the thin film transistors 5603_1 to 5603_k functions as a switch.

Note that video signal data (DATA) is input to each of the wirings 5604_1 to 5604_k. The video signal data (DATA) is an analog signal corresponding to image data or an image signal in many cases.

Next, operation of the signal line driver circuit in FIG. 17A will be described with reference to a timing chart in FIG. 17B. In FIG. 17B, an example of signals Sout_1 to Sout_N and signals Vdata_1 to Vdata_k is shown. The signals Sout_1 to Sout_N are examples of output signals of the shift register 5601 and the signals Vdata_1 to Vdata_k are examples of respective signals which are input to the wirings 5604_1 to 5604_k. One operation period of the signal line driver circuit corresponds to one gate selection period in a display device. For example, one gate selection period is divided into periods T1 to TN. The periods T1 to TN are periods for writing video signal data (DATA) to pixels in selected rows.

Note that as for the components shown in the drawings in Embodiment 10, distortion in a signal waveform and the like are exaggerated to be shown for clarity, in some cases. Therefore, there is no limitation on the scale of the components.

In the periods T1 to TN, the shift register 5601 sequentially outputs an H level signal to the wirings 5605_1 to 5605_N. For example, in the period T1, the shift register 5601 outputs an H level signal to the wiring 5605_1. Consequently, the thin film transistors 5603_1 to 5603_k are turned on, which brings electrical continuity between the wirings 5604_1 to 5604_k and the signal lines S1 to Sk. At that time, Data (S1) to Data (Sk) are input to the wirings 5604_1 to 5604_k, respectively. The Data (S1) to Data (Sk) are written into pixels in a selected row in the first to k-th columns through their respective thin film transistors 5603_1 to 5603_k. Thus, in the periods T1 to TN, video signal data (DATA) is written into the pixels in the selected row sequentially every k columns.

By writing video signal data (DATA) to pixels per a plurality of columns as described above, the number of video signal data (DATA) or the number of wirings can be reduced. Thus, the number of connections to an external circuit can be reduced. Further, by writing video signals to pixels per a plurality of columns, writing time of period can be extended and insufficiency of writing of video signals can be prevented.

Note that as the shift register 5601 and the switching circuit 5602, a circuit including the thin film transistor described in any of Embodiments 1 to 9 can be used. In that case, all the transistors included in the shift transistor 5601 can be n-channel transistors or all the transistors included in the shift transistor 5601 can be p-channel transistors.

An embodiment of a shift register which is used for part(s) of a scan line driver circuit and/or a signal line driver circuit will be described with reference to FIGS. 18A to 18C and FIGS. 19A and 19B.

The scan line driver circuit includes a shift register. The scan line driver circuit may also include a level shifter, a buffer, or the like in some cases. In the scan line driver circuit, when the clock signal (CLK) and the start pulse signal (SP) are input to the shift register, a selection signal is generated. The generated selection signal is buffered and amplified by the buffer, and then supplied to a corresponding scan line. Gate electrodes of transistors in pixels of one line are connected to the scan line. In order to turn on the transistors in the pixels of one line all at once, a buffer which can supply a large current is used.

Figure 18A:
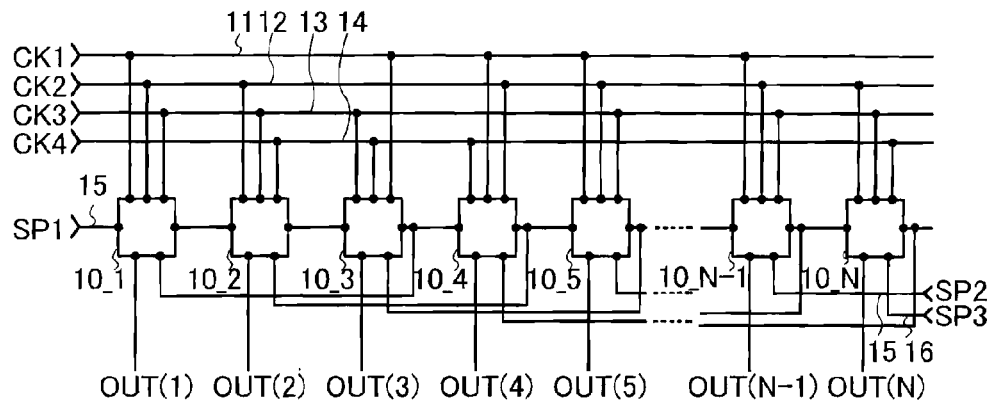
FIGS. 18A to 18C are circuit diagrams illustrating a structure of a shift resistor.

The shift register includes first to N-th pulse output circuits 10_1 to 10_N (N is a natural number of 3 or more) (see FIG. 18A). A first clock signal CK1 from a first wiring 11, a second clock signal CK2 from a second wiring 12, a third clock signal CK3 from a third wiring 13, and a fourth clock signal CK4 from a fourth wiring 14 are supplied to the first to N-th pulse output circuits 10_1 to 10_N of the shift register shown in FIG. 18A. A start pulse SP1 (a first start pulse) from a fifth wiring 15 is input to the first pulse output circuit 10_1. A signal from the pulse output circuit in the previous stage (the signal called a previous stage signal OUT (n−1)) (n is a natural number of more than or equal to 2 and lower than or equal to N) is input to the n-th pulse output circuit in the second or later stage. A signal from the third pulse output circuit 10_3 in the stage two stages after the first pulse output circuit 10_1 is input to the first pulse output circuit 10_1; that is, a signal from the (n+2)-th pulse output circuit 10_(n+2) in the stage two stages after the n-th pulse output circuit 10_n (the signal called a next stage signal OUT (n+2)) is input to the n-th pulse output circuit. A first output signal (corresponding one of OUT (1) (SR) to OUT (N) (SR)) to be input to the pulse output circuit of the previous and/or the next stage and a second output signal (corresponding one of OUT (1) to OUT (N)) which is electrically connected to another wiring or the like are output from each of the pulse output circuits. Note that as shown in FIG. 18A, the next stage signal OUT (n+2) is not input to the last two stages of the shift register; therefore, as an example, a second start pulse SP2 may be input to one of the last two stages of the shift register and a third start pulse SP3 may be input to the other of the same.

Note that a clock signal (CK) is a signal which oscillates between an H level and an L level (also called an L signal or a low power supply potential level) at a constant cycle. The first to the fourth clock signals (CK1) to (CK4) are delayed by ¼ period sequentially. In this embodiment, by using the first to fourth clock signals (CK1) to (CK4), control of driving of the pulse output circuit or the like is performed. Note that the clock signal is also called GCK or SCK depending on a driver circuit to which the clock signal is input; however, description is made here using CK as the clock signal.

Figure 18B:
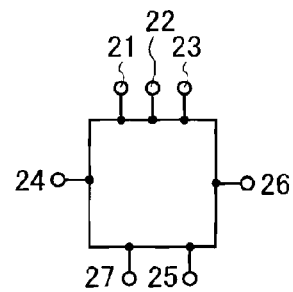

Each of the first to N-th pulse output circuits 10_1 to 10_N includes a first input terminal 21, a second input terminal 22, a third input terminal 23, a fourth input terminal 24, a fifth input terminal 25, a first output terminal 26, and a second output terminal 27 (see FIG. 18B). The first input terminal 21, the second input terminal 22, and the third input terminal 23 are electrically connected to any of the first to fourth wirings 11 to 14. For example, in FIG. 18A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 102 is electrically connected to the second wiring 12, the second input terminal 22 of the second pulse output circuit 102 is electrically connected to the third wiring 13, and the third input terminal 23 of the second pulse output circuit 10_2 is electrically connected to the fourth wiring 14.

In the first pulse output circuit 10_1, the first clock signal CK1 is input to the first input terminal 21; the second clock signal CK2 is input to the second input terminal 22; the third clock signal CK3 is input to the third input terminal 23; the first start pulse SP1 is input to the fourth input terminal 24; the next stage signal OUT (3) is input to the fifth input terminal 25; the first output signal OUT (1) (SR) is output from the first output terminal 26; and the second output signal OUT (1) is output from the second output terminal 27.

In each of the first to N-th pulse output circuits 10_1 to 10_N, as well as a thin film transistor (TFT) having three terminals, the thin film transistor having four terminals described in the above embodiment can be used. In this specification, in the case where two gate electrodes are provided with a semiconductor layer interposed therebetween in a thin film transistor, one gate electrode under the semiconductor layer can also be referred to as a lower gate electrode and the other gate electrode over the semiconductor layer can also be referred to as an upper gate electrode.

In the case where an oxide semiconductor is used for a semiconductor layer including a channel formation region of a thin film transistor, the threshold voltage may be shifted in a negative or positive direction depending on a manufacturing process thereof. Thus, it is preferable that the thin film transistor in which an oxide semiconductor is used for a semiconductor layer including a channel formation region have a structure where the threshold voltage can be controlled. The threshold voltage of the thin film transistor having four terminals can be controlled to be a predetermined value by controlling the potential(s) of the lower gate electrode and/or the upper gate electrode.

Next, an example of a specific circuit structure of the pulse output circuit which is shown in FIG. 18B will be described with reference to FIG. 18C.

Figure 18C:
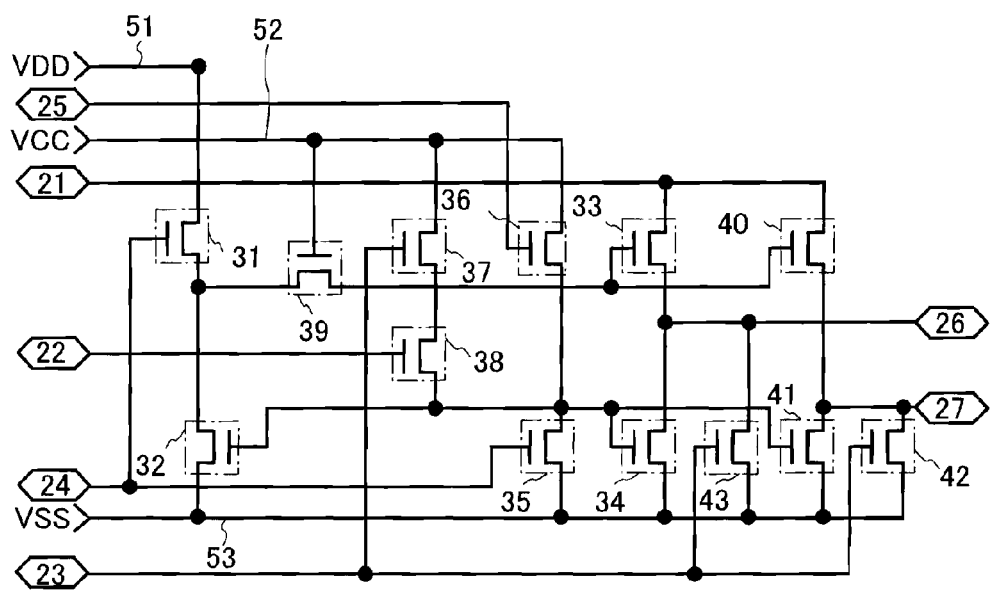

The pulse output circuit which is shown in FIG. 18C includes first to thirteenth transistors 31 to 43. Signals or power supply potentials are supplied to the first to thirteenth transistors 31 to 43 from a power supply line 51 to which a first power supply potential VDD is supplied, a power supply line 52 to which a second power supply potential VCC is supplied, and a power supply line 53 to which a third power supply potential VSS is supplied. Here, a magnitude relation of the power supply potential of each power supply line in FIG. 18C is as follows: the first power supply potential VDD is higher than or equal to the second power supply potential VCC and the second power supply potential VCC is higher than the third power supply potential VSS. Although the first to fourth clock signals (CK1) to (CK4) are signals each of which alternates between an H level signal and an L level signal at a constant cycle; and the potential is VDD when the clock signal is at the H level, and the potential is VSS when the clock signal is at the L level. The potential VDD of the power supply line 51 is set to be higher than the potential VCC of the power supply line 52, thereby reducing the potential applied to the gate electrode of the transistor without adversely effecting the operation; thus, the shift of the threshold value of the transistor can be reduced and deterioration can be suppressed. It is preferable that thin film transistors each having four terminals be used as the first transistor 31 and the sixth to ninth transistors 36 to 39 among the first transistor 31 to the thirteenth transistor 43. The first transistor 31 and the sixth to ninth transistors 36 to 39 are transistors by which the potential of a node connected to one electrode of a source and drain electrodes needs to be changed by a control signal to a gate electrode, and increase in the response speed to the control signal input to the gate electrode of each of them (steep rising of the on-current) can reduce malfunction of the pulse output circuit. Therefore, by using thin film transistors each having four terminals, the threshold voltage can be controlled, so that the malfunction of the pulse output circuit can be reduced.

In FIG. 18C, a first terminal of the first transistor 31 is electrically connected to the power supply line 51, a second terminal of the first transistor 31 is electrically connected to a first terminal of the ninth transistor 39, and a gate electrode (a lower gate electrode and an upper gate electrode) of the first transistor 31 is electrically connected to a fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode (a lower gate electrode and an upper gate electrode) of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode (a lower gate electrode and an upper gate electrode) of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode (a lower gate electrode and an upper gate electrode) of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to the gate electrode of the third transistor 33 and the gate electrode of the tenth transistor 40, and a gate electrode (a lower gate electrode and an upper gate electrode) of the ninth transistor 39 is electrically connected to the power supply line 52. A first terminal of the tenth transistor 40 is electrically connected to the first input terminal 21, a second terminal of the tenth transistor 40 is electrically connected to the second output terminal 27, and a gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrode (the lower gate electrode and the upper gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrode (the lower gate electrode and the upper gate electrode) of the seventh transistor 37.

In FIG. 18C, a connection point of the gate electrode of the third transistor 33, the gate electrode of the tenth transistor 40, and the second terminal of the ninth transistor 39 is referred to as a node A. In addition, a connection point of the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is referred to as a node B.

Figure 19A:
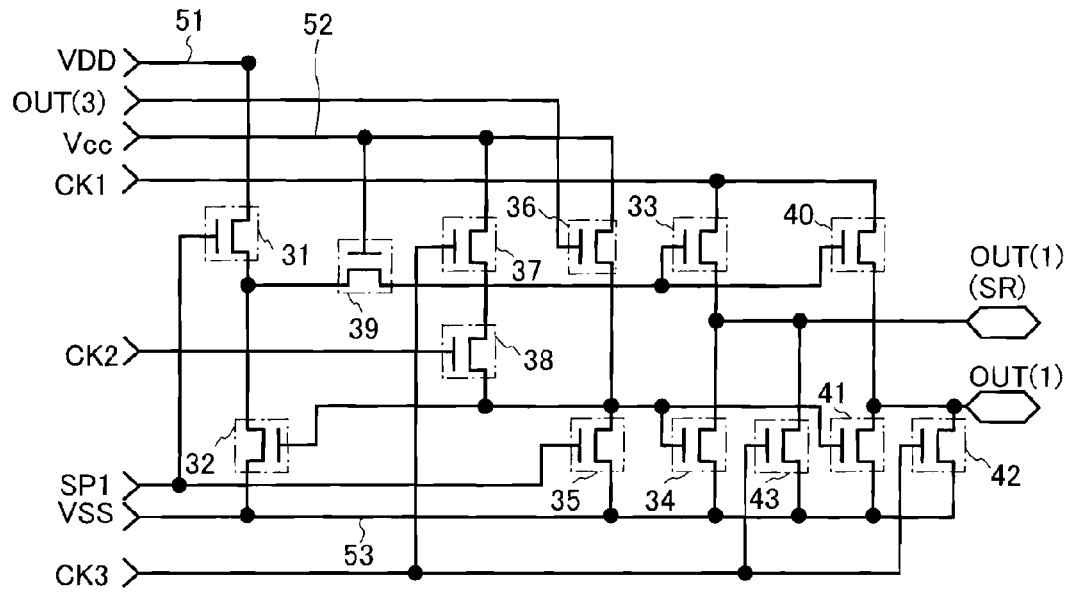
FIGS. 19A and 19B illustrate an operation of a shift resistor.

In FIG. 19A, signals which are input or output to/from the first input terminal 21 to the fifth input terminal 25, the first output terminal 26, and the second output terminal 27 when the pulse output circuit described with reference to FIG. 18C is applied to the first pulse output circuit 10_1 are shown.

Specifically, the first clock signal CK1 is input to the first input terminal 21; the second clock signal CK2 is input to the second input terminal 22; the third clock signal CK3 is input to the third input terminal 23; the start pulse is input to the fourth input terminal 24; the next stage signal OUT (3) is input to the fifth input terminal 25; the first output signal OUT (1) (SR) is output from the first output terminal 26; and the second output signal OUT (1) is output from the second output terminal 27.

Note that a thin film transistor is an element having at least three terminals of a gate, a drain, and a source. The thin film transistor has a semiconductor in which a channel region is formed in a region overlapped with the gate, and current which flows between the drain and the source through the channel region can be controlled by controlling the potential of the gate. Here, since the source and the drain of the thin film transistor may interchange depending on the structure, the operating condition, and the like of the thin film transistor, it is difficult to define which is a source or a drain. Therefore, regions functioning as a source and a drain are not called a source and a drain in some cases; in that case, for example, one of the source and the drain may be referred to as a first terminal and the other thereof may be referred to as a second terminal.

In FIGS. 18C and 19A, a capacitor may be provided for performing a bootstrap operation with the node A in the floating state. Further, in order to keep the potential of the node B, a capacitor one electrode of which is electrically connected to the node B may be provided.

Figure 19B:
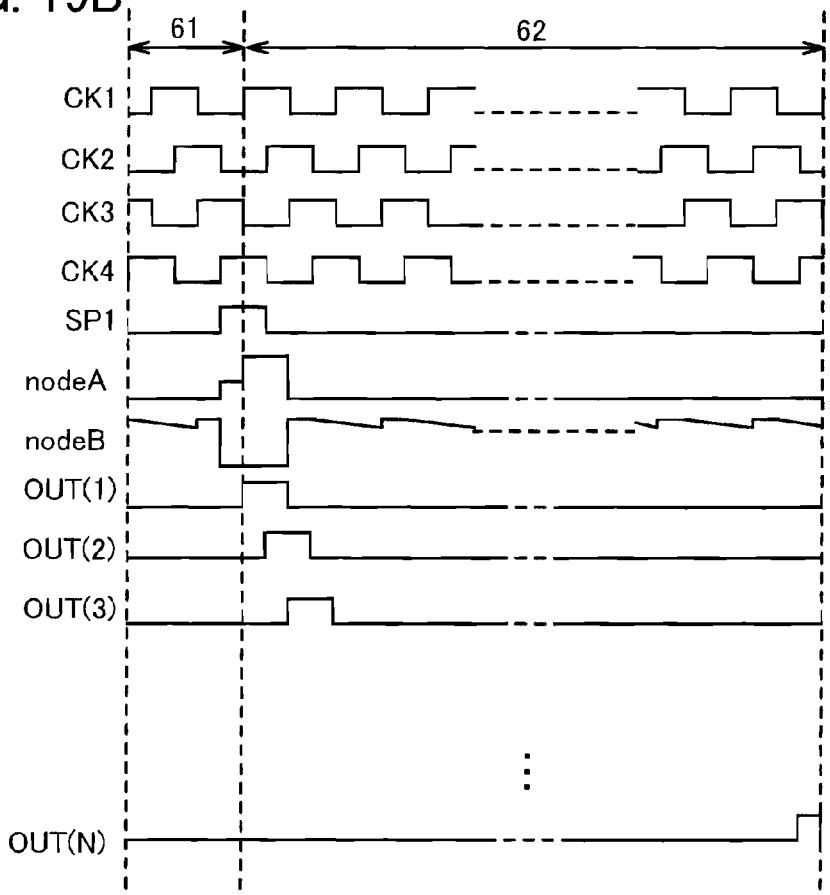

FIG. 19B shows a timing chart of a shift register including the plurality of pulse output circuits shown in FIG. 19A. In the case where the shift register is a scan line driver circuit, a period 61 in FIG. 19B is a vertical retrace period and a period 62 is a gate selection period.

As shown in FIG. 19A, the ninth transistor 39 whose gate is supplied with the second power supply potential VCC offers advantages described below before and after a bootstrap operation.

In the case where the ninth transistor 39 whose gate electrode is supplied with the second power supply potential VCC, as the potential of the node A is increased by the bootstrap operation, the potential of a source which is the second terminal of the first transistor 31 increases to a level higher than the first power supply potential VDD. Then, the first terminal of the first transistor 31, namely the power supply line 51, comes to serve as the source thereof. Therefore, in the first transistor 31, a large bias voltage is applied and thus significant stress is applied between the gate and the source and between the gate and the drain, which may cause deterioration of the transistor. The ninth transistor 39 whose gate electrode is supplied with the second power supply potential VCC can prevent the increase of the potential of the second terminal of the first transistor 31 while the potential of the node A is increased by the bootstrap operation. In other words, by providing the ninth transistor 39, a negative bias voltage applied between the gate and the source of the first transistor 31 can be reduced. Accordingly, with the circuit structure according to this embodiment, the negative bias voltage applied between the gate and the source of the first transistor 31 can be reduced, so that deterioration of the first transistor 31 due to stress can be suppressed.

The ninth transistor 39 may be provided so as to be connected between the second terminal of the first transistor 31 and the gate of the third transistor 33 through the first terminal and the second terminal thereof. In the case where a shift register including the plurality of pulse output circuits shown in this embodiment is used in a signal line driver circuit having more stages than a scan line driver circuit, the ninth transistor 39 may be omitted and the number of transistors can be reduced.

When an oxide semiconductor is used for semiconductor layers of the first transistor 31 to the thirteenth transistor 43, off-current of each thin film transistor can be reduced, on-current and field effect mobility can be increased, and the degree of deterioration can be increased; accordingly, malfunction in a circuit can be reduced. The degree of deterioration of the transistor formed using an oxide semiconductor, which is caused by application of a high potential to the gate electrode, is small in comparison with that of the transistor formed using amorphous silicon. Therefore, even when the first power supply potential VDD is supplied to a power supply line to which the second power supply potential VCC is supplied, a similar operation can be performed, and the number of power supply lines which are lead in the circuit can be reduced, so that the circuit can be miniaturized.

Even when a wiring connection is changed so that the clock signal which is supplied to the gate electrode (the lower gate electrode and the upper gate electrode) of the seventh transistor 37 through the third input terminal 23 and the clock signal which is supplied to the gate electrode (the lower gate electrode and the upper gate electrode) of the eighth transistor 38 through the second input terminal 22 are the clock signal which is supplied to the gate electrode (the lower gate electrode and the upper gate electrode) of the seventh transistor 37 through the second input terminal 22 and the clock signal which is supplied to the gate electrode (the lower gate electrode and the upper gate electrode) of the eighth transistor 38 through the third input terminal 23, respectively, a similar operation effect can be obtained. Note that in the shift register shown in FIG. 19A, In the case where after the seventh transistor 37 and the eighth transistor 38 are both on, the seventh transistor 37 is turned off and the eighth transistor 38 is kept to be on, and then the seventh transistor 37 is kept to be off and the eighth transistor 38 is turned off, a decrease in the potential of the node B, which is caused by a decrease in the potentials of the second input terminal 22 and the third input terminal 23, occurs twice because of a decrease in the potential of the gate electrode of the seventh transistor 37 and a decrease in the potential of the gate electrode of the eighth transistor 38. On the other hand, in the shift register shown in FIG. 19A, as shown in the FIG. 18B, in the case where after the seventh transistor 37 and the eighth transistor 38 are both on, the seventh transistor 37 is kept to be on and the eighth transistor 38 is turned off, and then the seventh transistor 37 is turned off and the eighth transistor 38 is kept to be off, the frequency of decrease in the potential of the node B, which is caused by the decreases in the potentials of the second input terminal 22 and the third input terminal 23, can be reduced to one which occurs when the potential of the gate electrode of the eighth transistor 38 is decreased. Therefore, with use of the clock signal which is supplied to the gate electrode (the lower gate electrode and the upper gate electrode) of the seventh transistor 37 through the third input terminal 23 and the clock signal which is supplied to the gate electrode (the lower gate electrode and the upper gate electrode) of the eighth transistor 38 through the second input terminal 22, variation in the potential of the node B is reduced; thus, noise can be reduced, which is preferable.

In this manner, in a period during which the potentials of the first output terminal 26 and the second output terminal 27 are kept at the L level, an H level signal is regularly supplied to the node B; accordingly, malfunction of a pulse output circuit can be suppressed.

Embodiment 10 can be implemented in appropriate combination with any other embodiment described herein.

Embodiment 11

A thin film transistor is manufactured and used for a pixel portion and further for a driver circuit, so that a semiconductor device having a display function (also referred to as a display device) can be manufactured. Furthermore, part or whole of a driver circuit using a thin film transistor can be formed over the same substrate as the substrate of a pixel portion, so that a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. The display device also relates to an element substrate, which corresponds to one mode before the display element is completed in a manufacturing process of the display device, and the element substrate is provided with means for supplying current to the display element in each of a plurality of pixels. Specifically, the element substrate may be in a state after only a pixel electrode (also referred to as a pixel electrode layer) of the display element is formed, a state in the period after a conductive layer to be a pixel electrode is formed and before the conductive layer is etched to form the pixel electrode, or any of other states.

Note that a display device in this specification means an image display device, a display device, or a light source (including a lighting device). Furthermore, the display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by a chip on glass (COG) method.

The appearance and a cross section of a liquid crystal display panel, which is an embodiment of a semiconductor device, will be described with reference to FIGS. 20A1, 20A2 and 20B. FIGS. 20A1 and 20A2 are each a plan view of a panel in which highly reliable thin film transistors 4010 and 4011 each including an oxide semiconductor layer formed over a first substrate 4001 which is described in Embodiment 3 and a liquid crystal element 4013 are sealed between the first substrate 4001 and a second substrate 4006 with a sealant 4005. FIG. 20B is a cross-sectional diagram taken along line M-N of FIGS. 20A1 and 20A2.

The sealant 4005 is provided to surround a pixel portion 4002 and a scan line driver circuit 4004 that are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor layer or a polycrystalline semiconductor layer over a substrate separately prepared is mounted in a region different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 20A1 illustrates an example of mounting the signal line driver circuit 4003 by a COG method, and FIG. 20A2 illustrates an example of mounting the signal line driver circuit 4003 by a TAB method.

The pixel portion 4002 and the scan line driver circuit 4004 provided over the first substrate 4001 each include a plurality of thin film transistors. FIG. 20B illustrates the thin film transistor 4010 included in the pixel portion 4002 and the thin film transistor 4011 included in the scan line driver circuit 4004. Protection insulating layers 4020 and 4021 are provided over the thin film transistors 4010 and 4011.

As the thin film transistors 4010 and 4011, the thin film transistor including an oxide semiconductor layer which is described in Embodiment 3 can be employed. Alternatively, the thin film transistor described in Embodiment 1 or Embodiment 2 may be employed. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap one another corresponds to the liquid crystal element 4013. Note that the pixel electrode layer 4030 and the counter electrode layer 4031 are provided with an insulating layer 4032 and an insulating layer 4033 respectively, the insulating layer 4032 and the insulating layer 4033 each function as an alignment film. The liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be made of glass, metal (typically, stainless steel), ceramic, or plastic. As plastic, a fiberglass-reinforced plastics (FRP) plate, a polyvinyl fluoride (PVF) film, a polyester film, or an acrylic resin film can be used.

A columnar spacer 4035 is obtained by selective etching of an insulating layer and is provided in order to control the distance (a cell gap) between the pixel electrode layer 4030 and the counter electrode layer 4031. Note that a spherical spacer may be used. The counter electrode layer 4031 is electrically connected to a common potential line provided over the same substrate as the substrate of the thin film transistor 4010. With the use of the common connection portion, the counter electrode layer 4031 can be electrically connected to the common potential line through conductive particles provided between the pair of substrates. Note that the conductive particles are contained in the sealant 4005.

Alternatively, a liquid crystal showing a blue phase which leads to the need of an alignment film may be used. A blue phase is one of the liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral agent at 5 wt % or more is used for the liquid crystal layer 4008 in order to improve the temperature range. The liquid crystal composition which includes a liquid crystal showing a blue phase and a chiral agent has a small response time of 1 milliseconds or less, has optical isotropy, which makes the alignment process unneeded, and has a small viewing angle dependence.

An embodiment of the present invention can also be applied to a reflective liquid crystal display device or a transflective liquid crystal display device, as well as a transmissive liquid crystal display device.

An example of the liquid crystal display device will be described in which a polarizing plate is provided on the outer side of the substrate (on the viewer side) and a coloring layer (color filter) and an electrode layer used for a display element are provided on the inner side of the substrate in this order; however, the polarizing plate may be provided on the inner side of the substrate. The stack structure of the polarizing plate and the coloring layer is not limited to that described in Embodiment 11 and may be set as appropriate depending on materials of the polarizing plate and the coloring layer or conditions of manufacturing steps. Furthermore, a light-blocking layer serving as a black matrix may be provided.

Over the thin film transistors 4010 and 4011, the protection insulating layer 4020 is formed. The protection insulating layer 4020 is formed using an inorganic insulating film which includes impurities such as moisture, a hydrogen ion, and $OH^-$ as less as possible and blocks entry of them from the outside; specifically, a silicon nitride film, an aluminum nitride film, a silicon nitride oxide film, an aluminum oxynitride film, or the like is used. The protection insulating layer 4020 is an insulating film having light-transmitting property. In this embodiment, a silicon nitride film is formed by a PCVD method as the protection insulating layer 4020.

The insulating layer 4021 is formed as the planarization insulating layer. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating layers formed using any of these materials.

Note that a siloxane-based resin is a resin formed using a siloxane material as a starting material and having a Si—O—Si bond. The siloxane-based resin may include as a substituent an organic group (e.g., an alkyl group or an aryl group) or a fluoro group. The organic group may include a fluoro group.

There is no particular limitation on the method for forming the insulating layer 4021; depending on a material thereof, a method such as a sputtering method, an SOG method, a spin coating method, a dipping method, a spray coating method, a droplet discharge method (e.g., an inkjet method, screen printing, offset printing, or the like), a tool (equipment) such as a doctor knife, a roll coater, a curtain coater, a knife coater or the like can be used. The baking step of the insulating layer 4021 also serves as the annealing step of the semiconductor layer, whereby a semiconductor device can be manufactured efficiently.

The pixel electrode layer 4030 and the counter electrode layer 4031 each can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can be used for the pixel electrode layer 4030 and the counter electrode layer 4031. It is preferable that the pixel electrode formed using the conductive composition preferably have a sheet resistance of 10000 ohms per square or less and a transmittance of 70% or more at a wavelength of 550 nm. Further, it is preferable that the resistivity of the conductive high molecule contained in the conductive composition be $0.1\Omega\cdot cm$ or less.

As the conductive high molecule, a so-called π-electron conjugated conductive polymer can be used. As examples thereof, there are polyaniline or a derivative thereof, polypyrrole or a derivative thereof, polythiophene or a derivative thereof, or a copolymer of two or more kinds of them, and the like.

In addition, a variety of signals and potentials are supplied to the signal line driver circuit 4003 that is formed separately, and the scan line driver circuit 4004 or the pixel portion 4002 from an FPC 4018.

A connection terminal electrode 4015 is formed using the same conductive layer as the pixel electrode layer 4030 included in the liquid crystal element 4013, and a terminal electrode 4016 is formed using the same conductive layer as a source and drain electrode layers of the thin film transistor 4011.

The connection terminal electrode 4015 is electrically connected to a terminal included in the FPC 4018 through an anisotropic conductive layer 4019.

Note that FIGS. 20A1, 20A2 and 20B illustrate an example in which the signal line driver circuit 4003 is formed separately and mounted on the first substrate 4001; however, Embodiment 11 is not limited to this structure. The scan line driver circuit may be separately formed and then mounted, or only part of the signal line driver circuit or part of the scan line driver circuit may be separately formed and then mounted.

Figure 21:
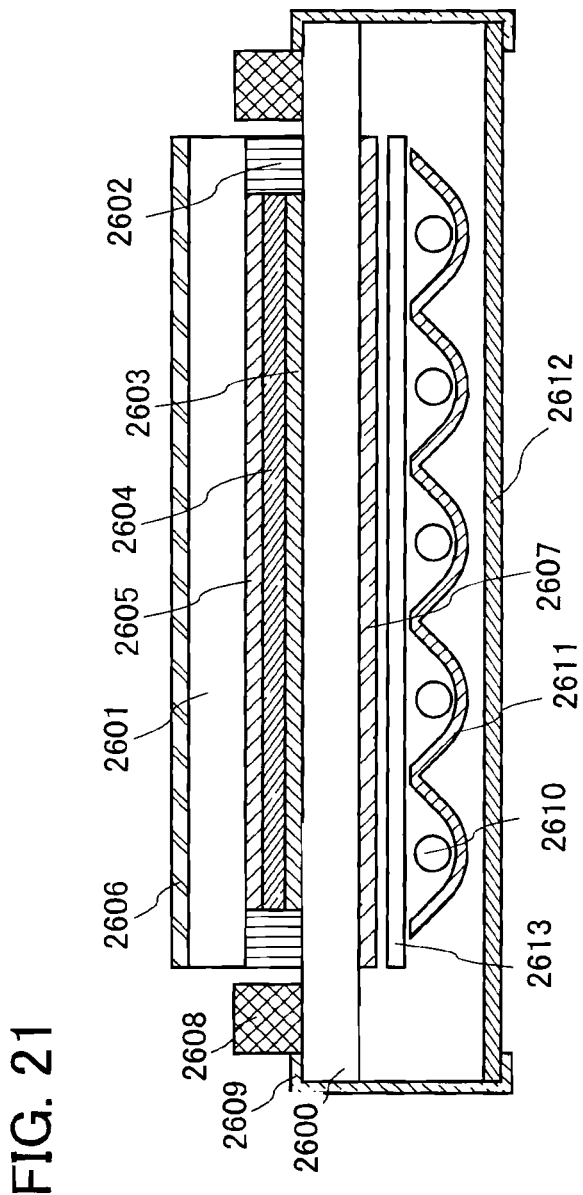
FIG. 21 illustrates a semiconductor device according to one embodiment of the present invention.

FIG. 21 shows an example in which a liquid crystal display module is formed as a semiconductor device using a TFT substrate 2600 which is manufactured according to the manufacturing method disclosed in this specification.

FIG. 21 illustrates an example of a liquid crystal display module, in which the TFT substrate 2600 and a counter substrate 2601 are bonded to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Through the above process, a highly reliable liquid crystal display panel can be manufactured as a semiconductor device.

Embodiment 11 can be implemented in appropriate combination with any other embodiment described herein.

Embodiment 12

In Embodiment 12, an example of an electronic paper will be described as a semiconductor device of an embodiment of the present invention.

The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (either one of which may be colorless).

Thus, an electrophoretic display is a display that utilizes a so-called dielectrophoretic effect by which a substance having a high dielectric constant moves to a high-electric field region. An electrophoretic display device does not involve a polarizing plate which is involved in the case of a liquid crystal display device.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Further, a plurality of the above microcapsules is arranged as appropriate over an active matrix substrate so as to be interposed between two electrodes, so that an active matrix display device can be completed, and display can be performed by application of an electric field to the microcapsules. For example, the active matrix substrate obtained by using any of the thin film transistors described in any of Embodiments 1 to 9 can be used.

The first particles and the second particles in the microcapsules may each be formed using a single material selected from a conductive material, an insulating material, a semiconductor material, a magnetic material, a liquid crystal material, a ferroelectric material, an electroluminescent material, an electrochromic material, and a magnetophoretic material, or a composite material of any of these.

Figure 22:
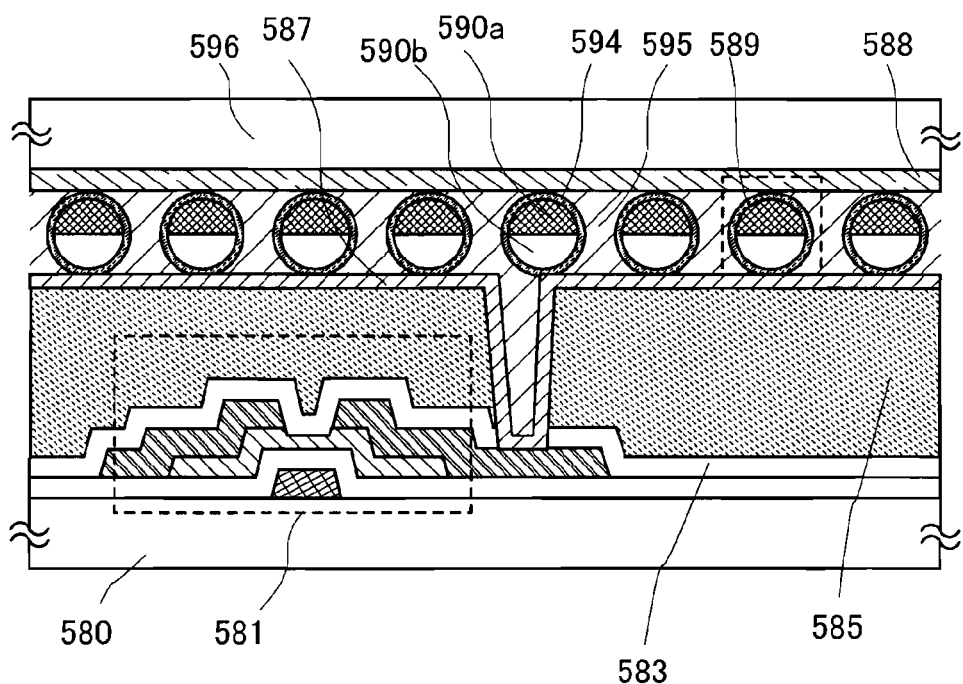
FIG. 22 illustrates a semiconductor device according to one embodiment of the present invention.

FIG. 22 illustrates active matrix electronic paper as an example of a semiconductor device. A thin film transistor 581 used in the semiconductor device can be manufactured in a manner similar to that of the thin film transistor described in Embodiment 1 and is a highly reliable thin film transistor including an oxide semiconductor layer. The thin film transistor described in any of Embodiments 2 to 9 can also be used as the thin film transistor 581 of Embodiment 12.

The electronic paper in FIG. 22 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 is a bottom-gate thin film transistor and is covered with an insulating layer 583 which is in contact with a semiconductor layer. A source or drain electrode layer of the thin film transistor 581 is in contact with a first electrode layer 587 through an opening formed in a first electrode layer 587, an insulating layer 583, and an insulating layer 585, whereby the thin film transistor 581 is electrically connected to the first electrode layer 587. Between the first electrode layer 587 and a second electrode layer 588 formed over a substrate 596, spherical particles 589 each having a black region 590*a*, a white region 590*b*, and a cavity 594 around the regions which is filled with liquid are provided. A space around the spherical particles 589 is filled with a filler 595 such as a resin. The first electrode layer 587 corresponds to a pixel electrode, and the second electrode layer 588 corresponds to a common electrode. The second electrode layer 588 is electrically connected to a common potential line provided over the same substrate as the substrate of the thin film transistor 581. With the use of a common connection portion, the second electrode layer 588 can be electrically connected to the common potential line through conductive particles provided between the substrates 580 and 596.

Instead of the twisting ball, an electrophoretic element can also be used. A microcapsule having a diameter of about 10 µm to 200 µm in which transparent liquid, positively-charged white microparticles, and negatively-charged black microparticles are encapsulated, is used. In the microcapsule which is provided between the first electrode layer and the second electrode layer, when an electric field is applied between the first electrode layer and the second electrode layer, the white microparticles and the black microparticles move to opposite sides from each other, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through the above process, a highly reliable electronic paper can be manufactured as a semiconductor device.

Embodiment 12 can be implemented in appropriate combination with any other embodiment described herein.

Embodiment 13

An example of a light-emitting display device will be described as a semiconductor device. As a display element included in a display device, a light-emitting element utilizing electroluminescence is described in Embodiment 13. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, and current flows. Then, the carriers (electrons and holes) recombine, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission which utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Description is made using an organic EL element as a light-emitting element in Embodiment 13.

Figure 23:
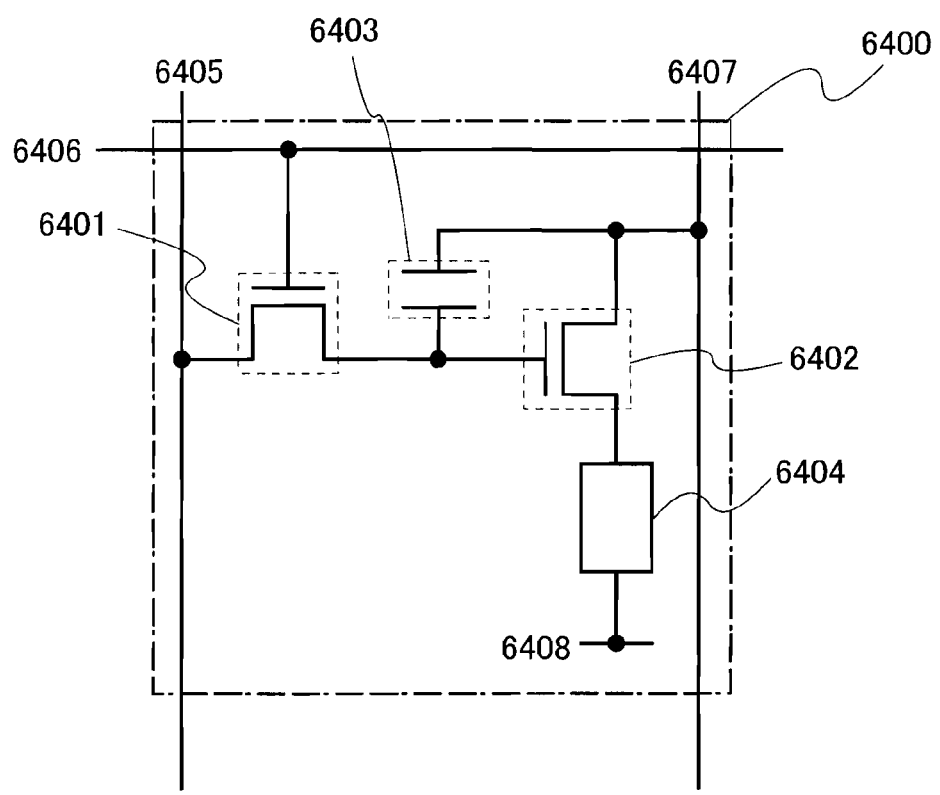
FIG. 23 illustrates an equivalent circuit of a pixel of a semiconductor device according to one embodiment of the present invention.

FIG. 23 illustrates an example of a pixel configuration as an example of a semiconductor device which can be driven by a digital time grayscale method.

The structure and operation of the pixel which can be driven by a digital time grayscale method will be described. An example is described in Embodiment 13 in which one pixel includes two n-channel transistors using an oxide semiconductor layer in a channel formation region.

A pixel 6400 includes a switching transistor 6401, a transistor 6402 for driving a light-emitting element, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the transistor 6402 for driving the light-emitting element. The gate of the transistor 6402 for driving the light-emitting element is connected to a power supply line 6407 through the capacitor 6403, a first electrode of the driving transistor 6402 is connected to the power supply line 6407, and a second electrode of the transistor 6402 for driving the light-emitting element is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

Note that the second electrode (common electrode 6408) of the light-emitting element 6404 is set to a low power supply potential. The low power supply potential is lower than a high power supply potential which is supplied to the power supply line 6407. For example, GND or 0 V may be set as the low power supply potential. The difference between the high power supply potential and the low power supply potential is applied to the light-emitting element 6404 so that current flows through the light-emitting element 6404, whereby the light-emitting element 6404 emits light. Thus, each potential is set so that the difference between the high power supply potential and the low power supply potential is greater than or equal to a forward threshold voltage of the light-emitting element 6404.

When the gate capacitance of the transistor 6402 for driving the light-emitting element is used as a substitute for the capacitor 6403, the capacitor 6403 can be omitted. The gate capacitance of the transistor 6402 for driving the light-emitting element may be formed between a channel region and a gate electrode.

Here, in the case of using a voltage-input voltage driving method, a video signal is input to the gate of the transistor 6402 for driving the light-emitting element to make the transistor 6402 for driving the light-emitting element completely turn on or off. That is, the transistor 6402 for driving the light-emitting element operates in a linear region, and thus, a voltage higher than the voltage of the power supply line 6407 is applied to the gate of the transistor 6402 for driving the light-emitting element. Note that a voltage greater than or equal to (power supply line voltage+$V_{th}$ of the transistor 6402 for driving the light-emitting element) is applied to the signal line 6405.

In the case of using an analog grayscale method instead of the digital time grayscale method, the same pixel configuration as in FIG. 23 can be employed by changing input of signals.

In the case of using the analog grayscale method, a voltage greater than or equal to (forward voltage of the light-emitting element 6404+$V_{th}$ of the transistor 6402 for driving the light-emitting element) is applied to the gate of the transistor 6402 for driving the light-emitting element. The forward voltage of the light-emitting element 6404 refers to a voltage to obtain a desired luminance, and includes at least a forward threshold voltage. By inputting a video signal to enable the transistor 6402 for driving the light-emitting element to operate in a saturation region, current can be supplied to the light-emitting element 6404. In order that the transistor 6402 for driving the light-emitting element can operate in the saturation region, the potential of the power supply line 6407 is set to be higher than a gate potential of the transistor 6402 for driving the light-emitting element. Since the video signal is an analog signal, current in accordance with the video signal flows in the light-emitting element 6404, and the analog grayscale method can be performed.

The pixel configuration is not limited to that illustrated in FIG. 23. For example, a switch, a resistor, a capacitor, a transistor, a logic circuit, or the like can be added to the pixel shown in FIG. 23.

Next, structures of the light-emitting element will be described with reference to FIGS. 24A to 24C. In Embodiment 13, a cross-sectional structure of a pixel will be described by taking an n-channel TFT for driving a light-emitting element as an example. TFTs 7001, 7011, and 7021 which are TFTs for driving light-emitting elements used for semiconductor devices illustrated in FIGS. 24A to 24C can be manufactured in a manner similar to that of the thin film transistor used in a pixel, which is described in Embodiment 1. The TFTs 7001, 7011, and 7021 are highly reliable thin film transistors each including an oxide semiconductor layer. Alternatively, the thin film transistor used in a pixel, which is described in any of Embodiments 2 to 9 can be employed as any of the TFTs 7001, 7011, and 7021.

In order to extract light emitted from the light-emitting element, at least one of the anode and the cathode transmits light. A thin film transistor and a light-emitting element are formed over a substrate. A light-emitting element can have a top emission structure in which light is extracted through the surface opposite to the substrate, a bottom emission structure in which light is extracted through the surface on the substrate side, or a dual emission structure in which light is extracted through the surface opposite to the substrate and the surface on the substrate side. The above-described pixel configuration can be applied to a light-emitting element having any of these emission structures.

A light-emitting element having a top emission structure will be described with reference to FIG. 24A.

Figure 24A:
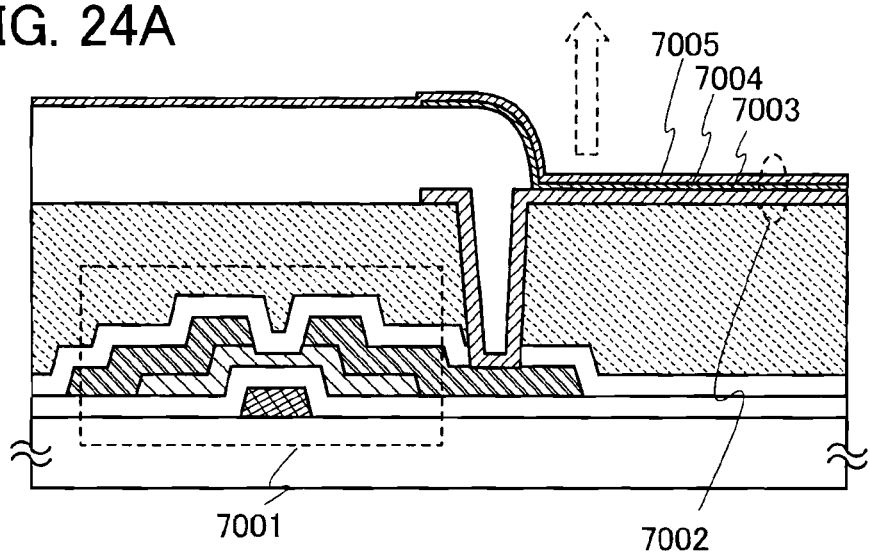
FIGS. 24A to 24C each illustrate a semiconductor device according to one embodiment of the present invention.

FIG. 24A is a cross-sectional view of a pixel in the case where the TFT 7001 for driving the light-emitting element is of an n-type and light is emitted from a light-emitting element 7002 to an anode 7005 side. In FIG. 24A, a cathode 7003 of the light-emitting element 7002 is electrically connected to the TFT 7001 for driving the light-emitting element, and a light-emitting layer 7004 and the anode 7005 are stacked in this order over the cathode 7003. The cathode 7003 can be made of a variety of conductive materials as long as they have a low work function and reflect light. For example, it is preferable to use Ca, Al, CaF, MgAg, AlLi, or the like. The light-emitting layer 7004 may be formed using a single layer or a plurality of layers stacked. When the light-emitting layer 7004 is formed using a plurality of layers, the light-emitting layer 7004 is formed by stacking an electron-injection layer, an electron-transport layer, a light-emitting layer, a hole-transport layer, and a hole-injection layer in this order over the cathode 7003. Note that not all of these layers need to be provided. The anode 7005 is made using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

Further, a partition 7009 is provided over the cathode 7003. The partition 7009 is formed using an organic resin film of polyimide, acrylic, polyamide, epoxy, or the like, an inorganic insulating film, or organic polysiloxane. It is preferable that the partition 7009 be formed using a photosensitive resin material so that a sidewall of the partition 7009 is formed as a tilted surface with continuous curvature. In the case where a photosensitive resin material is used for the partition 7009, a step of forming a resist mask can be omitted.

The light-emitting element 7002 corresponds to a region where the light-emitting layer 7004 is sandwiched between the cathode 7003 and the anode 7005. In the case of the pixel illustrated in FIG. 24A, light is emitted from the light-emitting element 7002 to the anode 7005 side as indicated by an arrow.

Next, a light-emitting element having a bottom emission structure will be described with reference to FIG. 24B. FIG. 24B is a cross-sectional view of a pixel in the case where the TFT 7011 for driving the light-emitting element is of an n-type and light is emitted from a light-emitting element 7012 to a cathode 7013 side. In FIG. 24B, the cathode 7013 of the light-emitting element 7012 is formed over a light-transmitting conductive layer 7017 which is electrically connected to the TFT 7011 for driving the light-emitting element, and a light-emitting layer 7014 and an anode 7015 are stacked in this order over the cathode 7013. Note that a light-blocking film 7016 for reflecting or blocking light may be formed to cover the anode 7015 when the anode 7015 has a light-transmitting property. For the cathode 7013, various materials can be used, like in the case of FIG. 24A, as long as they are conductive materials having a low work function. Note that the cathode 7013 is formed to have a thickness that can transmit light (preferably, about 5 to 30 nm). For example, an aluminum film with a thickness of 20 nm can be used as the cathode 7013. Similarly to the case of FIG. 24A, the light-emitting layer 7014 may be formed using either a single layer or a plurality of layers stacked. The anode 7015 is not required to transmit light, but can be formed using a light-transmitting conductive material like in the case of FIG. 24A. As the light-blocking film 7016, a metal which reflects light can be used for example; however, it is not limited to a metal film. For example, a resin to which black pigments are added can also be used.

Further, a partition 7019 is provided over the conductive layer 7017. The partition 7019 is formed using an organic resin film of polyimide, acrylic, polyamide, epoxy, or the like, an inorganic insulating film, or organic polysiloxane. It is preferable that the partition 7019 be formed using a photosensitive resin material so that a sidewall of the partition 7019 is formed as a tilted surface with continuous curvature. In the case where a photosensitive resin material is used for the partition 7019, a step of forming a resist mask can be omitted.

The light-emitting element 7012 corresponds to a region where the light-emitting layer 7014 is sandwiched between the cathode 7013 and the anode 7015. In the case of the pixel illustrated in FIG. 24B, light is emitted from the light-emitting element 7012 to the cathode 7013 side as indicated by an arrow.

Next, a light-emitting element having a dual emission structure will be described with reference to FIG. 24C. In FIG. 24C, a cathode 7023 of a light-emitting element 7022 is formed over a light-transmitting conductive layer 7027 which is electrically connected to the TFT 7021 for driving the light-emitting element, and a light-emitting layer 7024 and an anode 7025 are stacked in this order over the cathode 7023. Like in the case of FIG. 24A, the cathode 7023 can be formed using a variety of conductive materials as long as they have a low work function. Note that the cathode 7023 is formed using a thickness that can transmit light. For example, an aluminum film with a thickness of 20 nm can be used as the cathode 7023. Like in FIG. 24A, the light-emitting layer 7024 may be formed as either a single layer or a plurality of layers stacked. The anode 7025 can be formed using a light-transmitting conductive material like in the case of FIG. 24A.

Further, a partition 7029 is provided over the conductive layer 7027. The partition 7029 is formed using an organic resin film of polyimide, acrylic, polyamide, epoxy, or the like, an inorganic insulating film, or organic polysiloxane. It is preferable that the partition 7029 be formed using a photosensitive resin material so that a sidewall of the partition 7029 is formed as a tilted surface with continuous curvature. In the case where a photosensitive resin material is used for the partition 7029, a step of forming a resist mask can be omitted.

The light-emitting element 7022 corresponds to a region where the cathode 7023, the light-emitting layer 7024, and the anode 7025 overlap one another. In the case of the pixel illustrated in FIG. 24C, light is emitted from the light-emitting element 7022 to both the anode 7025 side and the cathode 7023 side as indicated by arrows.

Although an organic EL element is described in Embodiment 13 as a light-emitting element, an inorganic EL element can be provided as a light-emitting element as well.

The example is described in which a thin film transistor (a TFT for driving a light-emitting element) which controls the driving of a light-emitting element is electrically connected to the light-emitting element; however, a structure may be employed in which a TFT for current control is connected between the TFT for driving the light-emitting element and the light-emitting element.

Figure 24B:
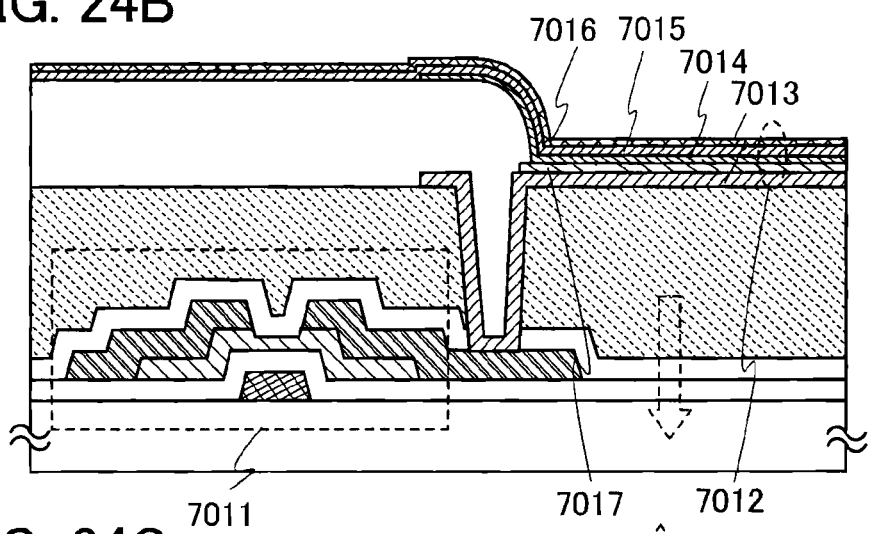
Figure 24C:
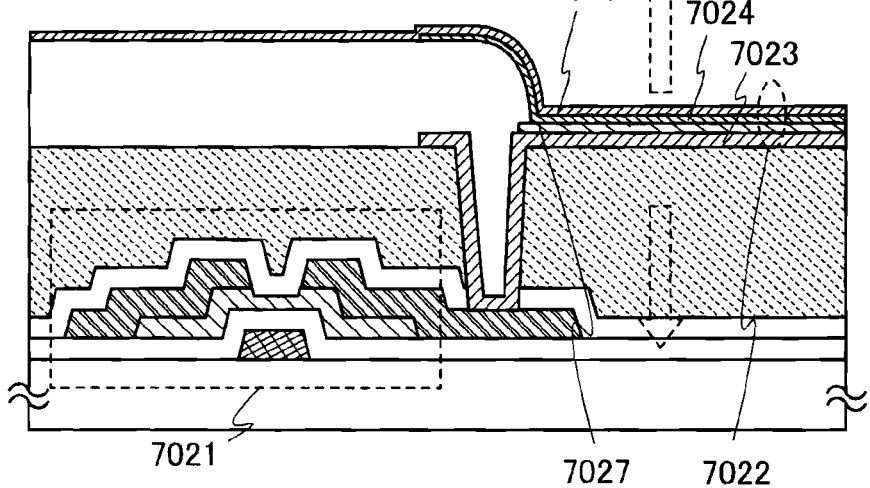

Note that the structure of the semiconductor device is not limited to those illustrated in FIGS. 24A to 24C and can be modified in various ways based on the spirit of techniques described in this specification.

Figure 25A:
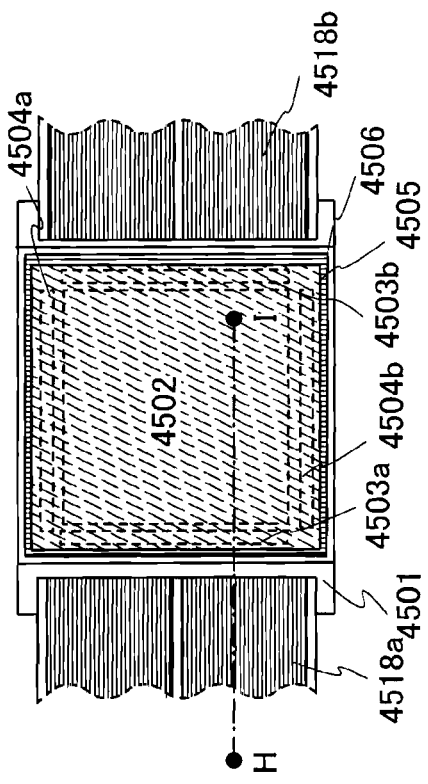
FIGS. 25A and 25B illustrate a semiconductor device according to one embodiment of the present invention.
Figure 25B:
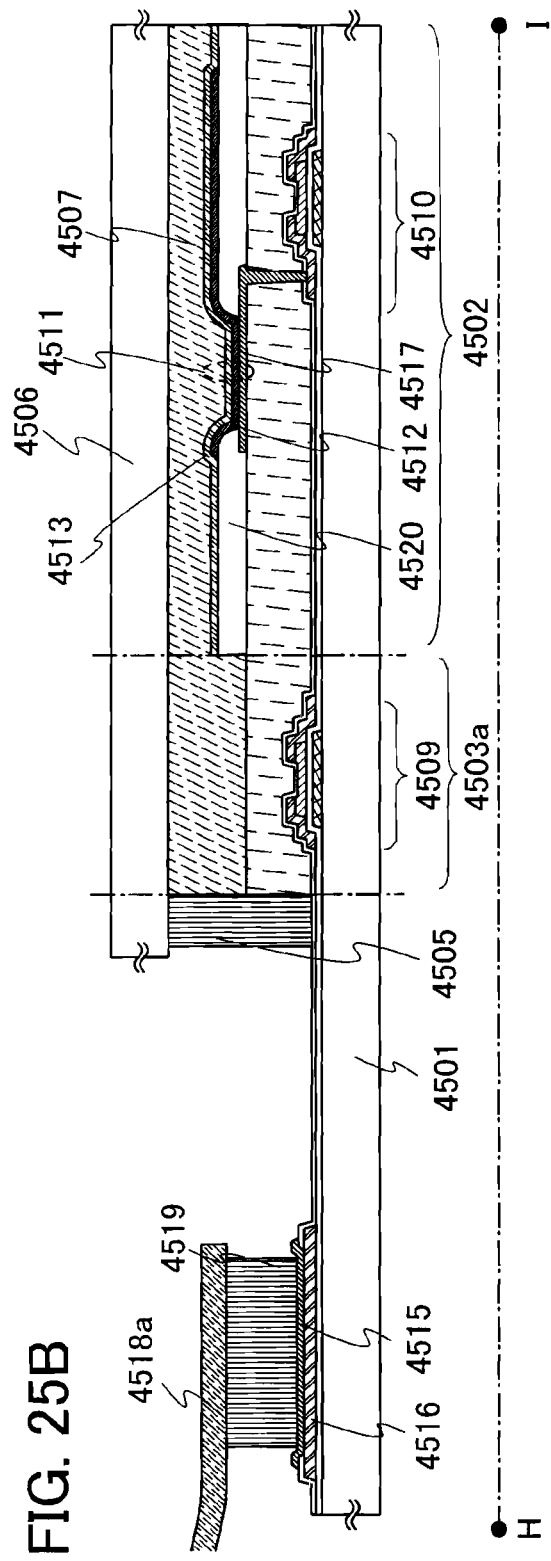

Next, the appearance and a cross section of a light-emitting display panel (also referred to as a light-emitting panel), which is an embodiment of the semiconductor device, will be described with reference to FIGS. 25A and 25B. FIG. 25A is a plan view of a panel in which a thin film transistor and a light-emitting element are sealed between a first substrate and a second substrate with a sealant. FIG. 25B is a cross-sectional diagram taken along line H-I of FIG. 25A.

A sealant 4505 is provided to surround a pixel portion 4502, signal line driver circuits 4503a and 4503b, and scan line driver circuits 4504a and 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

The pixel portion 4502, the signal line driver circuits 4503a and 4503b, and the scan line driver circuits 4504a and 4504b provided over the first substrate 4501 each include a plurality of thin film transistors, and a thin film transistor 4510 included in the pixel portion 4502 and a thin film transistor 4509 included in the signal line driver circuit 4503a are illustrated as an example in FIG. 25B.

As the thin film transistors 4509 and 4510, the highly reliable thin film transistor including the oxide semiconductor layer described in Embodiment 3 can be employed. Alternatively, any of the thin film transistors described in Embodiments 1 and 2 can be employed. The thin film transistors 4509 and 4510 are n-channel thin film transistors in this embodiment.

Further, a protection insulating layer 4543 is formed over the thin film transistors 4509 and 4510. The protection insulating layer 4543 is formed using an inorganic insulating film which includes impurities such as moisture, a hydrogen ion, and $OH^-$ as less as possible and blocks entry of them from the outside; specifically, a silicon nitride film, an aluminum nitride film, a silicon nitride oxide film, an aluminum oxynitride film, or the like is used. The protection insulating layer 4543 is an insulating film having light-transmitting property. In this embodiment, a silicon nitride film is formed by a PCVD method as the protection insulating layer 4543.

The insulating layer 4544 is formed as a planarization insulating layer. As the insulating layer 4544, an organic material having heat resistance such as polyimide, acrylic, benzocyclobutene, polyamide, or epoxy can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4544 may be formed by stacking a plurality of insulating layers formed using any of these materials. In this embodiment, acrylic is used as the insulating layer 4544.

Moreover, reference numeral 4511 denotes a light-emitting element. A first electrode layer 4517 that is a pixel electrode included in the light-emitting element 4511 is electrically connected to a source electrode layer or a drain electrode layer of the thin film transistor 4510. Note that a structure of the light-emitting element 4511 is not limited to the stack structure described in Embodiment 13, which includes the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is preferable that the partition 4520 be formed using a photosensitive material to have an opening over the first electrode layer 4517 so that a sidewall of the opening is formed as an inclined surface with continuous curvature.

The electroluminescent layer 4512 may be formed with a single layer or a plurality of layers stacked.

An oxide insulating layer may be formed over the second electrode layer 4513 and the partition 4520 in order to prevent hydrogen, moisture, carbon dioxide, or the like from entering the light-emitting element 4511.

A variety of signals and potentials are supplied to the signal line driver circuits 4503*a* and 4503*b*, the scan line driver circuits 4504*a* and 4504*b*, or the pixel portion 4502 from FPCs 4518*a* and 4518*b*.

A connection terminal electrode 4515 is formed using the same conductive layer as the first electrode layer 4517 included in the light-emitting element 4511, and a terminal electrode 4516 is formed using the same conductive layer as the source and drain electrode layers included in the thin film transistor 4509.

The connection terminal electrode 4515 is electrically connected to a terminal of the FPC 4518*a* through an anisotropic conductive layer 4519.

As the second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, as well as an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen can be used as the filler.

If needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Furthermore, the polarizing plate or the circularly polarizing plate may be provided with an anti-reflection film. For example, anti-glare treatment by which reflected light can be diffused by roughness of the surface so as to reduce the glare can be performed.

The signal line driver circuits 4503*a* and 4503*b* and the scan line driver circuits 4504*a* and 4504*b* may be mounted as driver circuits formed using a single crystal semiconductor layer or a polycrystalline semiconductor layer over a substrate separately prepared. Alternatively, only the signal line driver circuits or part thereof, or only the scan line driver circuits or part thereof may be separately formed and mounted. Embodiment 13 is not limited to the structure illustrated in FIGS. 25A and 25B.

Through the above process, a highly reliable light-emitting display panel (light-emitting panel) as a semiconductor device can be manufactured.

Embodiment 13 can be implemented in appropriate combination with any other embodiment described herein.

Embodiment 14

A semiconductor device disclosed in this specification can be applied as an electronic paper. An electronic paper can be used for electronic appliances in a variety of fields as long as they can display data. For example, an electronic paper can be applied to an e-book reader (electronic book), a poster, an advertisement in a vehicle such as a train, or displays of various cards such as a credit card. An example of the electronic appliances is illustrated in FIG. 26.

Figure 26:
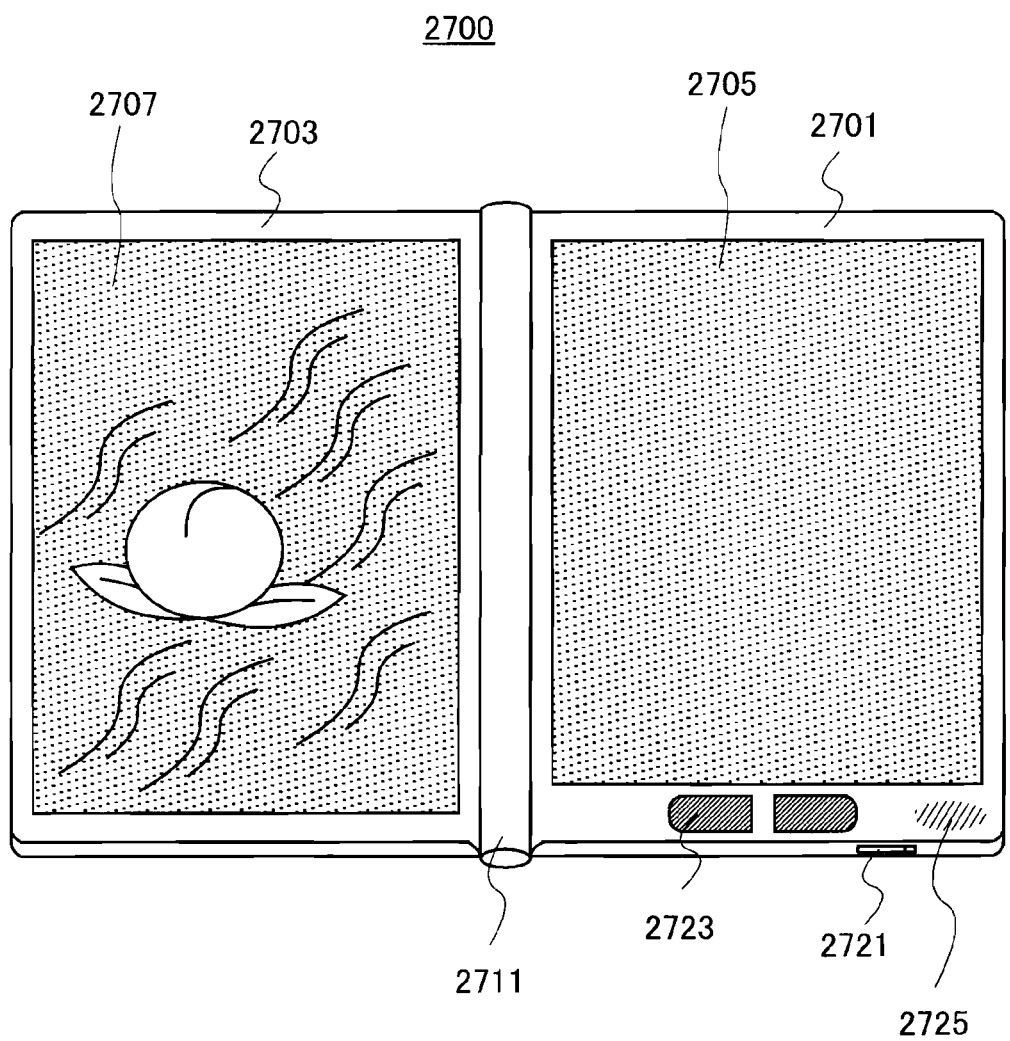
FIG. 26 is an external view illustrating an example of an electronic book reader.

FIG. 26 illustrates an example of an e-book reader 2700. For example, the e-book reader 2700 includes a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 26) and graphics can be displayed on a display portion on the left side (the display portion 2707 in FIG. 26).

FIG. 26 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a structure capable of wirelessly transmitting and receiving data. Through wireless communication, desired book data or the like can be purchased and downloaded from an electronic book server.

Embodiment 15

A semiconductor device disclosed in this specification can be applied to a variety of electronic appliances (including amusement machines). Examples of electronic appliances include television sets (also referred to as televisions or television receivers), monitor of computers or the like, cameras such as digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 27A:
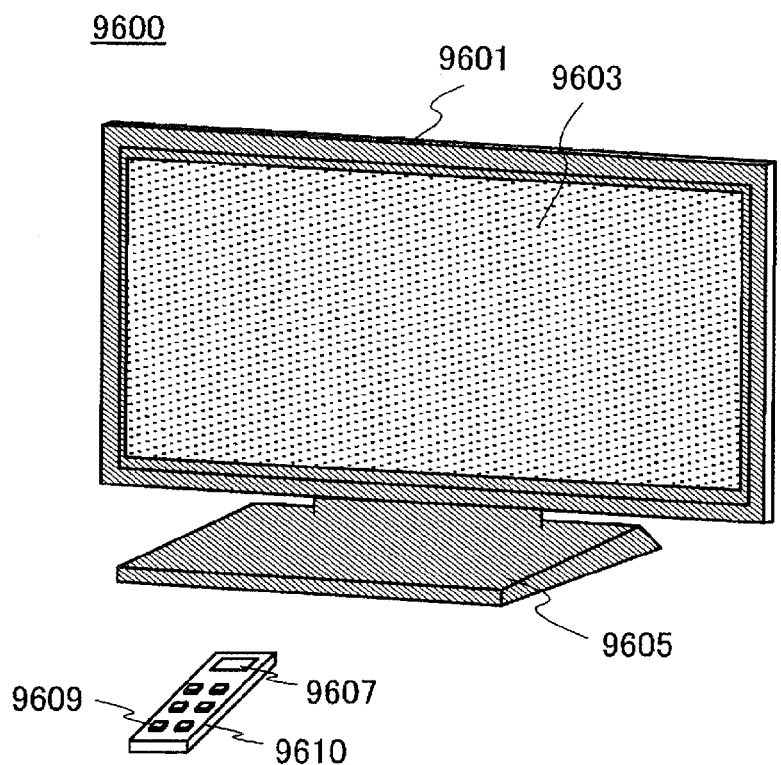
FIGS. 27A and 27B are external views illustrating an example of a television set and an example of a digital photo frame, respectively.

FIG. 27A illustrates an example of a television set 9600. In the television set 9600, a display portion 9603 is incorporated in a housing 9601. Images can be displayed on the display portion 9603. In this example, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from transmitter to receiver) or two-way (between transmitter and receiver, between receivers, or the like) data communication can be performed.

Figure 27B:
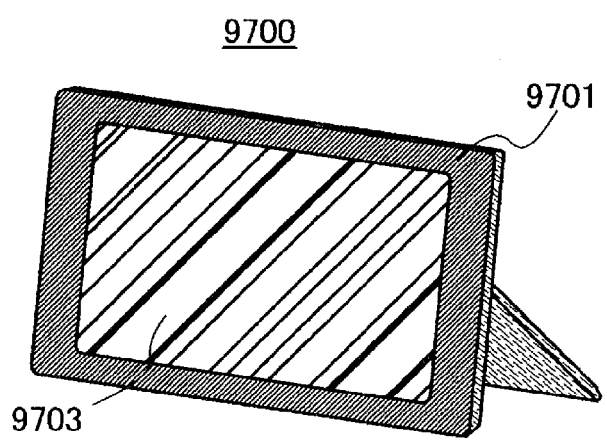

FIG. 27B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image shot by a digital camera is inserted in the recording medium insertion portion of the digital photo frame 9700, whereby the image data can be downloaded and displayed on the display portion 9703.

The digital photo frame 9700 may have a structure capable of wirelessly transmitting and receiving data. Through wireless communication, desired image data can be downloaded to be displayed.

Figure 28A:
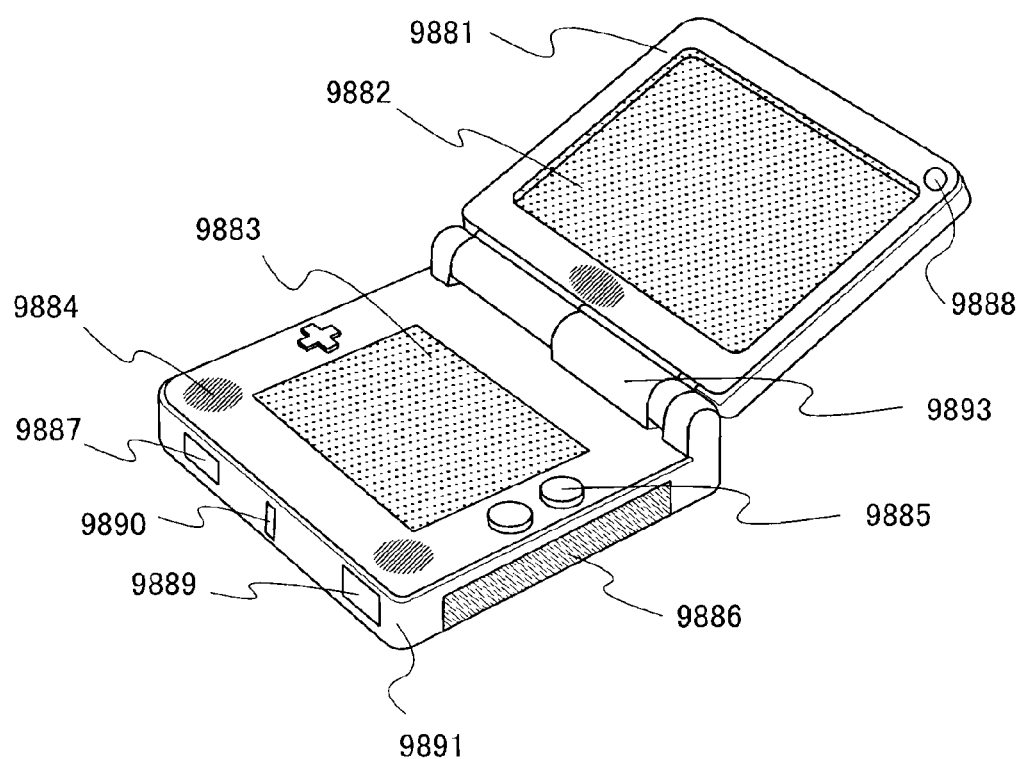
FIGS. 28A and 28B are external views illustrating examples of an amusement machine.

FIG. 28A illustrates a portable amusement machine including two housings: a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 28A includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 9889), and the like. It is needless to say that the structure of the portable amusement machine is not limited to the above and any other structure provided with at least a semiconductor device disclosed in this specification can be employed. The portable amusement machine may include other accessory equipment as appropriate. The portable amusement machine illustrated in FIG. 28A has a function of reading a program or data stored in a recording medium to display it on the display portion, and a function of sharing information with another portable amusement machine by wireless communication. Note that the portable amusement machine illustrated in FIG. 28A can have various functions without limitation to the above.

Figure 28B:
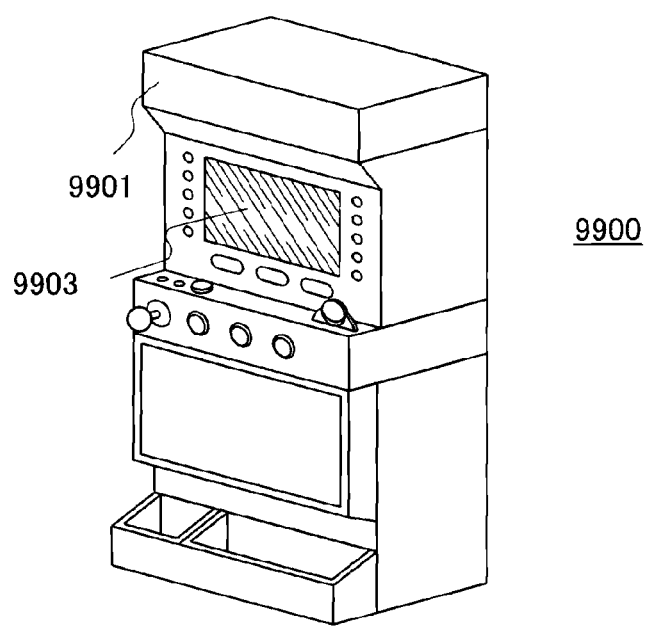

FIG. 28B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and any other structure provided with at least a semiconductor device disclosed in this specification may be employed. The slot machine 9900 may include other accessory equipment as appropriate.

Figure 29A:
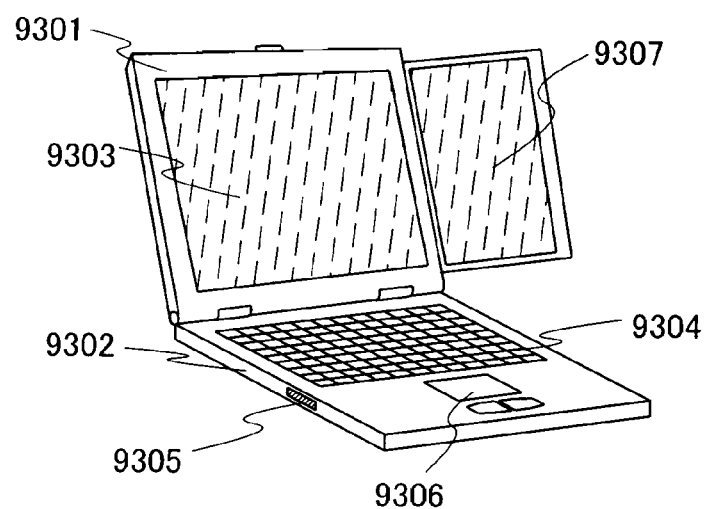
FIGS. 29A and 29B are external views illustrating an example of a portable computer and an example of a mobile phone, respectively.

FIG. 29A is a perspective view illustrating an example of a portable computer.

In the portable computer of FIG. 29A, a top housing 9301 having a display portion 9303 and a bottom housing 9302 having a keyboard 9304 can overlap each other by closing a hinge unit which connects the top housing 9301 and the bottom housing 9302. The portable computer of FIG. 29A can be convenient for carrying, and in the case of using the keyboard for input, the hinge unit is opened and the user can input looking at the display portion 9303.

The bottom housing 9302 includes a pointing device 9306 with which data input can be performed, in addition to the keyboard 9304. Further, when the display portion 9303 is a touch input panel, data input can be performed by touching part of the display portion. The bottom housing 9302 includes an arithmetic function portion such as a CPU or hard disk. In addition, the bottom housing 9302 includes another device, for example, an external connection port 9305 into which a communication cable conformable to communication standards of a USB is inserted.

The top housing 9301 further includes a display portion 9307 which can be housed therein by sliding toward the inside of the top housing 9301, thereby realizing a large display screen. In addition, the user can adjust the orientation of a screen of the display portion 9307 which can be kept in the top housing 9301. When the display portion 9307 which can be housed the top housing 9301 is a touch input panel, data input can be performed by touching part of the display portion 9307 which can be housed in the top housing 9301.

The display portion 9303 or the display portion 9307 which can be housed in the top housing 9301 are formed using an image display device of a liquid crystal display panel, a light-emitting display panel such as an organic light-emitting element or an inorganic light-emitting element, or the like.

In addition, the portable computer of FIG. 29A can be provided with a receiver and the like and can receive a television broadcast to display an image on the display portion. A television broadcast can be watched on the whole screen of the display portion 9307 exposed by sliding with the hinge unit which connects the top housing 9301 and the bottom housing 9302 closed. In that case, the hinge unit is not opened and display is not performed on the display portion 9303, and operation of only a circuit for displaying the television broadcast is performed; therefore, power consumption can be suppressed to the minimum, which is useful for the portable computer whose battery capacity is limited.

Figure 29B:
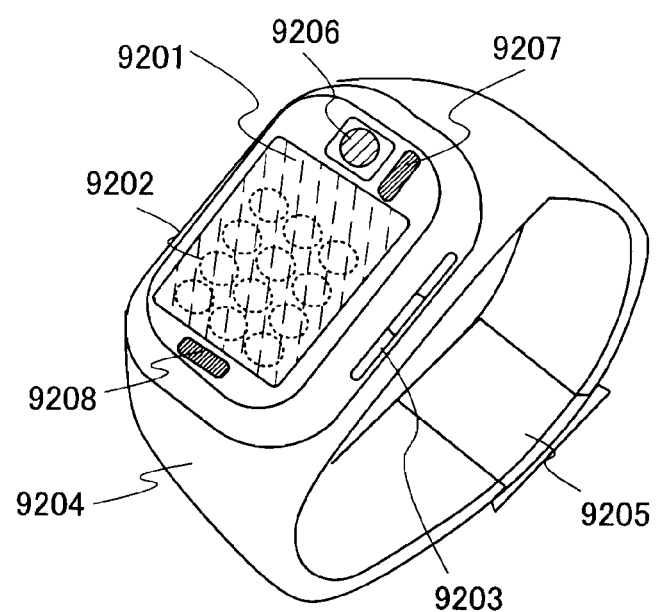

FIG. 29B is a perspective view illustrating an example of a cellular phone that the user can wear on the wrist like a wristwatch.

This cellular phone includes the following: a main body which includes a communication device including at least a telephone function, and battery; a band portion 9204 by which the main body is worn on the wrist; an adjusting portion 9205 for adjusting the band portion fixed on the wrist; a display portion 9201; a speaker 9207; and a microphone 9208.

The main body includes operating switches 9203. The operating switches 9203 serve, for example, as a switch for turning on a power source, a switch for changing display, a switch for instructing to start taking images, or as a button for starting a program for the Internet when the switch is pushed, which enables different functions to interact.

Data Input to this cellular phone is operated by touching the display portion 9201 with a finger or an input pen, operating the operating switches 9203, or inputting voice into the microphone 9208. Note that displayed buttons 9202 which are displayed on the display portion 9201 are illustrated in FIG. 29B. Data Input can be performed by touching the displayed buttons 9202 with a finger or the like.

Further, the main body includes a camera portion 9206 including an image pick-up means for converting an image of an object, which is formed through a camera lens, to an electronic image signal. Note that the camera portion is not necessarily provided.

The cellular phone illustrated in FIG. 29B is provided with a receiver of a television broadcast and the like, and can display an image on the display portion 9201 by receiving a television broadcast. In addition, the cellular phone illustrated in FIG. 29B is provided with a memory device and the like such as a memory, and can record a television broadcast in the memory. The cellular phone illustrated in FIG. 29B may have a function of detecting location information such as GPS.

An image display device of a liquid crystal display panel, a light-emitting display panel such as an organic light-emitting element or an inorganic light-emitting element, or the like is used as the display portion 9201. The cellular phone illustrated in FIG. 29B is compact and lightweight and the battery capacity of the cellular phone illustrated in FIG. 29B is limited. Therefore, it is preferable that a panel which can be driven with low power consumption be used as a display device for the display portion 9201.

Note that FIG. 29B illustrates the electronic apparatus which is worn on the wrist; however, this embodiment is not limited thereto as long as a portable shape is employed.

Example 1

The interaction between an oxide semiconductor layer and an oxygen molecule was calculated using first-principle MD (molecular dynamics) simulation. In this example, CASTEP produced by Accelrys, Inc. was used as the calculation software. The calculation conditions were set as follows: the NVT ensemble was used, the period of time was 0.5 picoseconds, and the temperature was 350° C. As the calculation method, a density functional theory with the use of the pseudo-potential plane-wave method was employed. In addition, GGA-PBE was used for a functional.

In this example, an amorphous structure formed of 12 indium atoms, 12 gallium atoms, 12 zinc atoms, and 46 oxygen atoms was used as a calculation model of an IGZO surface. The primitive lattice used for the calculation was a rectangular solid with dimensions of 1.02 nm×1.02 nm×2.06 nm A Periodic boundary condition was used for the boundary. The above-described surface model to which an oxygen molecule is added was used below.

Figure 30A:
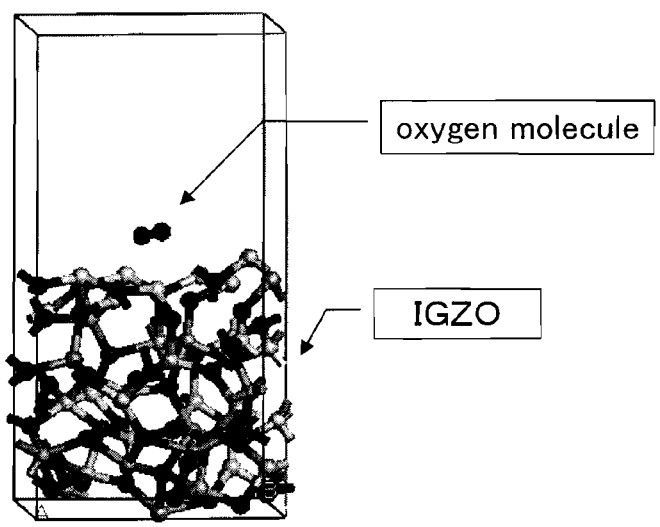
FIGS. 30A and 30B show results of a simulation of an interaction of an oxygen molecule and a surface of an oxide semiconductor layer.
Figure 30B:
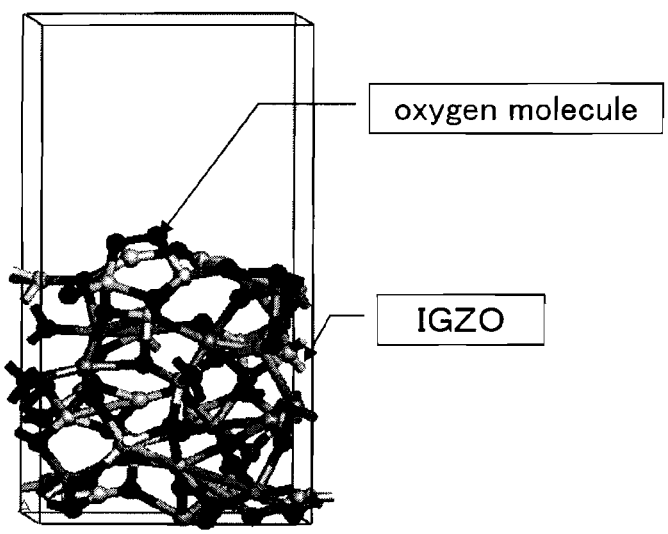

FIG. 30A shows an initial state of the surface of the oxide semiconductor layer and the oxygen molecule disposed in the vicinity of the surface of the oxide semiconductor layer. FIG. 30B shows locations thereof after 0.5 picoseconds. In FIG. 30B, the oxygen molecule is adsorbed by the metal of the surface of the oxide semiconductor layer. The covalent bond of the oxygen molecule did not break within 0.5 picoseconds.

However, an oxygen atom is more thermodynamically stable in the state of being adjacent to a metal atom rather than in the state of being bonded to an oxygen atom. Further, as is seen from the structure model made using the measured density value of the oxide semiconductor layer, the space inside the oxide semiconductor layer is too narrow for the oxygen molecule to diffuse into while keeping the covalent bond. Thus, oxygen atoms are diffused into the oxide semiconductor layer when they come to the thermodynamical equilibrium.

Next, a diffusion phenomenon of oxygen in an oxide semiconductor layer including a region with a high oxygen density and a region with a low oxygen density, which is caused by heat treatment, was calculated. The results are described with reference to FIG. 31 and FIG. 32. In this example, Materials Explorer 5.0 manufactured by Fujitsu Limited was used as the calculation software.

Figure 31:
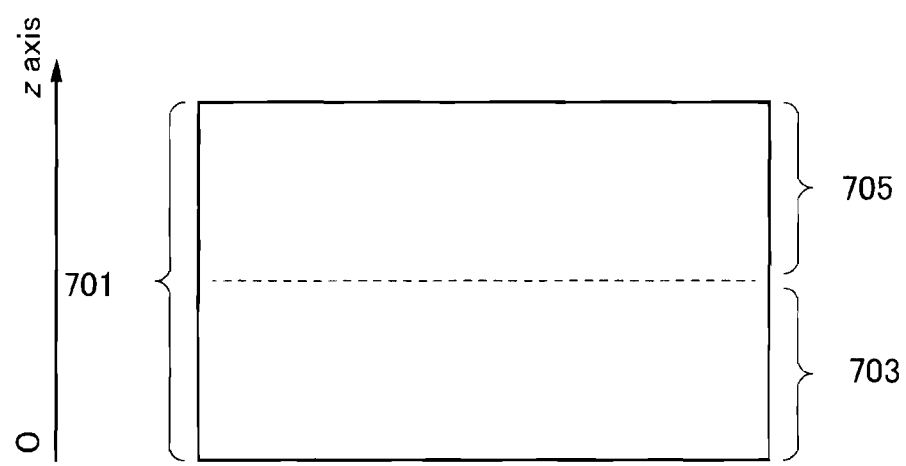
FIG. 31 illustrates a structure of an oxide semiconductor layer used for a calculation.

FIG. 31 shows a model of an oxide semiconductor layer that was used for the calculation. In this example, an oxide semiconductor layer 701 had a structure in which a layer with a low oxygen density 703 and a layer with a high oxygen density 705 are stacked.

For the layer with a low oxygen density 703, an amorphous structure formed of 15 indium atoms, 15 gallium atoms, 15 zinc atoms, and 54 oxygen atoms was employed.

For the layer with a high oxygen density 705, an amorphous structure formed of 15 indium atoms, 15 gallium atoms, 15 zinc atoms, and 66 oxygen atoms was employed.

Further, the density of the oxide semiconductor layer 701 was set at 5.9 g/cm$^3$.

Next, classical MD (molecular dynamics) simulation was performed on the oxide semiconductor layer 701 under conditions of the NVT ensemble and a temperature of 250° C. The time interval was set at 0.2 femtoseconds, and the total calculation period of time was 200 picoseconds. For the metal-oxygen bonding and the oxygen-oxygen bonding, a Born-Mayer-Huggins potential was used. In addition, motion of atoms at the upper and lower ends of the oxide semiconductor layer 701 was fixed.

Figure 32:
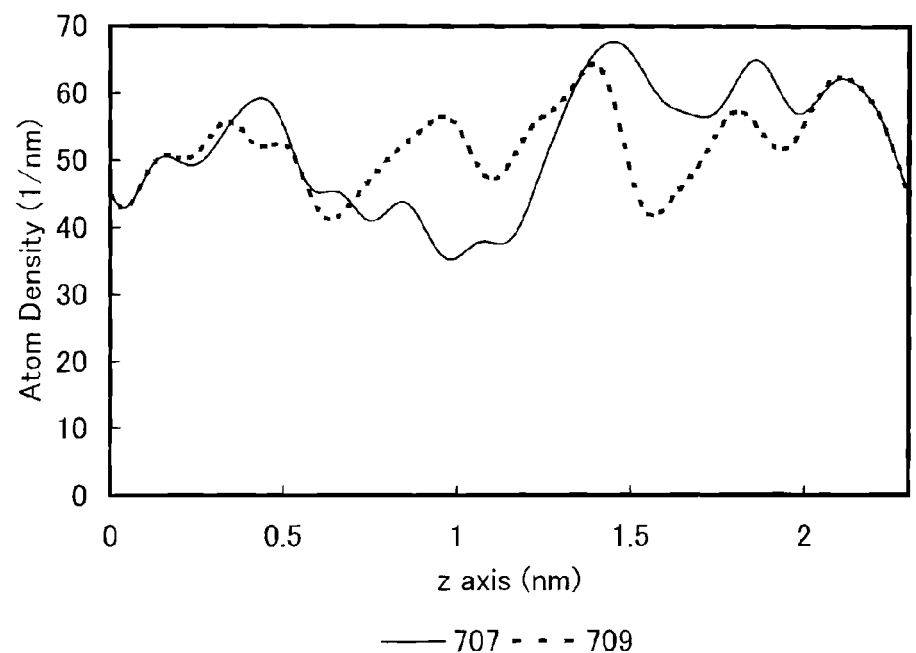
FIG. 32 is a graph showing measurement results of the oxygen density of the oxide semiconductor layer.

Next, the simulation results are shown in FIG. 32. A region from 0 nm to 1.15 nm along the z axis indicates the layer with a low oxygen density 703, and a region from 1.15 nm to 2.3 nm along the z axis indicates the layer with a high oxygen density 705. The oxygen density distribution before the MD simulation is indicated by a solid line 707, and the oxygen density distribution after the MD simulation is indicated by a broken line 709.

As for the solid line 707, the oxygen density in the layer with a high oxygen density 705 is higher than that at the interface between the layer with a low oxygen density 703 and the layer with a high oxygen density 705. On the other hand, as for the broken line 709, the oxygen density in the layer with a low oxygen density 703 and the oxygen density in the layer with a high oxygen density 705 are even.

From the above, it can be found that in the case where the oxygen density distribution is uneven like the stacked structure of the layer with a low oxygen density 703 and the layer with a high oxygen density 705, heat treatment makes oxygen diffuse from the higher density region to the lower density region, so that the oxygen density becomes even.

Figure 33A:
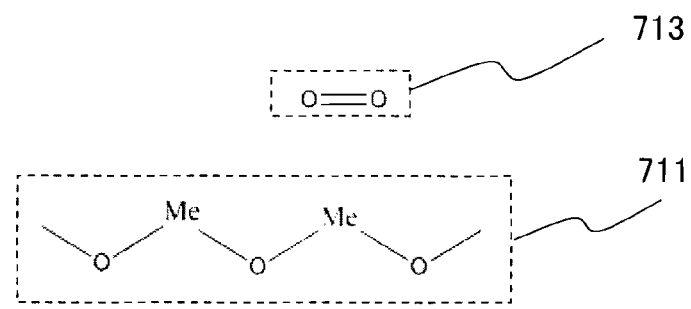
FIGS. 33A to 33C illustrate an interaction of oxygen and a surface of an oxide semiconductor layer.
Figure 33B:
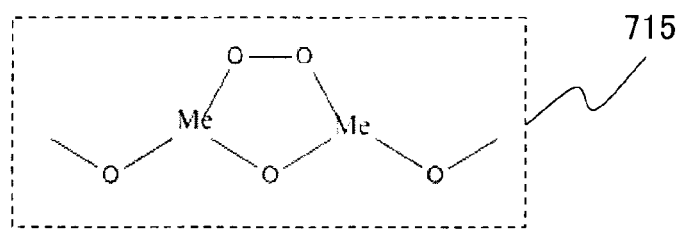
Figure 33C:
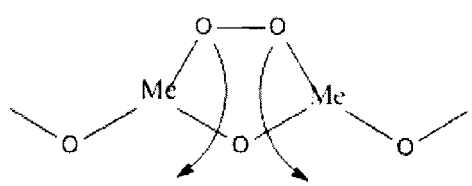

The oxygen diffusion at that time is illustrated schematically in FIGS. 33A to 33C. Oxygen 713 moves to a surface of an oxide semiconductor layer 711 (see FIG. 33A). In the mode shown in FIG. 33A, metal (Me) is bonded to oxygen (O) in the oxide semiconductor layer 711. Next, the oxygen 713 is adsorbed on the surface of the oxide semiconductor layer 711. FIG. 33B illustrates an oxide semiconductor layer 715 in which oxygen is adsorbed to metal (Me) of the oxide semiconductor. After that, it is found that the adsorbed oxygen makes ion bonding with a metal ion (Me) contained in the oxide semiconductor layer and diffuses to the inside of the oxide semiconductor layer in the form of an oxygen atom (see FIG. 33C).

That is, the structure in which the oxide insulating layer 407 is formed on the oxide semiconductor layer 403 as described in Embodiment 1 makes the oxygen density increase at the interface between the oxide semiconductor layer 403 and the oxide insulating layer 407, so that oxygen is diffused toward the lower oxygen density in the oxide semiconductor layer 403; accordingly, the resistance of the oxide semiconductor layer 403 is increased. In this manner, reliability of a thin film transistor can be improved.

This application is based on Japanese Patent Application serial no. 2009-164134 filed with Japan Patent Office on Jul. 10, 2009, the entire contents of which are hereby incorporated by reference.

REFERENCE NUMERALS

11: wiring; 12: wiring; 13: wiring; 14: wiring; 15: wiring; 21: input terminal; 22: input terminal; 23: input terminal; 24: input terminal; 25: input terminal; 26: output terminal; 27: output terminal; 31: transistor; 32: transistor; 33: transistor; 34: transistor; 35: transistor; 36: transistor; 37: transistor; 38: transistor; 39: transistor; 40: transistor; 41: transistor; 42: transistor; 43: transistor; 51: power supply line, 52: power supply line, 53: power supply line; 61: period; 62: period; 100: substrate; 101: gate electrode layer; 102: gate insulating layer; 103: oxide semiconductor layer; 105a: drain electrode layer; 105b: drain electrode layer; 107: oxide insulating layer; 108: capacitor wiring; 110: pixel electrode layer; 121: terminal; 122: terminal; 125: contact hole; 126: contact hole; 127: contact hole; 128: transparent conductive layer; 129: transparent conductive layer; 132: conductive layer; 133: oxide semiconductor layer; 134: oxide semiconductor layer; 150: terminal; 151: terminal; 152: gate insulating layer; 153: connection electrode layer; 154: oxide insulating layer; 155: transparent conductive layer; 156: electrode layer; 170: thin film transistor; 400: substrate; 401: gate electrode layer; 402: gate insulating layer; 403: oxide semiconductor layer; 404a: source region or drain region; 404b: source region or drain region; 405a: source electrode layer or drain electrode layer; 405b: source electrode layer or drain electrode layer; 407: oxide insulating layer; 408: conductive layer; 409: conductive layer; 410: insulating layer; 411: pixel electrode layer; 419: conductive layer; 430: oxide semiconductor layer; 431: oxide semiconductor layer; 441: oxide semiconductor layer; 450: substrate; 451: gate electrode layer; 452: gate electrode layer; 453: oxide semiconductor layer; 455a: source electrode layer or drain electrode layer; 455b: source electrode layer or drain electrode layer; 457: oxide insulating layer; 460: thin film transistor; 470: thin film transistor; 471: thin film transistor; 472: thin film transistor; 473: thin film transistor; 483: oxide semiconductor layer; 580: substrate; 581: thin film transistor; 583: insulating layer; 585: insulating layer; 587: electrode layer; 588: electrode layer; 589: spherical particle; 590a: black region; 590b: white region; 594: cavity; 595: filler; 596: substrate; 601: electric furnace; 602: chamber; 603: heater; 604: substrate; 605: susceptor; 606: gas supply means; 607: evacuation means; 611: gas supply source; 612: pressure adjusting valve; 613: refiner; 614: mass flow controller; 615: stop valve; 701: oxide semiconductor layer; 703: layer; 705: layer; 707: solid line; 709: broken line; 711: oxide semiconductor layer; 713: oxygen; 715: oxide semiconductor layer; 1400: substrate; 1401: gate electrode layer; 1402: gate insulating layer; 1403: oxide semiconductor layer; 1405a: source electrode layer; 1405b: drain electrode layer; 1406a: source region; 1406b: drain region; 1407: insulating layer; 1408: insulating layer; 1409: conductive layer; 1418: channel protective layer; 1430: thin film transistor; 1431: thin film transistor; 1432: thin film transistor; 1470: thin film transistor; 2600: TFT substrate; 2601: counter substrate; 2602: sealant; 2603: pixel portion; 2604: display element; 2605: coloring layer; 2606: polarizing plate; 2607: polarizing plate; 2608: wiring circuit portion; 2609: flexible wiring board; 2610: cold cathode tube; 2611: reflective plate; 2612: circuit board; 2613: diffusion plate; 2700: e-book reader; 2701: housing; 2703: housing; 2705: display portion; 2707: display portion; 2711: hinge; 2721: power source; 2723: operation key; 2725: speaker; 4001: substrate; 4002: pixel portion; 4003: signal line driver circuit; 4004: scan line driver circuit; 4005: sealant; 4006: substrate; 4008: liquid crystal layer; 4010: thin film transistor; 4011: thin film transistor; 4013: liquid crystal element; 4015: connection terminal electrode; 4016: terminal electrode; 4018: FPC; 4019: anisotropic conductive layer; 4020: protection insulating layer; 4021: insulating layer; 4030: pixel electrode layer; 4031: counter electrode layer; 4032: insulating layer; 4501: substrate; 4502: pixel portion; 4503a: signal line driver circuit; 4504a: scan line driver circuit; 4518a: FPC; 4505: sealant; 4506: substrate; 4507: filler; 4509: thin film transistor; 4510: thin film transistor; 4511: light-emitting element; 4512: electroluminescence layer 4513: electrode layer; 4515: connection terminal electrode; 4516: terminal electrode; 4517: electrode layer; 4519: anisotropic conductive layer; 4520: partition; 4544: insulating layer; 4543: protection insulating layer; 5300: substrate; 5301: pixel portion; 5302: scan line driver circuit; 5303: scan line driver circuit; 5304: signal line driver circuit; 5305: timing control circuit; 5601: shift register; 5602: switching circuit; 5603: thin film transistor; 5604: wiring; 5605: wiring; 6400: pixel; 6401: switching transistor; 6402: driving transistor; 6403: capacitor; 6404: capacitor; 6405: signal line; 6406: scan line; 6407: power supply line; 6408: common electrode; 7001: TFT; 7002: light-emitting element; 7003: cathode; 7004: light-emitting layer; 7005: anode; 7009: cathode; 7011: driving TFT; 7012: light-emitting element; 7013: cathode; 7014: light-emitting layer; 7015: anode; 7016: blocking layer; 7017: conductive layer; 7019: partition; 7021: driving TFT; 7022: light-emitting element; 7023: cathode; 7024: light-emitting layer; 7025: anode; 7027: conductive layer; 7029: partition; 9201: display portion; 9202: display button; 9203: operation switch; 9205: adjusting portion; 9206: speaker; 9208: microphone; 9301: top housing; 9302: bottom housing; 9303: display portion; 9304: keyboard; 9305: external connection port; 9306: pointing device; 9307: display portion; 9600: television set; 9601: housing; 9603: display portion; 9605: stand; 9607: display portion; 9609: operation key; 9610: remote controller; 9700: digital photo frame; 9701: housing; 9703: display portion; 9881: housing; 9882: display portion; 9883: display portion; 9884: speaker portion; 9885: operation key; 9886: recording medium insertion portion; 9887: connection terminal, 9888: sensor; 9889: microphone; 9890: LED lamp; 9891: housing; 9893: connection portion; 9900: slot machine; 9901: housing; 9903: display portion

The invention claimed is:
1. A method for manufacturing a semiconductor device, comprising:
  forming a gate electrode layer over a substrate having an insulating surface;
  forming a gate insulating layer over the gate electrode layer;
  forming an oxide semiconductor layer over the gate insulating layer;
  heating the oxide semiconductor layer in an oxygen atmosphere after the step of forming the oxide semiconductor layer;
  forming a source electrode layer over the oxide semiconductor layer;
  forming a drain electrode layer over the oxide semiconductor layer;
  forming an oxide insulating layer which is in contact with part of the oxide semiconductor layer, over the gate insulating layer, the oxide semiconductor layer, the source electrode layer, and the drain electrode layer; and performing a heat treatment in an oxygen atmosphere or an inert gas atmosphere after the step of forming the oxide insulating layer.

2. A method for manufacturing a semiconductor device, comprising:
   forming a gate electrode layer over a substrate having an insulating surface;
   forming a gate insulating layer over the gate electrode layer;
   forming an oxide semiconductor layer over the gate insulating layer;
   heating the oxide semiconductor layer in an oxygen atmosphere, so that the oxide semiconductor layer is dehydrated or dehydrogenated after the step of forming the oxide semiconductor layer;
   forming a source electrode layer over the oxide semiconductor layer;
   forming a drain electrode layer over the oxide semiconductor layer;
   forming an oxide insulating layer which is in contact with part of the oxide semiconductor layer, over the gate insulating layer, the oxide semiconductor layer, the source electrode layer, and the drain electrode layer; and
   performing a heat treatment in an oxygen atmosphere or an inert gas atmosphere after the step of forming the oxide insulating layer.

3. A method for manufacturing a semiconductor device, comprising:
   forming an oxide semiconductor layer over an insulating layer;
   heating the oxide semiconductor layer in an oxygen atmosphere after the step of forming the oxide semiconductor layer;
   forming a source electrode layer over the oxide semiconductor layer;
   forming a drain electrode layer over the oxide semiconductor layer;
   forming an oxide insulating layer which is in contact with part of the oxide semiconductor layer, over the insulating layer, the oxide semiconductor layer, the source electrode layer, and the drain electrode layer; and
   performing a heat treatment in an oxygen atmosphere or an inert gas atmosphere after the step of forming the oxide insulating layer.

4. A method for manufacturing a semiconductor device, comprising:
   forming an oxide semiconductor layer over an insulating layer;
   heating the oxide semiconductor layer in an oxygen atmosphere, so that the oxide semiconductor layer is dehydrated or dehydrogenated after the step of forming the oxide semiconductor layer;
   forming a source electrode layer over the oxide semiconductor layer;
   forming a drain electrode layer over the oxide semiconductor layer;
   forming an oxide insulating layer which is in contact with part of the oxide semiconductor layer, over the insulating layer, the oxide semiconductor layer, the source electrode layer, and the drain electrode layer; and
   performing a heat treatment in an oxygen atmosphere or an inert gas atmosphere after the step of forming the oxide insulating layer.

5. The method for manufacturing a semiconductor device according to claim 1 or claim 2, wherein a temperature at which the oxide semiconductor layer is heated in the oxygen atmosphere is higher than or equal to 200° C. and lower than a strain point of the substrate.

6. The method for manufacturing a semiconductor device according to any one of claims 1 to 4, wherein after the oxide semiconductor layer is heated in the oxygen atmosphere, the oxide semiconductor layer is held in the oxygen atmosphere.

7. The method for manufacturing a semiconductor device according to any one of claims 1 to 4, wherein after the oxide semiconductor layer is heated in the oxygen atmosphere, the oxide semiconductor layer is held in an inert gas atmosphere.

8. The method for manufacturing a semiconductor device according to claim 1, wherein a temperature in the step of performing the heat treatment is higher than or equal to 150° C. and lower than 350° C.

9. The method for manufacturing a semiconductor device according to claim 1, wherein the oxide insulating layer is formed by a sputtering method.

10. The method for manufacturing a semiconductor device according to claim 1,
    wherein the oxygen atmosphere contains nitrogen, and
    wherein an amount of oxygen is larger than an amount of nitrogen in the oxygen atmosphere.

11. The method for manufacturing a semiconductor device according to claim 2, wherein a temperature in the step of performing the heat treatment is higher than or equal to 150° C. and lower than 350° C.

12. The method for manufacturing a semiconductor device according to claim 2, wherein the oxide insulating layer is formed by a sputtering method.

13. The method for manufacturing a semiconductor device according to claim 2,
    wherein the oxygen atmosphere contains nitrogen, and
    wherein an amount of oxygen is larger than an amount of nitrogen in the oxygen atmosphere.

14. The method for manufacturing a semiconductor device according to claim 3, wherein a temperature in the step of performing the heat treatment is higher than or equal to 150° C. and lower than 350° C.

15. The method for manufacturing a semiconductor device according to claim 3, wherein the oxide insulating layer is formed by a sputtering method.

16. The method for manufacturing a semiconductor device according to claim 3,
    wherein the oxygen atmosphere contains nitrogen, and
    wherein an amount of oxygen is larger than an amount of nitrogen in the oxygen atmosphere.

17. The method for manufacturing a semiconductor device according to claim 4, wherein a temperature in the step of performing the heat treatment is higher than or equal to 150° C. and lower than 350° C.

18. The method for manufacturing a semiconductor device according to claim 4, wherein the oxide insulating layer is formed by a sputtering method.

19. The method for manufacturing a semiconductor device according to claim 4,
    wherein the oxygen atmosphere contains nitrogen, and
    wherein an amount of oxygen is larger than an amount of nitrogen in the oxygen atmosphere.

20. A method for manufacturing a semiconductor device, comprising:
    forming a first gate electrode over a substrate having an insulating surface;
    forming a gate insulating layer over the first gate electrode;
    forming an oxide semiconductor layer over the gate insulating layer;

heating the oxide semiconductor layer in an oxygen atmosphere after the step of forming the oxide semiconductor layer;

forming a source electrode layer and a drain electrode layer, wherein each of the source electrode layer and the drain electrode layer is in electrical contact with the oxide semiconductor layer;

forming an oxide insulating layer over the source electrode layer and the drain electrode layer, wherein the oxide insulating layer is in contact with a portion of the oxide semiconductor layer between the source electrode layer and the drain electrode layer;

performing a heat treatment in an oxygen atmosphere after the step of forming the oxide insulating layer; and forming a second gate electrode over the oxide insulating layer, wherein the second gate electrode overlaps with the first gate electrode and the oxide semiconductor layer.

21. The method for manufacturing a semiconductor device according to claim 20, wherein the first gate electrode is configured to have a same potential as the second gate electrode.

22. The method for manufacturing a semiconductor device according to claim 20, wherein a temperature at which the oxide semiconductor layer is heated in the oxygen atmosphere is higher than or equal to 200° C. and lower than a strain point of the substrate.

23. The method for manufacturing a semiconductor device according to claim 20, wherein after the oxide semiconductor layer is heated in the oxygen atmosphere, the oxide semiconductor layer is held in the oxygen atmosphere.

24. The method for manufacturing a semiconductor device according to claim 20, wherein after the oxide semiconductor layer is heated in the oxygen atmosphere, the oxide semiconductor layer is held in an inert gas atmosphere.

25. The method for manufacturing a semiconductor device according to claim 20, wherein a temperature in the step of performing the heat treatment is higher than or equal to 150° C. and lower than 350° C.

26. The method for manufacturing a semiconductor device according to claim 20, wherein the oxide insulating layer is formed by a sputtering method.

27. The method for manufacturing a semiconductor device according to claim 20,
wherein the oxygen atmosphere contains nitrogen, and
wherein an amount of oxygen is larger than an amount of nitrogen in the oxygen atmosphere.

28. The method for manufacturing a semiconductor device according to claim 20, wherein the semiconductor device is formed in a pixel portion over the substrate.

29. A method for manufacturing a semiconductor device, comprising:
forming a first gate electrode over a substrate having an insulating surface;
forming a gate insulating layer over the first gate electrode;
forming an oxide semiconductor layer over the gate insulating layer;
heating the oxide semiconductor layer in an oxygen atmosphere after the step of forming the oxide semiconductor layer;
forming an oxide insulating layer over the oxide semiconductor layer;
forming a source electrode layer and a drain electrode layer over the oxide insulating layer, wherein each of the source electrode layer and the drain electrode layer is in electrical contact with the oxide semiconductor layer;
forming an insulating layer over and in contact with the oxide insulating layer, the source electrode layer, and the drain electrode layer;
performing a heat treatment in an oxygen atmosphere after the step of forming the oxide insulating layer; and
forming a second gate electrode over the insulating layer, wherein the second gate electrode overlaps with the first gate electrode and the oxide semiconductor layer.

30. The method for manufacturing a semiconductor device according to claim 29, wherein the first gate electrode is configured to have a same potential as the second gate electrode.

31. The method for manufacturing a semiconductor device according to claim 29, wherein a temperature at which the oxide semiconductor layer is heated in the oxygen atmosphere is higher than or equal to 200° C. and lower than a strain point of the substrate.

32. The method for manufacturing a semiconductor device according to claim 29, wherein after the oxide semiconductor layer is heated in the oxygen atmosphere, the oxide semiconductor layer is held in the oxygen atmosphere.

33. The method for manufacturing a semiconductor device according to claim 29, wherein after the oxide semiconductor layer is heated in the oxygen atmosphere, the oxide semiconductor layer is held in an inert gas atmosphere.

34. The method for manufacturing a semiconductor device according to claim 29, wherein a temperature in the step of performing the heat treatment is higher than or equal to 150° C. and lower than 350° C.

35. The method for manufacturing a semiconductor device according to claim 29, wherein the oxide insulating layer is formed by a sputtering method.

36. The method for manufacturing a semiconductor device according to claim 29,
wherein the oxygen atmosphere contains nitrogen, and
wherein an amount of oxygen is larger than an amount of nitrogen in the oxygen atmosphere.

37. The method for manufacturing a semiconductor device according to claim 29, wherein the semiconductor device is formed in a pixel portion over the substrate.

38. The method for manufacturing a semiconductor device according to claim 29, wherein the oxide insulating layer comprises silicon oxide, silicon oxynitride, or silicon nitride oxide.

* * * * *

UNITED STATES PATENT AND TRADEMARK OFFICE
CERTIFICATE OF CORRECTION

PATENT NO. : 8,900,916 B2
APPLICATION NO. : 12/832329
DATED : December 2, 2014
INVENTOR(S) : Shunpei Yamazaki et al.

It is certified that error appears in the above-identified patent and that said Letters Patent is hereby corrected as shown below:

In the Specification

At column 2, line 10, "(ZnO)," should be --$(ZnO)_m$--;

At column 31, line 25, "102" should be --10_2--;

At column 31, line 27, "102" should be --10_2--;

At column 38, line 59, "nm" should be --nm.--.

Signed and Sealed this
Fifth Day of May, 2015

Michelle K. Lee
*Director of the United States Patent and Trademark Office*